(12) United States Patent
Im et al.

(10) Patent No.: US 12,388,055 B2
(45) Date of Patent: Aug. 12, 2025

(54) DISPLAY DEVICE

(71) Applicant: SAMSUNG DISPLAY CO., LTD., Yongin-si (KR)

(72) Inventors: Hyun Deok Im, Yongin-si (KR); Jong Hyuk Kang, Yongin-si (KR); Won Ho Lee, Yongin-si (KR); Ki Sun Jang, Yongin-si (KR); Hyun Min Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 360 days.

(21) Appl. No.: 17/998,629

(22) PCT Filed: Apr. 21, 2021

(86) PCT No.: PCT/KR2021/005051
§ 371 (c)(1),
(2) Date: Nov. 11, 2022

(87) PCT Pub. No.: WO2021/230520
PCT Pub. Date: Nov. 18, 2021

(65) Prior Publication Data
US 2023/0352455 A1 Nov. 2, 2023

(30) Foreign Application Priority Data
May 13, 2020 (KR) .................. 10-2020-0057361

(51) Int. Cl.
*H01L 25/075* (2006.01)
*H01L 25/16* (2023.01)
(Continued)

(52) U.S. Cl.
CPC ........ *H01L 25/0753* (2013.01); *H01L 25/167* (2013.01); *H10D 86/441* (2025.01);
(Continued)

(58) Field of Classification Search
CPC .... H10D 86/441; H10D 86/60; H10H 20/821; H10H 20/831; H10H 20/857; H01L 25/0753; H01L 25/167
(Continued)

(56) References Cited

U.S. PATENT DOCUMENTS 7,288,420 B1 10/2007 Yamazaki et al.
9,190,590 B2 11/2015 Shibata et al.
(Continued)

FOREIGN PATENT DOCUMENTS

JP       2004-4524 A    1/2004
JP    2011-205060 A   10/2011
(Continued)

OTHER PUBLICATIONS

International Search Report of PCT/KR2021/005051, Aug. 4, 2021 (3 pages) with English Translation (2 pages).
(Continued)

*Primary Examiner* — Igwe U Anya
(74) *Attorney, Agent, or Firm* — Womble Bond Dickinson (US) LLP

(57) ABSTRACT

A display device includes a substrate including a plurality of pixel areas; and a pixel provided in each of the pixel areas. The pixel may include a first electrode and a second electrode extending in a first direction on the substrate and spaced from each other in a second direction different from the first direction; a bank pattern between the substrate and the first electrode and between the substrate and the second electrode, and including at least two sub-bank patterns in a same column and spaced from each other; and a plurality of light emitting elements between the first and second electrodes. Here, each of the first and second electrodes may have at least two or more widths in the second direction along the first direction.

20 Claims, 41 Drawing Sheets

US 12,388,055 B2
Page 2

(51) Int. Cl.
*H10D 86/40* (2025.01)
*H10D 86/60* (2025.01)
*H10H 20/821* (2025.01)
*H10H 20/831* (2025.01)
*H10H 20/857* (2025.01)

(52) U.S. Cl.
CPC .......... *H10D 86/60* (2025.01); *H10H 20/821* (2025.01); *H10H 20/831* (2025.01); *H10H 20/857* (2025.01)

(58) Field of Classification Search
USPC ......................................................... 257/79
See application file for complete search history.

(56) References Cited

U.S. PATENT DOCUMENTS

| | | | |
|---|---|---|---|
| 9,287,242 B2 | 3/2016 | Shibata et al. | |
| 9,773,761 B2 | 9/2017 | Do | |
| 10,818,647 B2 | 10/2020 | Kim et al. | |
| 11,101,257 B2 | 8/2021 | Kim et al. | |
| 11,367,823 B2 | 6/2022 | Kim et al. | |
| 12,046,626 B2 | 7/2024 | Lee et al. | |
| 12,100,728 B2 | 9/2024 | Kwag et al. | |
| 2021/0265324 A1 | 8/2021 | Kong et al. | |
| 2021/0408104 A1* | 12/2021 | Lee | H10H 20/831 |
| 2022/0115470 A1 | 4/2022 | Kim et al. | |
| 2022/0278253 A1* | 9/2022 | Yang | H10H 20/857 |
| 2023/0045654 A1* | 2/2023 | Moon | H10D 86/60 |

FOREIGN PATENT DOCUMENTS

| | | |
|---|---|---|
| KR | 10-1490758 B1 | 2/2015 |
| KR | 10-2015-0098246 A | 8/2015 |
| KR | 10-2018-0007025 A | 1/2018 |
| KR | 10-2020-0010706 A | 1/2020 |
| KR | 10-2020-0022061 A | 3/2020 |
| KR | 10-2020-0034896 A | 4/2020 |
| KR | 10-2020-0037911 A | 4/2020 |
| KR | 10-2020-0042997 A | 4/2020 |
| KR | 10-2299992 B1 | 9/2021 |
| WO | WO 2019/208880 A1 | 10/2019 |

OTHER PUBLICATIONS

Written Opinion of PCT/KR2021/005051, Aug. 4, 2021 (3 pages) with English Translation (2 pages).

* cited by examiner

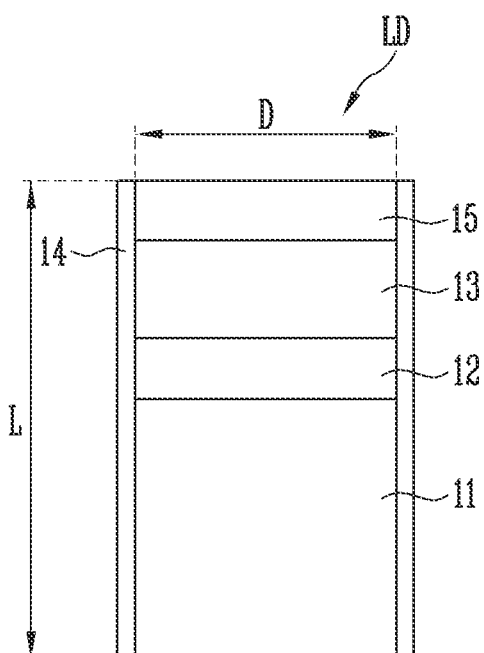

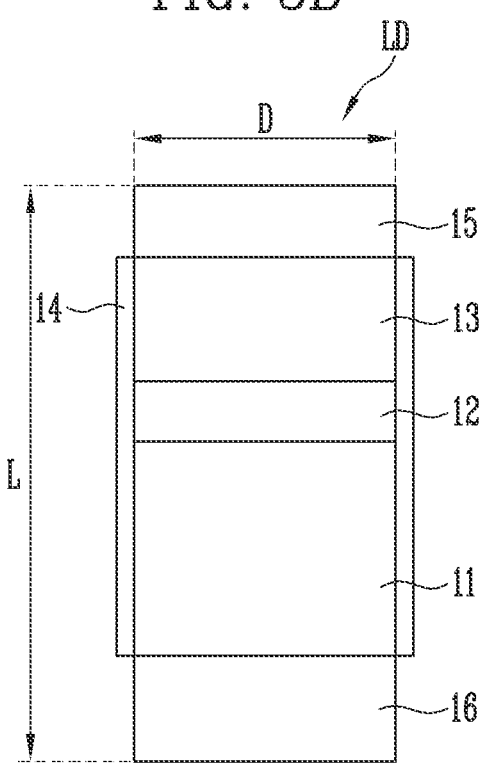

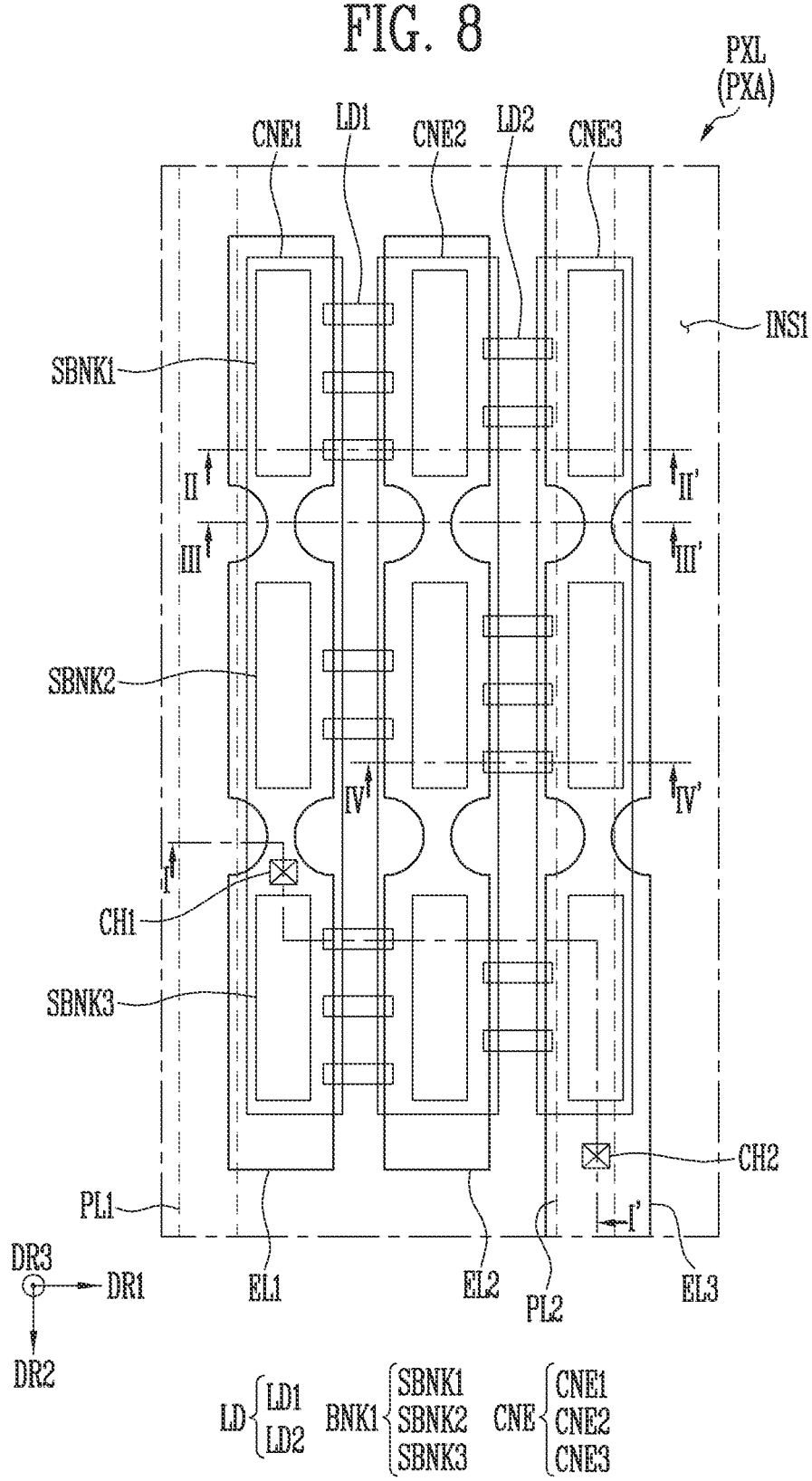

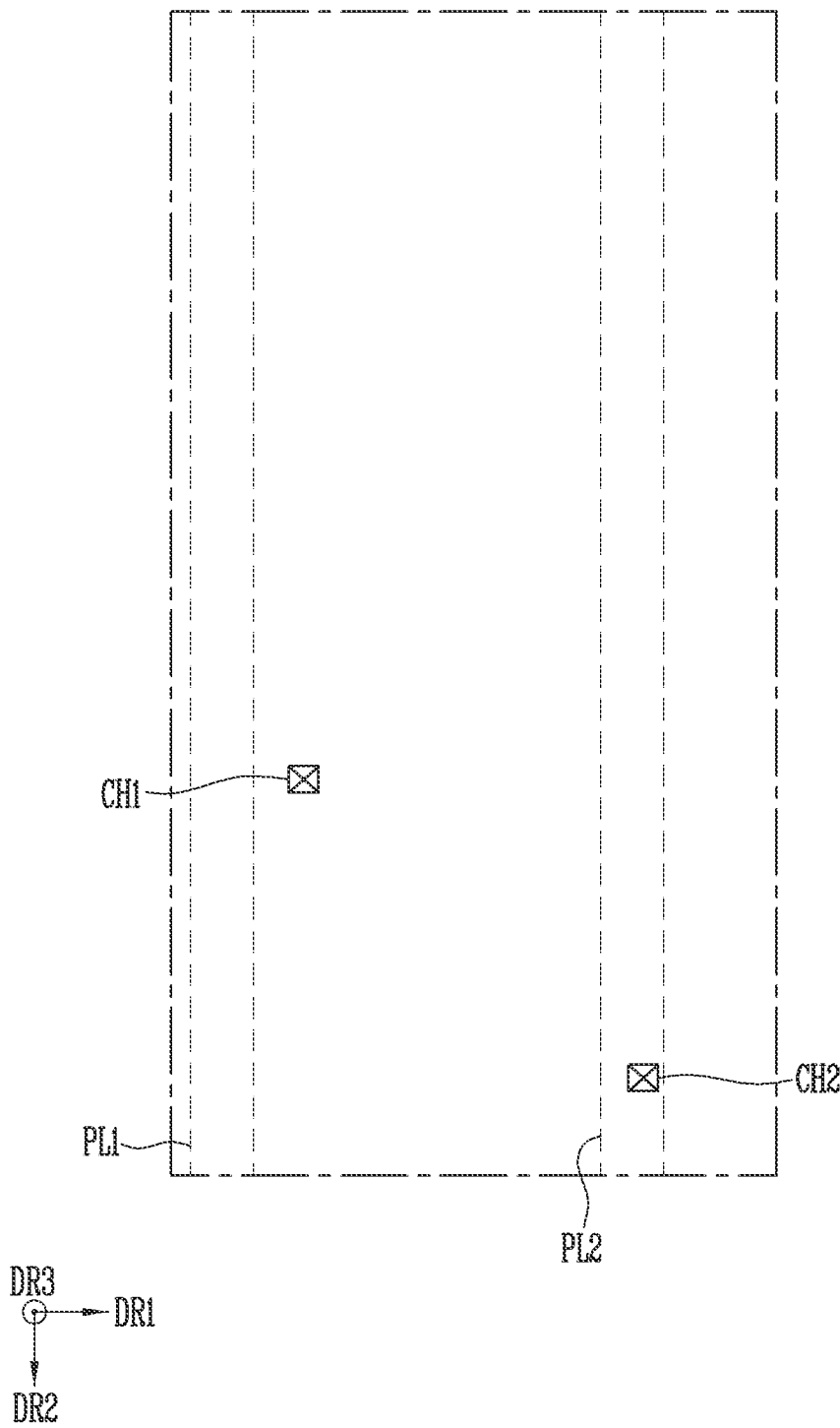

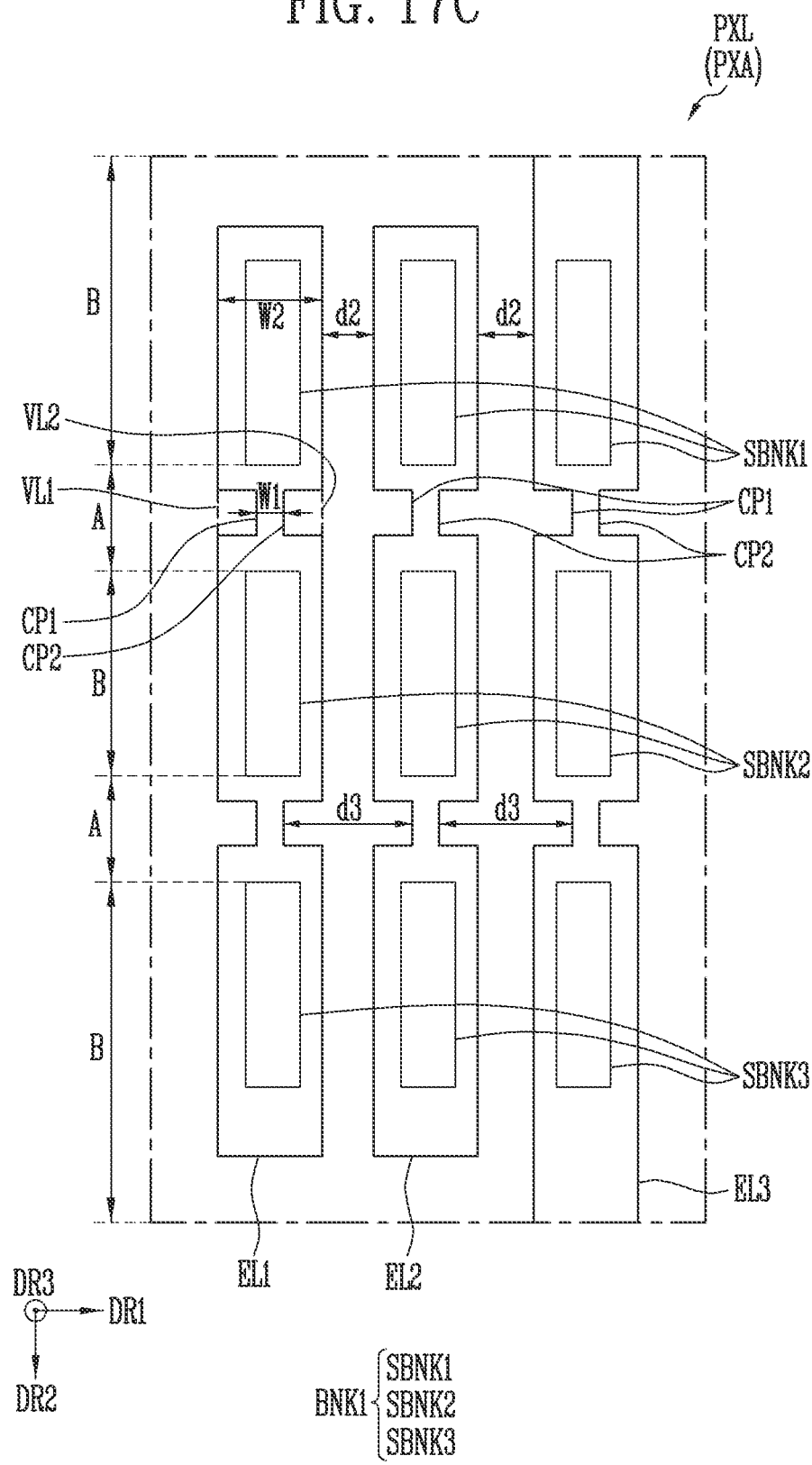

DISPLAY DEVICE

CROSS-REFERENCE TO RELATED APPLICATIONS

This application is a U.S. National Phase Patent Application of International Patent Application Number PCT/KR2021/005051, filed on Apr. 21, 2021, which claims priority to Korean Patent Application Number 10-2020-0057361, filed on May 13, 2020, the entire contents of all of which are incorporated by reference herein.

BACKGROUND

Field

The present disclosure relates to a display device.

Description of the Related Art

As interest in information display increases and the demand to use portable information media increases, the demand and commercialization for a display device are focused.

Aspects and features of embodiments of the present disclosure are to provide a display device having improved light output efficiency by improving an alignment degree of a light emitting element.

A display device according to one or more embodiments of the present disclosure may include a substrate including a plurality of pixel areas; and a pixel in each of the pixel areas. The pixel may include a first electrode and a second electrode extending in a first direction on the substrate and spaced from each other in a second direction different from the first direction; a bank pattern between the substrate and the first electrode and between the substrate and the second electrode, and including at least two sub-bank patterns in a same column and spaced from each other; and a plurality of light emitting elements between the first and second electrodes.

In one or more embodiments of the present disclosure, each of the first and second electrodes may have at least two or more widths in the second direction along the first direction.

In one or more embodiments of the present disclosure, each of the first and second electrodes may include a first area corresponding to an area between the sub-bank patterns and a second area except for the first area.

In one or more embodiments of the present disclosure, the first area of each of the first and second electrodes may have at least two or more widths in the second direction along the first direction of the first and second electrodes, and the second area of each of the first and second electrodes may have a constant width in the second direction along the first direction.

In one or more embodiments of the present disclosure, the first area of each of the first and second electrodes may have a width less than or equal to that of the second area of a corresponding electrode in the second direction.

In one or more embodiments of the present disclosure, a width of the first area of the first electrode in the second direction and a width of the first area of the second electrode in the second direction may be equal to each other. In addition, a width of the second area of the first electrode in the second direction and a width of the second area of the second electrode in the second direction may be equal to each other.

In one or more embodiments of the present disclosure, the first area of each of the first and second electrodes may include a concave portion concave in a direction in which a width in the second direction decreases along the first direction.

In one or more embodiments of the present disclosure, the concave portion may include a non-square boundary.

In one or more embodiments of the present disclosure, the concave portion may have a polygonal shape or a rounded curved surface shape.

In one or more embodiments of the present disclosure, when viewed in a plan view, a distance between the first electrode and the second electrode in the second direction may have at least two or more widths along the first direction.

In one or more embodiments of the present disclosure, the concave portion of the first electrode and the concave portion of the second electrode may face each other.

In one or more embodiments of the present disclosure, a distance in the second direction between the first area of the first electrode and the first area of the second electrode may be greater than a distance in the second direction between the second area of the first electrode and the second area of the second electrode.

In one or more embodiments of the present disclosure, two sub-bank patterns adjacent in the first direction may be spaced from each other by a distance equal to or greater than a length of each light emitting element between the first and second electrodes in the second direction.

In one or more embodiments of the present disclosure, the sub-bank patterns may be equal to each other.

In one or more embodiments of the present disclosure, the first area and the second area of each of the first and second electrodes may have different surface profiles when viewed in a cross-section.

In one or more embodiments of the present disclosure, the pixel may further include a first contact electrode electrically connecting the first electrode and one end of both ends of each of the light emitting elements; and a second contact electrode electrically connecting the second electrode and the other end of the both ends of each of the light emitting elements.

A display device according to one or more embodiments of the present disclosure may include a substrate including a display area including a plurality of pixel areas and a non-display area surrounding at least one side of the display area; and a pixel in each of the pixel areas. The pixel may include a pixel circuit layer on the substrate and a display element layer provided on the pixel circuit layer. Here, the pixel circuit layer may include at least one transistor provided on the substrate, a power supply line electrically connected to the transistor, and a protective layer on the power supply line.

In one or more embodiments of the present disclosure, the display element layer may include first and second electrodes extending in a first direction on the protective layer and spaced from each other in a second direction different from the first direction; a bank pattern between the protective layer and the first electrode and between the protective layer and the second electrode, and including first to third sub-bank patterns arranged along the first direction and located in the same column; a plurality of light emitting elements between the first and second electrodes; a first contact electrode electrically connecting the first electrode and one end of both ends of each of the plurality of light emitting elements; and a second contact electrode electrically connecting the second electrode and the other end of the both ends of each of the plurality of light emitting elements.

In one or more embodiments of the present disclosure, the first to third sub-bank patterns may be spaced from each other, and each of the first and second electrodes may have at least two or more widths in the second direction along the first direction.

According to one or more embodiments of the present disclosure, a display device having an excellent alignment degree of light emitting elements may be provided.

According to one or more embodiments of the present disclosure, the light emitting elements may be intensively aligned only in a desired area by differently designing a width of a first area of an alignment electrode corresponding to an area where sub-bank patterns are spaced from each other and a width of a second area of the alignment electrode except for the first area.

Effects, aspects, and features of embodiments of the present disclosure are not limited by the contents exemplified above, and more various effects are included in the present specification.

BRIEF DESCRIPTION OF DRAWINGS

FIG. 1B is a cross-sectional view of the light emitting element of FIG. 1A.

FIG. 3B is a cross-sectional view of the light emitting element of FIG. 3A.

FIG. 8 is a plan view schematically illustrating one pixel from among the pixels shown in FIG. 5.

FIGS. 15A to 15F are schematic plan views sequentially illustrating a method of manufacturing the pixel shown in FIG. 8.

FIGS. 17A to 17C illustrate the pixel of FIG. 8 according to one or more embodiments and are schematic plan views including only a partial configuration of a display element layer.

DETAILED DESCRIPTION

Figure 1A:
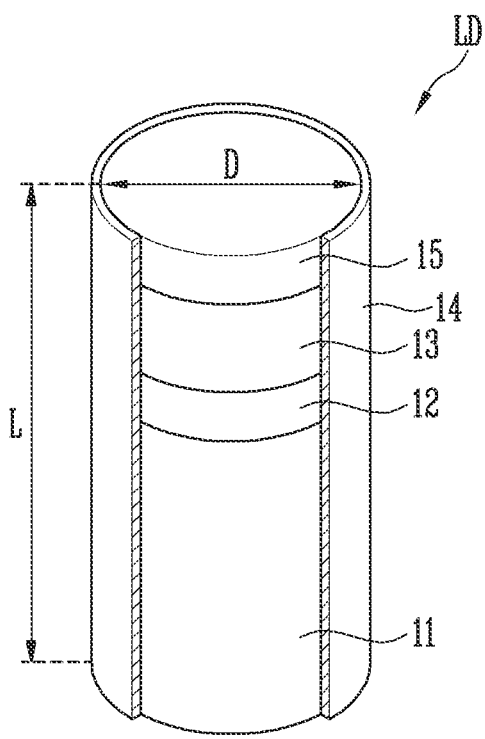
FIG. 1A is a perspective cutaway view schematically illustrating a light emitting element according to one or more embodiments of the present disclosure.

Because the present disclosure may be modified in various manners and have various forms, specific embodiments will be illustrated in the drawings and will be described in detail in the specification. However, it should be understood that the present disclosure is not intended to be limited to the disclosed specific forms, and the present disclosure includes all modifications, equivalents, and substitutions within the spirit and technical scope of the present disclosure.

Similar reference numerals are used for similar components in describing each drawing. In the accompanying drawings, the dimensions of the structures are shown enlarged from the actual dimensions for the sake of clarity of the present disclosure. Terms of "first", "second", and the like may be used to describe various components, but the components should not be limited by the terms. The terms are used only for the purpose of distinguishing one component from another component. For example, without departing from the scope of the present disclosure, a first component may be referred to as a second component, and similarly, a second component may also be referred to as a first component.

It should be understood that in the present application, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

In the present application, in a case where "a component (for example, 'a first component') is operatively or communicatively coupled with/to or "connected to" another component (for example, 'a second component'), the case should be understood that the component may be directly connected to the other component, or may be connected to the other component through another component (for example, a 'third component'). In addition, in the present application, "connection" or "access" may mean a physical and/or electrical connection or access inclusively.

Hereinafter, embodiments of the present disclosure and other matters necessary for those skilled in the art to easily understand the contents of the present disclosure will be described in detail with reference to the accompanying drawings. In the description below, the singular expressions include plural expressions unless the context clearly indicates otherwise.

Figure 2A:
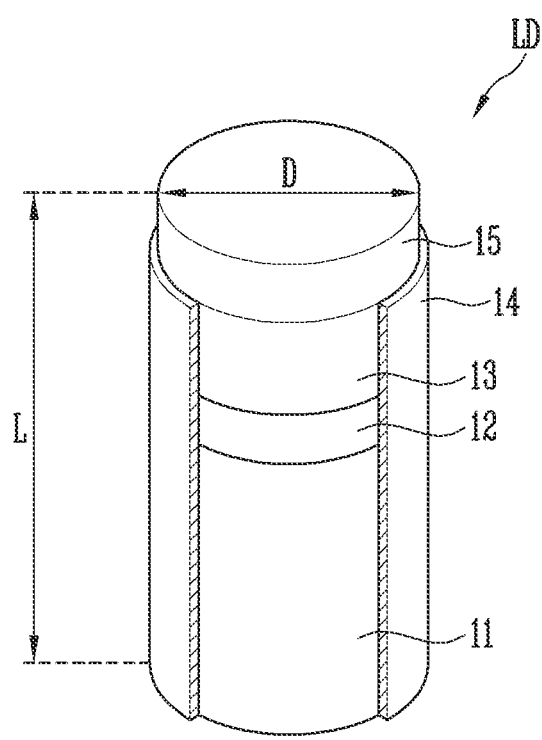
FIG. 2A is a perspective cutaway view schematically illustrating a light emitting element according to one or more embodiments of the present disclosure.
Figure 2B:
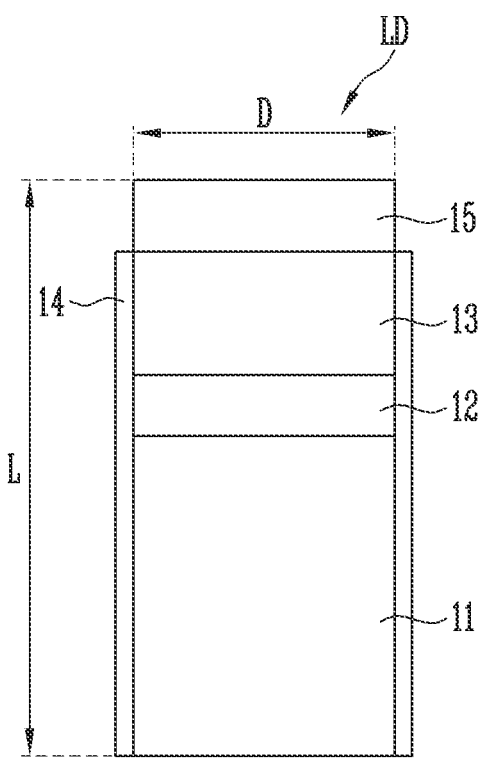
FIG. 2B is a cross-sectional view of the light emitting element of FIG. 2A.
Figure 3A:
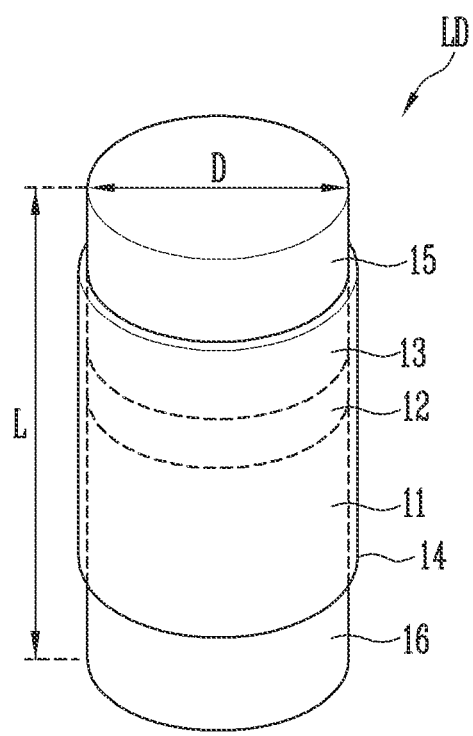
FIG. 3A is a perspective view schematically illustrating a light emitting element according to one or more embodiments of the present disclosure.
Figure 4A:
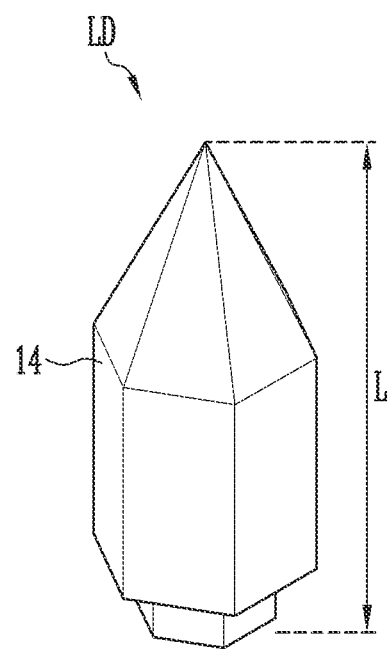
FIG. 4A is a perspective view schematically illustrating a light emitting element according to one or more embodiments of the present disclosure.
Figure 4B:
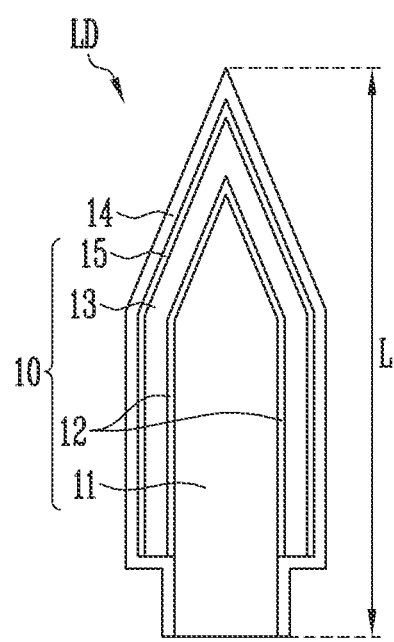
FIG. 4B is a cross-sectional view of the light emitting element of FIG. 4A.

FIG. 1A is a perspective cutaway view schematically illustrating a light emitting element according to an embodiment of the present disclosure, FIG. 1B is a cross-sectional view of the light emitting element of FIG. 1A, FIG. 2A is a perspective cutaway view schematically illustrating a light emitting element according to another embodiment of the present disclosure, FIG. 2B is a cross-sectional view of the light emitting element of FIG. 2A, FIG. 3A is a perspective view schematically illustrating a light emitting element according to still another embodiment of the present disclosure, FIG. 3B is a cross-sectional view of the light emitting element of FIG. 3A, FIG. 4A is a perspective view schematically illustrating a light emitting element according to still another embodiment of the present disclosure, and FIG. 4B is a cross-sectional view of the light emitting element of FIG. 4A.

For convenience, after describing FIGS. 1A, 1B, 2A, 2B, 3A, and 3B showing the light emitting element manufactured by an etching method, FIGS. 4A and 4B showing the light emitting element manufactured by a growth method is described. In one or more embodiments of the present disclosure, a type and/or a shape of the light emitting element are/is not limited to the embodiments shown in FIGS. 1A, 1B, 2A, 2B, 3A, 3B, 4A, and 4B.

First, referring to FIGS. 1A, 1B, 2A, 2B, 3A, and 3B, the light emitting element LD may include a first semiconductor layer 11, a second semiconductor layer 13, and an active layer 12 interposed between the first semiconductor layer 11 and the second semiconductor layer 13. For example, the light emitting element LD may be implemented as a light emitting stack in which the first semiconductor layer 11, the active layer 12, and the second semiconductor layer 13 are sequentially stacked.

According to one or more embodiments of the present disclosure, the light emitting element LD may be provided in a shape extending in one direction. When an extension direction of the light emitting element LD is referred to as a length direction, the light emitting element LD may have one end and another end along the length direction. Any one of the first and second semiconductor layers 11 and 13 may be disposed at the one end of the light emitting element LD, and the other one of the first and second semiconductor layers 11 and 13 may be disposed at the other end of the light emitting element LD.

The light emitting element LD may be provided in various shapes. For example, the light emitting element LD may have a rod-like shape, a bar-like shape, a column-like shape, or the like that is long in the length direction (that is, an aspect ratio is greater than 1). In one or more embodiments of the present disclosure, a length L of the light emitting element LD in the length direction may be greater than a diameter D (or a width of a cross-section) of the light emitting element LD. The light emitting element LD may include, for example, a light emitting diode (LED) manufactured to be extremely small to have the diameter D and/or the length L of about a nano scale to a micro scale. In one or more embodiments of the present disclosure, a size of the light emitting element LD may be changed to accord with a requirement condition (or a design condition) of a lighting device or a self-emission display device.

The first semiconductor layer 11 may include, for example, at least one n-type semiconductor layer. For example, the first semiconductor layer 11 may include any one semiconductor material from among InAlGaN, GaN, AlGaN, InGaN, AlN, and InN, and may include an n-type semiconductor layer doped with a first conductive dopant such as Si, Ge, or Sn. However, a material configuring the first semiconductor layer 11 is not limited thereto, and various other materials may configure the first semiconductor layer 11.

The active layer 12 may be disposed on the first semiconductor layer 11 and may be formed in a single or multiple quantum well structure. A position of the active layer 12 may be variously changed according to a type of the light emitting element LD. The active layer 12 may emit light having a wavelength of 400 nm to 900 nm, and may use a double hetero structure. In one or more embodiments of the present disclosure, a clad layer doped with a conductive dopant may be formed on and/or under the active layer 12. For example, the clad layer may be formed of an AlGaN layer or an InAlGaN layer. According to one or more embodiments, a material of AlGaN, InAlGaN, or the like may be used to form the active layer 12, and various other materials may configure the active layer 12.

When an electric field of a suitable voltage (e.g., a predetermined voltage) or more is applied to both ends of the light emitting element LD, the light emitting element LD emits light while an electron-hole pair is combined in the active layer 12. By controlling light emission of the light emitting element LD by using such a principle, the light emitting element LD may be used as a light source of various light emitting devices such as a pixel of the display device.

The second semiconductor layer 13 may be disposed on the active layer 12 and may include a semiconductor layer of a type different from that of the first semiconductor layer 11. For example, the second semiconductor layer 13 may include at least one p-type semiconductor layer. For example, the second semiconductor layer 13 may include at least one semiconductor material from among InAlGaN, GaN, AlGaN, InGaN, AlN, and InN, and may include a p-type semiconductor layer doped with a second conductive dopant such as Mg. However, a material configuring the second semiconductor layer 13 is not limited thereto, and various other materials may configure the second semiconductor layer 13.

In one or more embodiments of the present disclosure, the first semiconductor layer 11 and the second semiconductor layer 13 may have widths (or thicknesses) different from each other in the length direction of the light emitting element LD. For example, the first semiconductor layer 11 may have a width relatively wider (or a thickness thicker) than that of the second semiconductor layer 13 along the length direction of the light emitting element LD. Therefore, the active layer 12 of the light emitting element LD may be positioned to be closer to an upper surface of the second semiconductor layer 13 than to a lower surface of the first semiconductor layer 11 as shown in FIGS. 1A to 3B.

According to one or more embodiments, the light emitting element LD may further include an additional electrode 15 disposed on the second semiconductor layer 13 in addition to the above-described first semiconductor layer 11, active layer 12, and second semiconductor layer 13. In addition, according to one or more embodiments, as shown in FIGS. 3A and 3B, the light emitting element LD may further include another additional electrode 16 disposed at one end of the first semiconductor layer 11.

The additional electrodes 15 and 16 may be ohmic contact electrodes, but are not limited thereto, and may be Schottky contact electrodes according to one or more embodiments. The additional electrodes 15 and 16 may include a metal or metal oxide, and for example, chromium (Cr), titanium (Ti), aluminium (Al), gold (Au), nickel (Ni), indium tin oxide (ITO), an oxide or an alloy thereof, and the like may be used alone or in combination, but the present disclosure is not limited thereto.

Materials included in each of the additional electrodes 15 and 16 may be the same as or different from each other. The additional electrodes 15 and 16 may be substantially transparent or translucent. Therefore, light generated by the light emitting element LD may pass through the additional electrodes 15 and 16 and may be emitted to an outside of the light emitting element LD. According to one or more embodiments, when the light generated by the light emitting element LD does not pass through the additional electrodes 15 and 16 and is emitted to the outside of the light emitting element LD through an area except for the both ends of the light emitting element LD, the additional electrodes 15 and 16 may include an opaque metal.

In one or more embodiments of the present disclosure, the light emitting element LD may further include an insulating film 14 (or an insulating thin film). However, according to one or more embodiments, the insulating film 14 may be omitted and may be provided so as to cover only a portion of the first semiconductor layer 11, the active layer 12, and the second semiconductor layer 13.

The insulating film 14 may prevent an electrical short that may occur when the active layer 12 is in contact with a conductive material other than the first semiconductor layer 11 and the second semiconductor layer 13. In addition, by forming the insulating film 14, lifespan and efficiency of the light emitting element LD may be improved by reducing or minimizing a surface defect of the light emitting element LD. In addition, when a plurality of light emitting elements LD are closely disposed, the insulating film 14 may prevent an unwanted short that may occur between the light emitting elements LD. When the active layer 12 may prevent an occurrence of a short with an external conductive material, presence or absence of the insulating film 14 is not limited.

As shown in FIGS. 1A and 1B, the insulating film 14 may be provided in a form entirely surrounding an outer surface (e.g., an outer peripheral or circumferential surface) of the light emitting stack including the first semiconductor layer 11, the active layer 12, the second semiconductor layer 13, and the additional electrode 15. For convenience of description, a portion of the insulating film 14 is removed in FIG. 1A, and the first semiconductor layer 11, the active layer 12, the second semiconductor layer 13, and the additional electrode 15 included in the actual light emitting element LD may be surrounded by the insulating film 14.

In the above-described embodiment, the insulating film 14 entirely surrounds the outer surface (e.g., an outer peripheral or circumferential surface) of each of the first semiconductor layer 11, the active layer 12, the second semiconductor layer 13, and the additional electrode 15, but the present disclosure is not limited thereto.

According to one or more embodiments, as shown in FIGS. 2A and 2B, the insulating film 14 may surround the outer surface (e.g., an outer peripheral or circumferential surface) of each of the first semiconductor layer 11, the active layer 12, and the second semiconductor layer 13 and may not entirely surround the outer surface (e.g., an outer peripheral or circumferential surface) of the additional electrode 15 disposed on the second semiconductor layer 13, or may surround only a portion of the outer surface (e.g., an outer peripheral of circumferential surface) of the additional electrode 15 and may not surround a remainder of the outer surface (e.g., an outer peripheral of circumferential surface) of the additional electrode 15. However, the insulating film 14 may expose at least both ends of the light emitting element LD, and for example, the insulating film 14 may expose one end of the first semiconductor layer 11 together with the additional electrode 15 disposed at one end of the second semiconductor layer 13. In addition, according to one or more embodiments, as shown in FIGS. 3A and 3B, when the additional electrodes 15 and 16 are disposed at the both ends of the light emitting element LD, the insulating film 14 may expose at least one area of each of the additional electrodes 15 and 16. Alternatively, in still another embodiment, the insulating film 14 may not be provided.

According to one or more embodiments of the present disclosure, the insulating film 14 may include a transparent insulating material. For example, the insulating film 14 may include at least one insulating material selected from a group consisting of silicon oxide ($SiO_x$), silicon nitride ($SiN_x$), silicon oxynitride ($SiO_xN_y$), aluminium oxide ($AlO_x$), titanium oxide ($TiO_x$), and the like, but is not limited to, and various materials having insulation may be used.

When the insulating film 14 is provided to the light emitting element LD, a short between the active layer 12 and driving electrodes may be prevented. In addition, by forming the insulating film 14, the lifespan and efficiency of the light emitting element LD may be improved by reducing or minimizing the surface defect of the light emitting element LD. In addition, when the plurality of light emitting elements LD are closely disposed, the insulating film 14 may prevent the unwanted short that may occur between the light emitting elements LD.

The above-described light emitting element LD may be used as a light emitting source of various display devices. The light emitting element LD may be manufactured through a surface treatment process. For example, when the plurality of light emitting elements LD are mixed in a fluid solution (or a solvent) and supplied to each pixel area (for example, an emission area of each pixel or an emission area of each sub-pixel), the surface treatment may be performed on each of the light emitting elements LD so that the light emitting elements LD may be uniformly dispersed without being non-uniformly aggregated in the solution.

A light emitting device including the light emitting element LD described above may be used in various types of devices that require a light source, such as a display device. For example, when the plurality of light emitting elements LD are disposed in a pixel area of each pixel of a display panel, the light emitting elements LD may be used as a light source of each pixel. However, an application field of the light emitting element LD is not limited to the above-described example. For example, the light emitting element LD may be used in another type of device that requires a light source, such as a lighting device.

Next, the light emitting element LD manufactured by the growth method is described with reference to FIGS. 4A and 4B.

In describing the light emitting element LD manufactured by the growth method, the present disclosure is described based on a point different from the above-described embodiment, and a part that are not specially described in the light emitting element LD manufactured by the growth method follows the above-described embodiment, and the same reference numerals are given to components similar and/or identical to those of the above-described embodiment.

Referring to FIGS. 4A and 4B, the light emitting element LD according to one or more embodiments of the present disclosure may include the first semiconductor layer 11, the second semiconductor layer 13, and the active layer 12 interposed between the first and second semiconductor layers 11 and 13. According to one or more embodiments, the light emitting element LD may include a light emitting pattern 10 of a core-shell structure including the first semiconductor layer 11 positioned at a center, the active layer 12 surrounding at least one side of the first semiconductor layer 11, the second semiconductor layer 13 surrounding at least one side of the active layer 12, and the additional electrode 15 surrounding at least one side of the second semiconductor layer 13.

The light emitting element LD may be provided in a polygonal horn shape extending in one direction. For example, the light emitting element LD may be provided in a hexagonal horn shape. When the extension direction of the light emitting element LD is referred to as the length direction, the light emitting element LD may have one end (or a lower end) and another end (or an upper end) along the length direction. A portion of one semiconductor layer of the first and second semiconductor layers 11 and 13 may be exposed at the one end (or the lower end) of the light emitting element LD, and a portion of the other semiconductor layer of the first and second semiconductor layers 11 and 13 may be exposed at the other end (or the upper end) of the light emitting element LD. For example, a portion of the first semiconductor layer 11 may be exposed at the one end (or the lower end) of the light emitting element LD, and a portion of the second semiconductor layer 13 may be exposed at the other end (or the upper end) of the light emitting element LD. In this case, when the light emitting element LD is applied as the light source of the display device, the exposed portion of the first semiconductor layer 11 may be in contact with one driving electrode of driving electrodes driving the light emitting element LD and the exposed portion of the second semiconductor layer 13 may be in contact with another driving electrode.

According to one or more embodiments, when the light emitting element LD includes the additional electrode 15, a portion of the additional electrode 15 surrounding at least one side of the second semiconductor layer 13 may be exposed at the other end (or the upper end) of the light emitting element LD. In this case, when the light emitting element LD is applied as the light source of the display device, the exposed portion of the additional electrode 15 may be in contact with the other driving electrode and may be electrically connected to the other driving electrode.

In one or more embodiments of the present disclosure, the first semiconductor layer 11 may be positioned at a core, that is, a center (or a middle) of the light emitting element LD. The light emitting element LD may be provided in a shape corresponding to a shape of the first semiconductor layer 11. For example, when the first semiconductor layer 11 has a hexagonal horn shape, the light emitting element LD and the light emitting pattern 10 may also have a hexagonal horn shape.

The active layer 12 may be provided and/or formed in a shape surrounding the outer surface (e.g., an outer peripheral or circumferential surface) of the first semiconductor layer 11 in the length L direction of the light emitting element LD. Specifically, the active layer 12 may be provided and/or formed in a shape surrounding the remaining area except for the one end disposed at the lower side of the both ends of the first semiconductor layer 11 in the length direction of the light emitting element LD.

The second semiconductor layer 13 may be provided and/or formed in a shape surrounding the active layer 12 in the length L direction of the light emitting element LD, and may include a semiconductor layer of a type different from that of the first semiconductor layer 11. For example, the second semiconductor layer 13 may include at least one p-type semiconductor layer.

In one or more embodiments of the present disclosure, the light emitting element LD may include the additional electrode 15 surrounding at least one side of the second semiconductor layer 13. The additional electrode 15 may be an ohmic contact electrode or a Schottky contact electrode electrically connected to the second semiconductor layer 13, but is not limited thereto.

As described above, the light emitting element LD may be configured in a hexagonal horn shape having a shape in which the both ends are protruded, and may be implemented as the light emitting pattern 10 of the core-shell structure including the first semiconductor layer 11 provided at the center thereof, the active layer 12 surrounding the first semiconductor layer 11, the second semiconductor layer 13 surrounding the active layer 12, and the additional electrode 15 surrounding the second semiconductor layer 13. The first semiconductor layer 11 may be disposed at the one end (or the lower end) of the light emitting element LD having the hexagonal horn shape, and the additional electrode 15 may be disposed at the other end (or the upper end) of the light emitting element LD.

In addition, according to one or more embodiments, the light emitting element LD may further include the insulating film 14 provided on an outer surface (e.g., an outer peripheral or circumferential surface) of the light emitting pattern 10 of the core-shell structure. The insulating film 14 may include a transparent insulating material.

Figure 5:
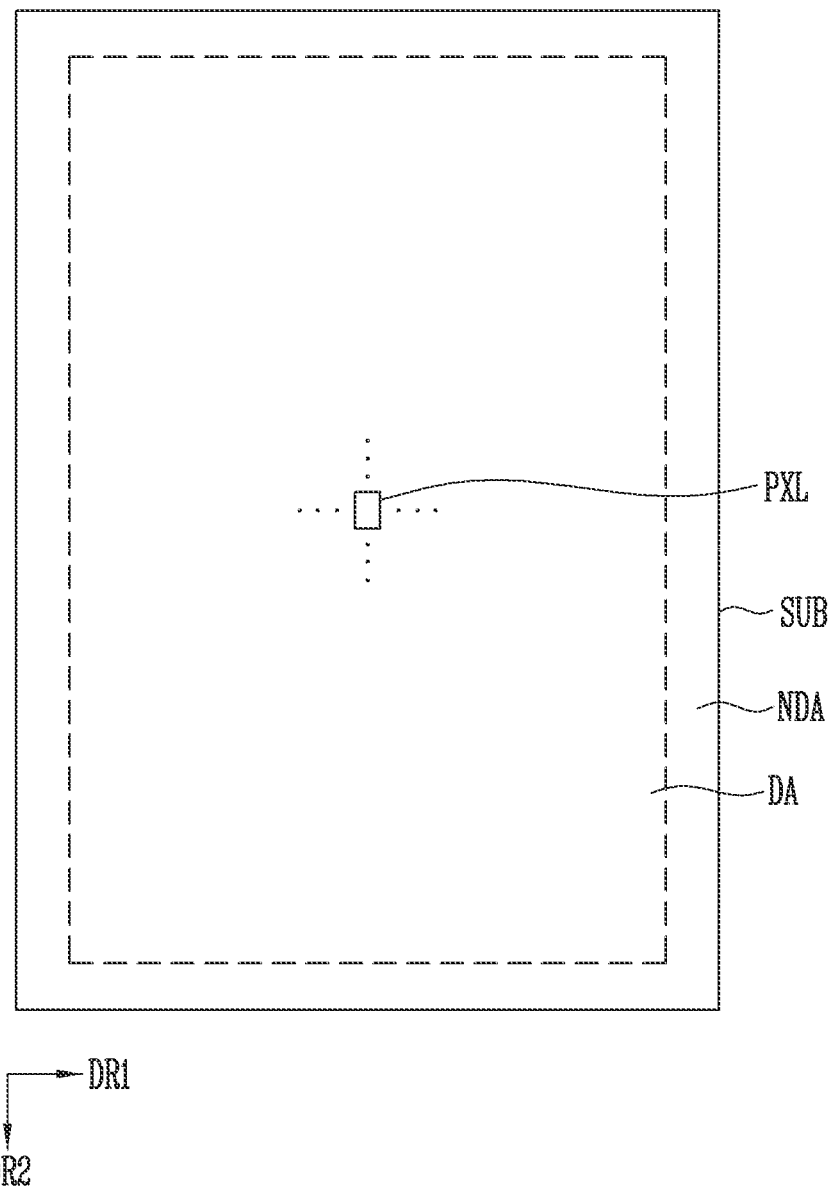
FIG. 5 is a diagram illustrating a display device according to one or more embodiments of the present disclosure, and is a schematic plan view of a display device, in particular, using any one light emitting element as a light emitting source from among the light emitting elements shown in FIGS. 1A, 1B, 2A, 2B, 3A, 3B, 4A, and 4B.

FIG. 5 is a diagram illustrating a display device according to one or more embodiments of the present disclosure, and is a schematic plan view of a display device, in particular, using any one light emitting element as a light emitting source from among the light emitting elements shown in FIGS. 1A, 1B, 2A, 2B, 3A, 3B, 4A, and 4B.

In FIG. 5, for convenience, a structure of the display device is briefly shown based on a display area DA where an image is displayed. However, according to one or more embodiments, at least one driver (for example, a scan driver, a data driver, and the like) and/or a plurality of signal lines may be further disposed in the display device.

Referring to FIGS. 1A, 1B, 2A, 2B, 3A, 3B, 4A, 4B, and 5, the display device according to one or more embodiments of the present disclosure may include a substrate SUB, a plurality of pixels PXL provided on the substrate SUB and including at least one light emitting element LD, a driver provided on the substrate SUB and driving the pixels PXL, a line unit connecting the pixels PXL and the driver to each other.

The display device may be classified into a passive matrix type display device and an active matrix type display device according to a method of driving the light emitting element LD. For example, when the display device is implemented as an active matrix type, each of the pixels PXL may include a driving transistor that controls a current amount supplied to the light emitting element LD, a switching transistor that transmits a data signal to the driving transistor, and the like.

Recently, the active matrix type display device that selects and lights each pixel PXL in terms of resolution, contrast, and operation speed has become mainstream, but the present disclosure is not limited thereto, and the passive matrix type display device in which lighting is performed for each pixel PXL group may also use components (for example, first and second electrodes, and the like) for driving the light emitting element LD.

The substrate SUB may include the display area DA and a non-display area NDA.

According to one or more embodiments, the display area DA may be disposed in a center area of the display device, and the non-display area NDA may be disposed in an edge area of the display device to surround the display area DA. However, positions of the display area DA and the non-display area NDA are not limited thereto, and the positions of the display area DA and the non-display area NDA may be changed.

The display area DA may be an area where the pixels PXL that display an image are provided. The non-display area NDA may be an area where the driver for driving the pixels PXL and a portion of the line unit connecting the pixels PXL and the driver to each other are provided.

The display area DA may have various shapes. For example, the display area DA may be provided as a polygon shape of a closed shape including a side formed of a straight line. In addition, the display area DA may be provided in a circle shape and/or an ellipse shape including a side formed of a curve. In addition, the display area DA may be provided in various shapes such as a semicircle, a semi-ellipse, and the like including a side formed of a straight line and a curve.

The non-display area NDA may be provided on at least one side of the display area DA. In one or more embodiments of the present disclosure, the non-display area NDA may be around (e.g., may surround) a periphery (or an edge) of the display area DA.

The non-display area NDA may be provided with the line unit connected to the pixels PXL, and the driver connected to the line unit and driving the pixels PXL.

The line unit may electrically connect the driver and the pixels PXL to each other. The line unit may provide a signal to each pixel PXL and may be signal lines connected to each pixel PXL, for example, fan-out lines connected to a scan line, a data line, an emission control line, and the like. In addition, the line unit may be signal lines connected to each pixel PXL, for example, fan-out lines connected to a control line, a sensing line, and the like, in order to compensate for an electrical characteristic change of each pixel PXL in real time.

The substrate SUB may include a transparent insulating material and may transmit light. The substrate SUB may be a rigid substrate or a flexible substrate.

One area on the substrate SUB may be provided as the display area DA to dispose the pixels PXL, and the remaining area on the substrate SUB may be provided as the non-display area NDA. For example, the substrate SUB may include the display area DA including pixel areas in which each pixel PXL is disposed, and the non-display area NDA disposed around the display area DA.

Each of the pixels PXL may be provided in the display area DA on the substrate SUB. In one or more embodiments of the present disclosure, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each pixel PXL may include at least one light emitting element LD driven by corresponding scan signal and data signal. The light emitting element LD may have a size as small as a micro scale or a nano scale and may be connected in parallel with adjacent light emitting elements, but the present disclosure is not limited thereto. The light emitting element LD may configure a light source of each pixel PXL.

Each pixel PXL may include at least one light source driven by a suitable signal (e.g., a predetermined signal (for example, a scan signal and a data signal)) and/or a suitable power (e.g., a predetermined power (for example, first driving power supply and second driving power supply)). For example, each pixel PXL may include at least one ultra-small light emitting element LD having a small size of about a nano scale to a micro scale shown in each of the embodiments of FIGS. 1A to 4B. However, a type of the light emitting element LD that may be used as the light source of each pixel PXL is not limited thereto.

In one or more embodiments of the present disclosure, the color, type, number, and/or the like of the pixels PXL are not particularly limited, and for example, the color of light emitted from each pixel PXL may be variously changed.

The driver may provide a suitable signal (e.g., a predetermined signal) and a suitable power (e.g., a predetermined power) to each pixel PXL through the line unit, thereby controlling driving of the pixel PXL.

The driver may include a scan driver that provides a scan signal to the pixels PXL through a scan line, an emission driver that provides an emission control signal to the pixels PXL through an emission control line, a data driver that provides a data signal to the pixels PXL through a data line, and a timing controller. The timing controller may control the scan driver, the emission driver, and the data driver.

FIGS. 6A to 6E are circuit diagrams illustrating an electrical connection relationship between components included in one pixel shown in FIG. 5 according to one or more embodiments.

For example, FIGS. 6A to 6E show the electrical connection relationship between the components included in the pixel PXL that may be applied to the active type display device, according to different embodiments. However, types of the components included in the pixel PXL to which an embodiment of the present disclosure may be applied are not limited thereto.

In FIGS. 6A to 6E, not only the components included in each of the pixels shown in FIG. 5 but also an area where the components are provided are referred to as the pixel PXL. According to one or more embodiments, each pixel PXL shown in FIGS. 6A to 6E may be any one of the pixels PXL included in the display device of FIG. 5, and the pixels PXL may have structures substantially identical or similar to each other.

Referring to FIGS. 1A to 4B, 5, and 6A to 6E, one pixel PXL (hereinafter referred to as a "pixel") may include an emission unit EMU that generates light of a luminance corresponding to the data signal. In addition, the pixel PXL may selectively further include a pixel circuit 144 for driving the emission unit EMU.

According to one or more embodiments, the emission unit EMU may include the plurality of light emitting elements LD connected in parallel between a first power supply line PL1 to which a voltage of first driving power supply VDD is applied and a second power supply line PL2 to which a voltage of second driving power supply VSS is applied. For example, the emission unit EMU may include a first electrode EL1 (or a "first alignment electrode") connected to the first driving power supply VDD via the pixel circuit 144 and the first power supply line PL1, a second electrode EL2 (or a "second alignment electrode") connected to the second driving power supply VSS via the second power supply line PL2, and the plurality of light emitting elements LD connected in parallel in the same direction between the first and second electrodes EL1 and EL2. In one or more embodiments of the present disclosure, the first electrode EL1 may be an anode electrode, and the second electrode EL2 may be a cathode electrode.

In one or more embodiments of the present disclosure, each of the light emitting elements LD included in the emission unit EMU may include a first end connected to the first driving power supply VDD through the first electrode EL1 and a second end connected to the second driving power supply VSS through the second electrode EL2. The first driving power supply VDD and the second driving power supply VSS may have different potentials. For example, the first driving power supply VDD may be set as high potential power, and the second driving power supply VSS may be set as low potential power. At this time, a potential difference between the first driving power supply VDD and the second driving power supply VSS may be set as a threshold voltage or more of the light emitting elements LD during an emission period of the pixel PXL.

As described above, the respective the light emitting elements LD connected in parallel in the same direction (for example, a forward direction) between the first electrode EL1 and the second electrode EL2 to which voltages of different potentials are supplied may configure respective effective light sources. Such effective light sources may be gathered to configure the emission unit EMU of the pixel PXL.

The light emitting elements LD of the emission unit EMU may emit light with a luminance corresponding to a driving current supplied through the corresponding pixel circuit 144. For example, the pixel circuit 144 may supply a driving current corresponding to a grayscale value of corresponding frame data to the emission unit EMU during each frame period. The driving current supplied to the emission unit EMU may be divided and flow to the light emitting elements LD. Therefore, each of the light emitting elements LD may emit light with the luminance corresponding to the current flowing therethrough, and thus the emission unit EMU may emit light of the luminance corresponding to the driving current.

Figure 6A:
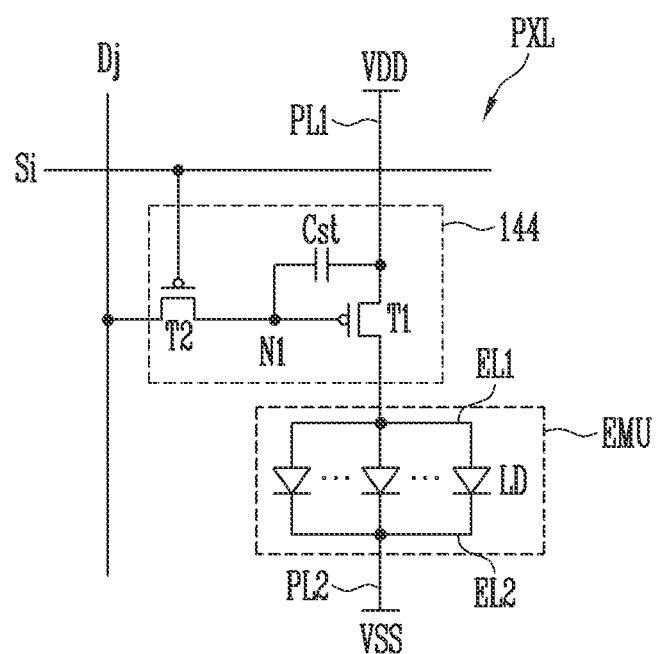
FIGS. 6A to 6E are circuit diagrams illustrating an electrical connection relationship between components included in one pixel shown in FIG. 5 according to one or more embodiments.
Figure 6B:
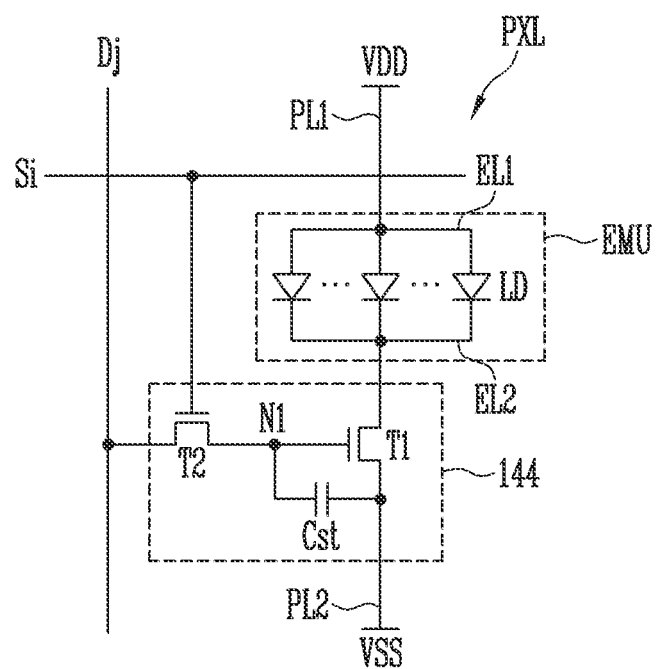
Figure 6C:
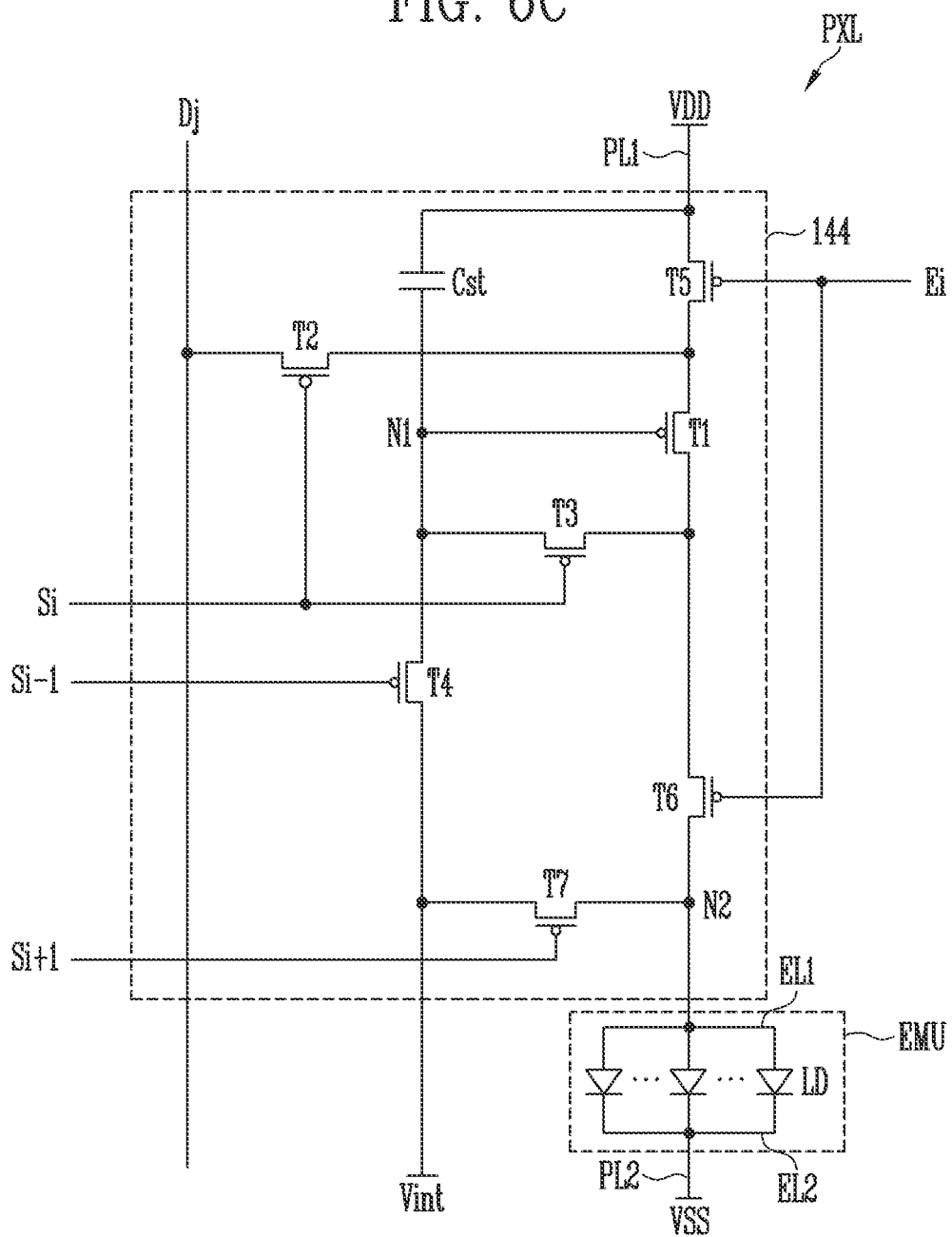
Figure 6D:
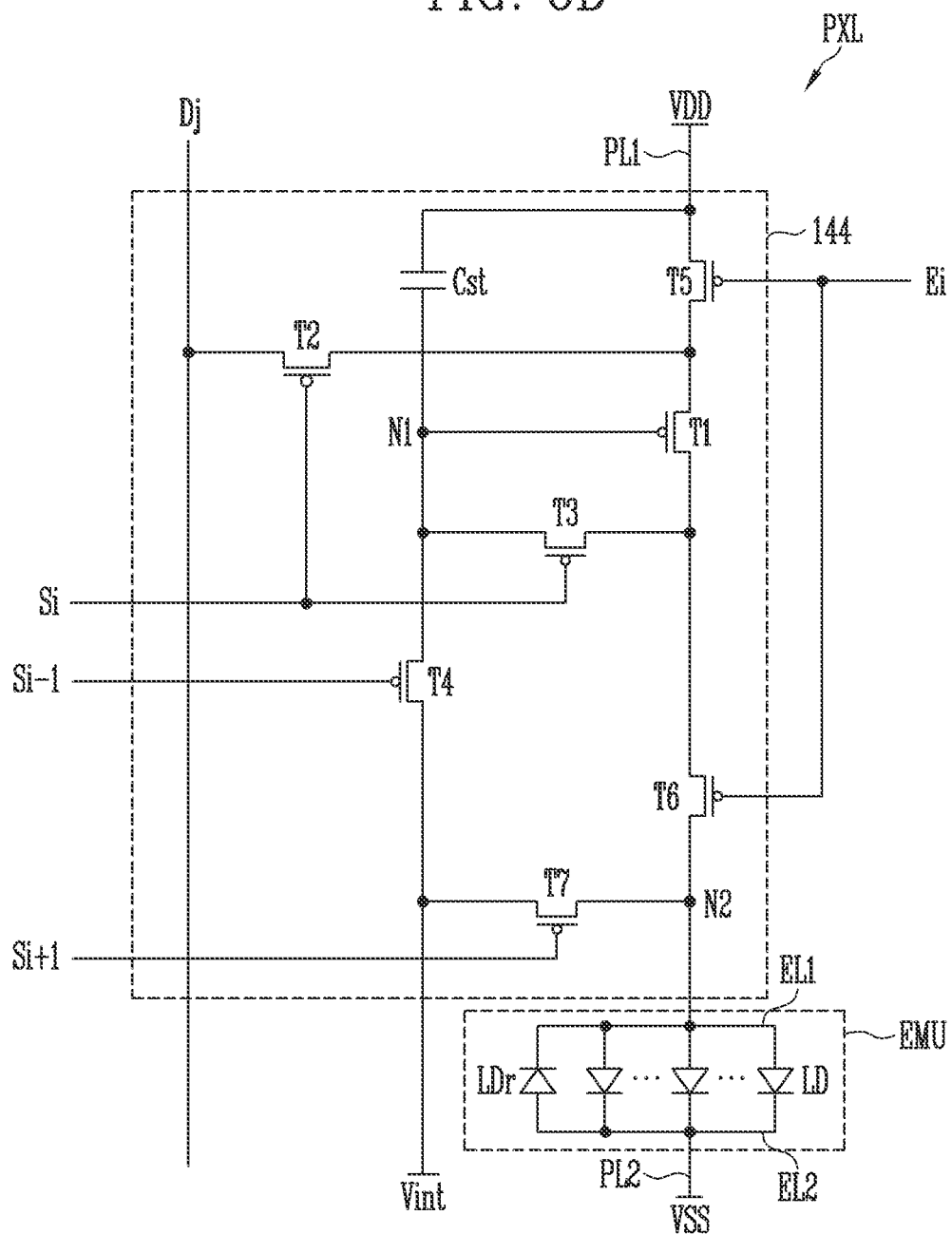
Figure 6E:
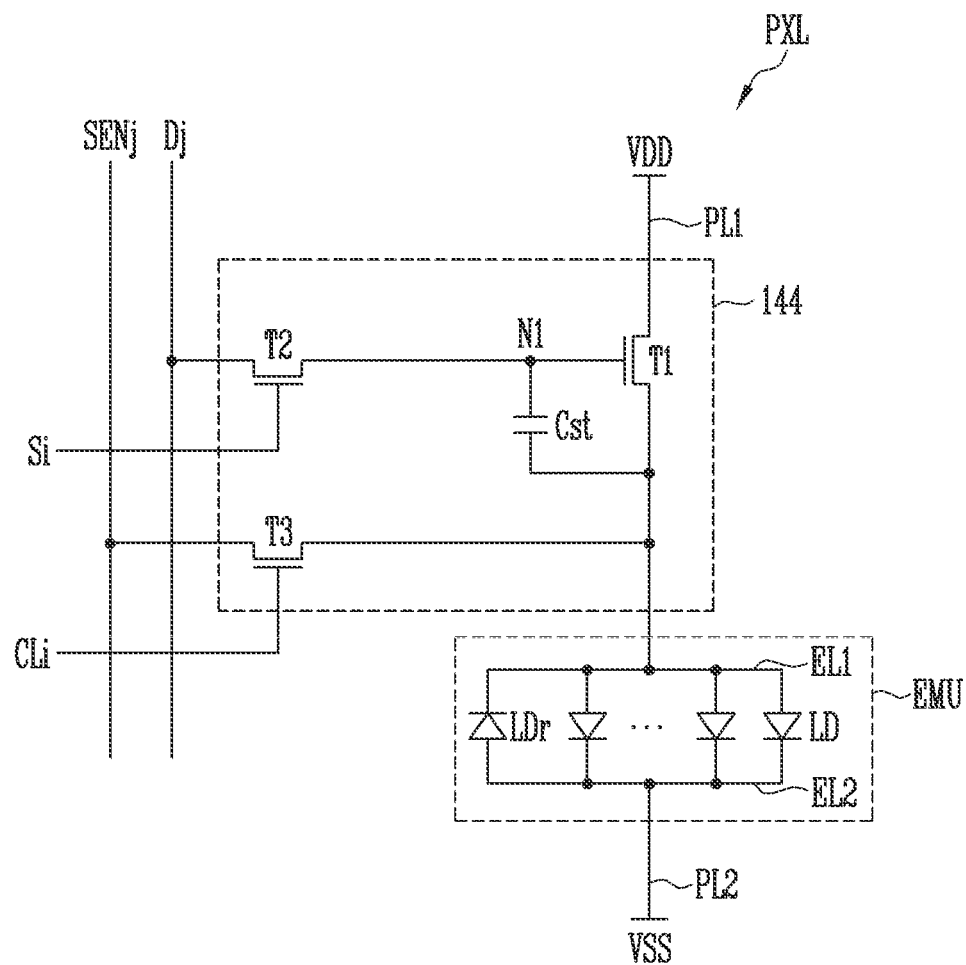

FIGS. 6A to 6E show one or more embodiments in which the both ends of the light emitting elements LD are connected in the same direction between the first driving power supply VDD and the second driving power supply VSS, but the present disclosure is not limited thereto. According to one or more embodiments, the emission unit EMU may further include at least one ineffective light source (e.g., LDr of FIGS. 6D-6E) in addition to the light emitting elements LD configuring each effective light source. For example, at least reverse light emitting element LDr may be further connected between the first and second electrodes EL1 and EL2 of the emission unit EMU, as shown in FIGS. 6D and 6E. The reverse light emitting element LDr may be connected in parallel between the first and second electrodes EL1 and EL2 together with the light emitting elements LD configuring the effective light sources, and may be connected between the first and second electrodes EL1 and EL2 in a direction opposite to the light emitting elements LD. The reverse light emitting element LDr maintains an inactive state even though a suitable driving voltage (e.g., a predetermined driving voltage (for example, a driving voltage of a forward direction)) is applied between the first and second electrodes EL1 and EL2, and thus a current substantially does not flow through the reverse light emitting element LDr.

The pixel circuit 144 may be connected to a scan line Si and a data line Dj of a corresponding pixel PXL. For example, when the pixel PXL is disposed in an i-th (i is a natural number) row and a j-th (j is a natural number) column of the display area DA, the pixel circuit 144 of the pixel PXL may be connected to the i-th scan line Si and the j-th data line Dj of the display area DA. According to one or more embodiments, the pixel circuit 144 may include first and second transistors T1 and T2 and a storage capacitor Cst as shown in FIGS. 6A and 6B. However, a structure of the pixel circuit 144 is not limited to the embodiments shown in FIGS. 6A and 6B.

First, referring to FIG. 6A, the pixel circuit 144 may include the first and second transistors T1 and T2 and the storage capacitor Cst.

A first terminal of the second transistor T2 (or a switching transistor) may be connected to the data line Dj, and a second terminal may be connected to a first node N1. Here, the first terminal and the second terminal of the second transistor T2 may be different terminals, and for example, when the first terminal is a source electrode, the second terminal may be a drain electrode. In addition, a gate electrode of the second transistor T2 may be connected to the i-th scan line Si.

The second transistor T2 may be turned on when a scan signal of a voltage (for example, a low voltage) at which the second transistor T2 may be turned on from the i-th scan line Si is supplied, to electrically connect the j-th data line Dj and the first node N1 to each other. At this time, a data signal of a corresponding frame is supplied to the j-th data line Dj, and thus the data signal is transmitted to the first node N1. The data signal transmitted to the first node N1 is charged in the storage capacitor Cst.

A first terminal of the first transistor T1 (or a driving transistor) may be connected to the first driving power supply VDD, and a second terminal may be electrically connected to the first electrode EL1 of each of the emission unit EMU. A gate electrode of the first transistor T1 may be connected to the first node N1. The first transistor T1 controls an amount of the driving current supplied to the light emitting elements LD in response to a voltage of the first node N1.

One electrode of the storage capacitor Cst may be connected to the first driving power supply VDD, and another electrode may be connected to the first node N1. The storage capacitor Cst is charged with a voltage corresponding to the data signal supplied to the first node N1 and maintains the charged voltage until a data signal of a next frame is supplied.

Each of FIGS. 6A and 6B shows the pixel circuit 144 including the second transistor T2 for transmitting the data signal into the pixel PXL, the storage capacitor Cst for storing the data signal, and the first transistor T1 for supplying the driving current corresponding to the data signal to the light emitting elements LD.

However, the present disclosure is not limited thereto, and the structure of the pixel circuit 144 may be variously modified and implemented. For example, it goes without saying that the pixel circuit 144 may further include other circuit elements such as at least one transistor element such as a transistor element for compensating for a threshold voltage of the first transistor T1, a transistor element for initializing the first node N1, and/or a transistor element for controlling an emission time of the light emitting element LD, or a boosting capacitor for boosting the voltage of the first node N1.

In addition, in FIG. 6A, the transistors included in the pixel circuit 144, for example, the first and second transistors T1 and T2 are P-type transistors, but the present disclosure is not limited thereto. That is, at least one of the first and second transistors T1 and T2 included in the pixel circuit 144 may be changed to an N-type transistor.

Next, referring to FIGS. 1A to 4B, 5, and 6B, according to one or more embodiments of the present disclosure, the first and second transistors T1 and T2 may be implemented as N-type transistors. A configuration or an operation of the pixel circuit 144 shown in FIG. 6B is similar to that of the pixel circuit 144 of FIG. 6A except for a connection position change of some components due to a transistor type change. Therefore, a description thereof is briefly provided.

In one or more embodiments of the present disclosure, the pixel circuit 144 shown in FIG. 6B may include the first and second transistors T1 and T2 formed of the N-type transistors, and the storage capacitor Cst. When the first and second transistors T1 and T2 are formed of the N-type transistors, the emission unit EMU may be connected between the first driving power supply VDD and the pixel circuit 144 for stabilization of the storage capacitor Cst that is charged with the voltage corresponding to the data signal supplied to the first node N1. However, the present disclosure is not limited thereto, and according to one or more embodiments, the emission unit EMU shown in FIG. 6B may be connected between the pixel circuit 144 and the second driving power supply VSS. In one or more embodiments of the present disclosure, the configuration of the pixel circuit 144 is not limited to the embodiment shown in FIGS. 6A and 6B. For example, the pixel circuit 144 may be configured as in an embodiment shown in FIGS. 6C and 6D.

According to one or more embodiments, the pixel circuit 144 connected to the pixel PXL positioned in the i-th row and the j-th column may be further connected to at least another scan line as shown in FIGS. 6C and 6D. For example, the pixel PXL disposed in the i-th row of the display area DA may be further connected to an (i−1)-th scan line Si-1 and/or an (i+1)-th scan line Si+1. In addition, according to one or more embodiments, the pixel circuit 144 may be further connected to third power in addition to the first driving power supply VDD and the second driving power supply VSS. For example, the pixel circuit 144 may also be connected to initialization power Vint.

The pixel circuit 144 may include first to seventh transistors T1 to T7 and a storage capacitor Cst.

One electrode, for example, a source electrode of the first transistor T1 (e.g., a driving transistor) may be connected to the first driving power supply VDD via the fifth transistor T5, and another electrode, for example, a drain electrode may be connected to one end of the light emitting elements LD via the sixth transistor T6. In addition, a gate electrode of the first transistor T1 may be connected to a first node N1. The first transistor T1 controls the driving current flowing between the first driving power supply VDD and the second driving power supply VSS via the light emitting elements LD in response to a voltage of the first node N1.

The second transistor T2 (e.g., a switching transistor) may be connected between the j-th data line Dj connected to the pixel PXL and the source electrode of the first transistor T1. In addition, a gate electrode of the second transistor T2 may be connected to the i-th scan line Si connected to the pixel PXL. The second transistor T2 may be turned on when a scan signal of a gate-on voltage (for example, a low voltage) is supplied from the i-th scan line Si, to electrically connect the j-th data line Dj to the source electrode of the first transistor T1. Therefore, when the second transistor T2 is turned on, the data signal supplied from the j-th data line Dj is transmitted to the first transistor T1.

The third transistor T3 may be connected between the drain electrode of the first transistor T1 and the first node N1. In addition, a gate electrode of the third transistor T3 may be connected to the i-th scan line Si. The third transistor T3 may be turned on when the scan signal of the gate-on voltage is supplied from the i-th scan line Si, to electrically connect the drain electrode of the first transistor T1 and the first node N1 to each other (e.g., so that the first transistor T1 is diode-connected).

The fourth transistor T4 may be connected between the first node N1 and an initialization power supply line to which a voltage of the initialization power Vint is applied. In addition, a gate electrode of the fourth transistor T4 may be connected to a previous scan line, for example, the (i−1)-th scan line Si-1. The fourth transistor T4 may be turned on when the scan signal of the gate-on voltage is supplied to the (i−1)-th scan line Si−1, to transmit a voltage of the initialization power Vint to the first node N1. Here, the initialization power Vint may have a voltage less than or equal to the lowest voltage of the data signal.

The fifth transistor T5 may be connected between the first driving power supply VDD and the first transistor T1. In addition, a gate electrode of the fifth transistor T5 may be connected to a corresponding emission control line, for example, an i-th emission control line Ei. The fifth transistor T5 may be turned off when an emission control signal of a gate-off voltage is supplied to the i-th emission control line Ei, and may be turned on when an emission control signal of a gate-on voltage is supplied to the i-th emission control line Ei.

The sixth transistor T6 may be connected between the first transistor T1 and a second node N2 electrically connected to one end of the light emitting elements LD. In addition, a gate electrode of the sixth transistor T6 may be connected to the i-th emission control line Ei. The sixth transistor T6 may be turned off when the emission control signal of the gate-off voltage is supplied to the i-th emission control line Ei, and may be turned on when an emission control signal of a gate-on voltage is supplied to the i-th emission control line Ei.

The seventh transistor T7 may be connected between the one end of the light emitting elements LD and the initialization power supply line. In addition, a gate electrode of the seventh transistor T7 may be connected to any one of next scan lines, for example, the (i+1)-th scan line Si+1. The seventh transistor T7 may be turned on when the scan signal of the gate-on voltage is supplied to the (i+1)-th scan line Si+1, to supply the voltage of the initialization power Vint to the one end of the light emitting elements LD.

The storage capacitor Cst may be connected between the first driving power supply VDD and the first node N1. The storage capacitor Cst may store a data signal supplied to the first node N1 and a voltage corresponding to the threshold voltage of the first transistor T1 during each frame period.

In FIGS. 6C and 6D, the transistors included in the pixel circuit 144, for example, the first to seventh transistors T1 to T7 are P-type transistors, but the present disclosure is not limited thereto. For example, at least one of the first to seventh transistors T1 to T7 may be changed to an N-type transistor.

In one or more embodiments of the present disclosure, the configuration of the pixel circuit 144 is not limited to the embodiment shown in FIGS. 6A to 6D. For example, the pixel circuit 144 may be configured as in an embodiment shown in FIG. 6E.

The pixel circuit 144 may be further connected to a control line CLi and a sensing line SENj as shown in FIG. 6E. For example, the pixel circuit 144 of the pixel PXL disposed in the i-th row and the j-th column of the display area DA may be connected to an i-th control line CLi and a j-th sensing line SENj of the display area DA. The above-described pixel circuit 144 may further include a third transistor T3 in addition to the first and second transistors T1 and T2 shown in FIGS. 6A and 6B.

The third transistor T3 is connected between the first transistor T1 and the j-th sensing line SENj. For example, one electrode of the third transistor T3 may be connected to the one terminal (for example, the source electrode) of the first transistor T1 connected to the first electrode EL1, and another electrode of the third transistor T3 may be connected to the j-th sensing line SENj.

According to one or more embodiments, a gate electrode of the third transistor T3 is connected to the i-th control line CLi. The third transistor T3 may be turned on by a control signal of a gate-on voltage (for example, a high level) supplied to the i-th control line CLi during a suitable sensing period (e.g., a predetermined sensing period), to electrically connect the j-th sensing line SENj and the first transistor T1 to each other.

According to one or more embodiments, a sensing period may be a period for extracting characteristic information (for example, the threshold voltage or the like of the first transistor T1) of each of the pixels PXL disposed in the display area DA. During the above-described sensing period, the first transistor T1 may be turned on by supplying a suitable reference voltage (e.g., a predetermined reference voltage) at which the first transistor T1 may be turned on to the first node N1 through the j-th data line Dj and the second transistor T2, or connecting each pixel PXL to a current source or the like. In addition, the first transistor T1 may be connected to the j-th sensing line SENj by supplying the control signal of the gate-on voltage to the third transistor T3 to turn on the third transistor T3. Accordingly, the characteristic information of each pixel PXL including the threshold voltage or the like of the first transistor T1 may be extracted through the j-th sensing line SENj. The extracted characteristic information may be used to convert image data so that a characteristic deviation between the pixels PXL is compensated.

FIG. 6E discloses an embodiment in which all of the first to third transistors T1 to T3 are N-type transistors, but the present disclosure is not limited thereto. For example, at least one of the above-described first to third transistors T1 to T3 may be changed to a P-type transistor. In addition, FIG. 6E discloses an embodiment in which the emission unit EMU is connected between the pixel circuit 144 and the second driving power supply VSS, but the emission unit EMU may also be connected between the first driving power supply VDD and the pixel circuit 144.

In addition, FIGS. 6A to 6E show one or more embodiments in which all of the light emitting elements LD configuring each emission unit EMU are connected in parallel, but the present disclosure is not limited thereto. According to one or more embodiments, the emission unit EMU may be configured to include at least one series stage including the plurality of light emitting elements LD connected in parallel with each other. That is, the emission unit EMU may be configured in a series/parallel mixed structure. This is described later with reference to FIGS. 7A and 7B.

The structure of the pixel PXL that may be applied to the present disclosure is not limited to the embodiments shown in FIGS. 6A to 6E, and the corresponding pixel may have various structures. In addition, in another embodiment of the present disclosure, each pixel PXL may be configured inside a passive type light emitting display device or the like. In this case, the pixel circuit 144 may be omitted, and each of the both ends of the light emitting elements LD included in the emission unit EMU may be directly connected to each of the scan lines Si−1, Si, and Si+1, the j-th data line Dj, the first power supply line PL1 to which a voltage of the first driving power supply VDD is applied, a voltage of the second power supply line PL2 to which the second driving power supply VSS is applied, a suitable control line (e.g., a predetermined control line), and/or the like.

Figure 7A:
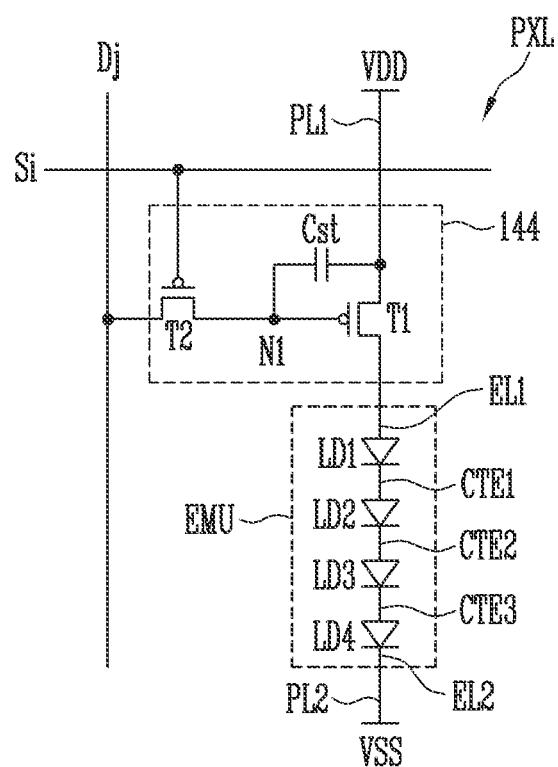
FIGS. 7A and 7B are circuit diagrams illustrating the electrical connection relation of the components included in one pixel shown in FIG. 5 according to one or more embodiments.
Figure 7B:
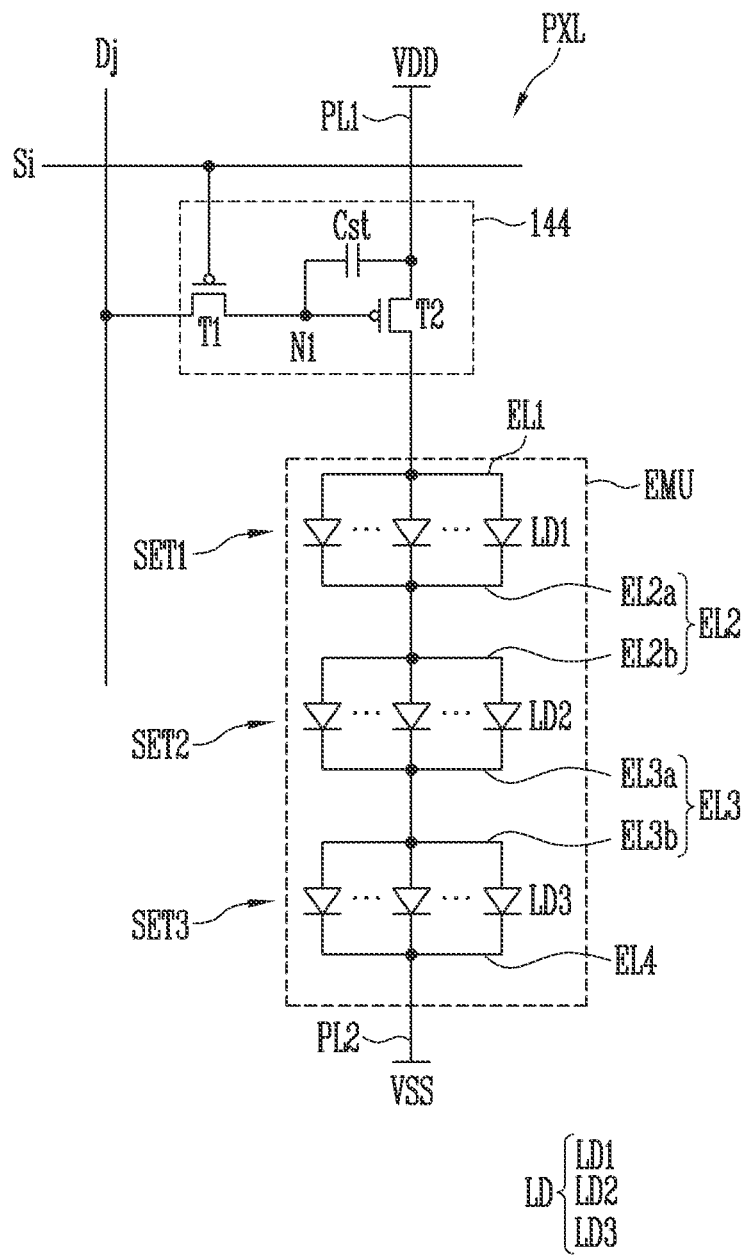

FIGS. 7A and 7B are circuit diagrams illustrating the electrical connection relation of the components included in one pixel shown in FIG. 5 according to one or more embodiments.

In FIGS. 7A and 7B, the emission unit EMU of each pixel PXL may be configured to include a plurality of series stages which are successively connected to each other. In describing the embodiments of FIGS. 7A and 7B, in order to avoid an overlapping description, a detailed description of a configuration similar or identical to that of the embodiments of FIGS. 6A to 6E, for example, the pixel circuit 144, is omitted.

First, referring to FIG. 7A, the emission unit EMU may include a plurality of light emitting elements LD connected in series to each other. For example, the emission unit EMU may include a first light emitting element LD1, a second light emitting element LD2, a third light emitting element LD3, and a fourth light emitting element LD4 connected in series in a forward direction between the first driving power supply VDD and the second driving power supply VSS to configure an effective light source. In the following embodiment, at least one random light emitting element LD from among the first to fourth light emitting elements LD1 to LD4 or comprehensive first to fourth light emitting elements LD1 to LD4 may be referred to as the light emitting element LD or the light emitting elements LD.

One end (for example, the second semiconductor layer) of the first light emitting element LD1 may be connected to the first driving power supply VDD through the first electrode EL1, and another end (for example, the first semiconductor layer) of the first light emitting element LD1 may be connected to one end (for example, the second semiconductor layer) of the second light emitting element LD2 through a first intermediate electrode CTE1 connected between first and second series stages.

The one end (for example, the second semiconductor layer) of the second light emitting element LD2 may be connected to the first intermediate electrode CTE1, and another end (for example, the first semiconductor layer) of the second light emitting element LD2 may be connected to one end (for example, the second semiconductor layer) of the third light emitting element LD3 through a second intermediate electrode CTE2 connected between second and third series stages.

The one end of the third light emitting element LD3 may be connected to the second intermediate electrode CTE2, and another end (for example, the first semiconductor layer) of the third light emitting element LD3 may be connected to one end (for example, the second semiconductor layer) of the fourth light emitting element LD4 through a third intermediate electrode CTE3 connected between third and fourth series stages.

The one end of the fourth light emitting element LD4 may be connected to the third intermediate electrode CTE3, and another end (for example, the first semiconductor layer) of the fourth light emitting element LD4 may be connected to the second driving power supply VSS through the second electrode EL2.

As described above, the first to fourth light emitting elements LD1 to LD4 may be connected in series between the first and second electrodes EL1 and EL2 of the emission unit EMU of the pixel PXL.

In a case of the emission unit EMU of a structure in which the light emitting elements LD are connected in series, a voltage applied between the first and second electrodes EL1 and EL2 may increase and a magnitude of the driving current flowing through the emission unit EMU may decrease compared to an emission unit EMU of a structure in which the light emitting elements LD are connected in parallel. Therefore, when the emission unit EMU of each pixel PXL is configured in a series structure, power consumption of the display device may be reduced.

According to one or more embodiments, at least one series stage may be provided in a form including a plurality of light emitting elements LD connected in parallel to each other. In this case, the emission unit EMU of each pixel PXL may be configured in a series/parallel mixed structure. For example, the emission unit EMU may be configured as shown in FIG. 7B.

Next, referring to FIG. 7B, the emission unit EMU of the pixel PXL may include a plurality of series stages sequentially connected between the first driving power supply VDD and the second driving power supply VSS. In addition, each series stage may include one or more light emitting elements LD connected in a forward direction between two electrodes configuring an electrode pair of a corresponding series stage. For example, the emission unit EMU may include first to third series stages SET1 to SET3 sequentially connected between the first driving power supply VDD and the second driving power supply VSS, the first to third series stages SET1 to SET3 may respectively include two electrodes EL1 and EL2a, EL2b and EL3a, and EL3b and EL4 configuring an electrode pair of a corresponding series stage, and a plurality of light emitting elements LD connected in parallel in the forward direction, for example, in the same direction, between each of the two electrodes EL1 and EL2a, EL2b and EL3a, and EL3b and EL4.

The first series stage SET1 may include the first electrode EL1 and the 2a-th electrode EL2a from among the two electrodes EL1 and EL2a, EL2b and EL3a, and EL3b and EL4 forming the electrode pair included in the emission unit EMU, and may include at least one first light emitting element LD1 connected between the first electrode EL1 and the 2a-th electrode EL2a. For example, the first series stage SET1 may include the first electrode EL1 connected to the first driving power supply VDD via the pixel circuit 144, the 2a-th electrode connected to the second driving power supply VSS, and a plurality of first light emitting elements LD1 connected between the first electrode EL1 and the 2a-th electrode EL2a. One end (for example, the second semiconductor layer) of each first light emitting element LD1 is electrically connected to the first electrode EL1 of the first series stage SET1, and another end (for example, the first semiconductor layer) thereof is electrically connected to the 2a-th electrode EL2a of the first series stage SET1. The first light emitting elements LD1 may be connected in parallel between the first electrode EL1 and the 2a-th electrode EL2a of the first series stage SET1, and may be connected in the same direction (for example, the forward direction) between the first electrode EL1 and the 2a-th electrode EL2a. According to one or more embodiments, at least one reverse light emitting element (refer to LDr of FIG. 6E) may be further connected to the first series stage SET1. The reverse light emitting element LDr may be connected in parallel between the first electrode EL1 and the 2a-th electrode EL2a together with the first light emitting elements LD1 configuring effective light sources, and may be connected between the first electrode EL1 and the 2a-th electrode EL2a in a direction opposite to that of the first light emitting elements LD1. The reverse light emitting element LDr maintains an inactive state even though a suitable driving voltage (e.g., a predetermined driving voltage (for example, a driving voltage of a forward direction)) is applied between the first and 2a-th electrodes EL1 and EL2a, and thus a current substantially does not flow through the reverse light emitting element LDr.

The second series stage SET2 may include the 2b-th electrode EL2b and the 3a-th electrode EL3a from among the two electrodes EL1 and EL2a, EL2b and EL3a, and EL3b and EL4 forming the electrode pair included in the emission unit EMU, and may include at least one second light emitting element LD2 connected between the 2b-th electrode EL2b and the 3a-th electrode EL3a. For example, the second series stage SET2 may include the 2b-th electrode EL2b connected to the first driving power supply VDD via the pixel circuit 144 and the first series stage SET1, the 3a-th electrode EL3a connected to the second driving power supply VSS, and a plurality of second light emitting elements LD2 connected between the 2b-th electrode EL2b and the 3a-th electrode EL3a. One end (for example, the second semiconductor layer) of each second light emitting element LD2 is electrically connected to the 2b-th electrode EL2b of the second series stage SET2, and another end (for example, the first semiconductor layer) thereof is electrically connected to the 3a-th electrode EL3a of the second series stage SET2. The second light emitting elements LD2 may be connected in parallel between the 2b-th and 3a-th electrodes EL2b and EL3a of the second series stage SET2, and may be connected in the same direction (for example, the forward direction) between the first and second driving power supply VDD and VSS through the 2b-th and 3a-th electrodes EL2b and EL3a. According to one or more embodiments, at least one reverse light emitting element (refer to LDr of FIG. 6E) may be further connected between the 2b-th and 3a-th electrodes EL2b and EL3a. The reverse light emitting element LDr may be connected in parallel between the 2b-th and 3a-th electrodes EL2b and EL3a together with the second light emitting elements LD2 configuring effective light sources, and may be connected between the 2b-th and 3a-th electrodes EL2b and EL3a in a direction opposite to that of the second light emitting elements LD2.

In one or more embodiments of the present disclosure, the 2a-th electrode EL2a of the first series stage SET1 and the 2b-th electrode EL2b of the second series stage SET2 may be integrally provided and connected to each other. That is, the 2a-th electrode EL2a of the first series stage SET1 and the 2b-th electrode EL2b of the second series stage SET2 may configure the second electrode EL2 electrically connecting the first series stage SET1 and the second series stage SET2 to each other. As described above, when the 2a-th electrode EL2a of the first series stage SET1 and the 2b-th electrode EL2b of the second series stage SET2 are integrally provided, the 2a-th electrode EL2a and the 2b-th electrode EL2b may be different areas of the second electrode EL2.

The third series stage SET3 may include the 3b-th electrode EL3b and the fourth electrode EL4 from among the two electrodes EL1 and EL2a, EL2b and EL3a, and EL3b and EL4 forming the electrode pair included in the emission unit EMU, and may include at least one third light emitting element LD3 connected between the 3b-th electrode EL3b and the fourth electrode EL4. For example, the third series stage SET3 may include the 3b-th electrode EL3b connected to the first driving power supply VDD via the pixel circuit 144 and previous series stages, for example, the first and second series stages SET1 and SET2, the fourth electrode EL4 connected to the second driving power supply VSS, and a plurality of third light emitting elements LD3 connected between the 3b-th electrode EL3b and the fourth electrode EL4. One end (for example, the second semiconductor layer) of each third light emitting element LD3 is electrically connected to the 3b-th electrode EL3b of the third series stage SET3, and another end (for example, the first semiconductor layer) thereof is electrically connected to the fourth electrode EL4 of the third series stage SET3. The third light emitting elements LD3 may be connected in parallel between the 3b-th electrode EL3b and the fourth electrode EL4 of the third series stage SET3, and may be connected in the same direction (for example, the forward direction) between the first and second driving power supply VDD and VSS through the 3b-th electrode EL3b and the fourth electrode EL4. According to one or more embodiments, at least one reverse light emitting element (refer to LDr of FIG. 6E) may be further connected between the 3b-th and fourth electrodes EL3b and EL4. The reverse light emitting element LDr may be connected in parallel between the 3b-th and fourth electrodes EL3b and EL4 together with the third light emitting elements LD3 configuring effective light sources, and may be connected between the 3b-th and fourth electrodes EL3b and EL4 in a direction opposite to that of the third light emitting elements LD3.

In one or more embodiments of the present disclosure, the 3a-th electrode EL3a of the second series stage SET2 and the 3b-th electrode EL3b of the third series stage SET3 may be integrally provided and connected to each other. That is, the 3a-th electrode EL3a of the second series stage SET2 and the 3b-th electrode EL3b of the third series stage SET3 may configure a third electrode EL3 electrically connecting the second series stage SET2 and the third series stage SET3 to each other. As described above, when the 3a-th electrode EL3a of the second series stage SET2 and the 3b-th electrode EL3b of the third series stage SET3 are integrally provided, the 3a-th electrode EL3a and the 3b-th electrode EL3b may be different areas of the third electrode EL3.

In the above-described embodiment, the first electrode EL1 of the first series stage SET1 may be the anode electrode of the emission unit EMU of each pixel PXL, and the fourth electrode EL4 of the third series stage SET3 may be the cathode electrode of the emission unit EMU.

As described above, the emission unit EMU of the pixel PXL including the light emitting elements LD connected in the series/parallel mixed structure may easily adjust a driving current/voltage condition according to an applied product specification.

In particular, the emission unit EMU of the pixel PXL including the light emitting elements LD connected in the series/parallel mixed structure may reduce the driving current compared to the emission unit EMU of the structure in which the light emitting elements LD are connected in parallel. In addition, the emission unit EMU of the pixel PXL including the light emitting elements LD connected in the series/parallel mixed structure may reduce the driving voltage applied to the both ends of the emission unit EMU compared to the emission unit EMU of the structure in which all of the light emitting elements LD are connected in series. In addition, in a case where all of the light emitting elements LD are connected only in series, when at least one of the light emitting elements LD connected in series is not completely connected in the forward direction (or the reverse light emitting element LDr is included), a path through which the driving current may flow in the pixel PXL is blocked, and thus a dark spot defect may be caused. On the other hand, in a case where the light emitting elements LD are connected in the series/parallel mixed structure, even though some light emitting elements LD are not connected in the forward direction (or the reverse light emitting element LDr is included) or a defect occurs in some light emitting elements LD in each series stage, the driving current may flow through another light emitting element LD of a corresponding series stage. Accordingly, a defect of the pixel PXL may be prevented or reduced.

Figure 9A:
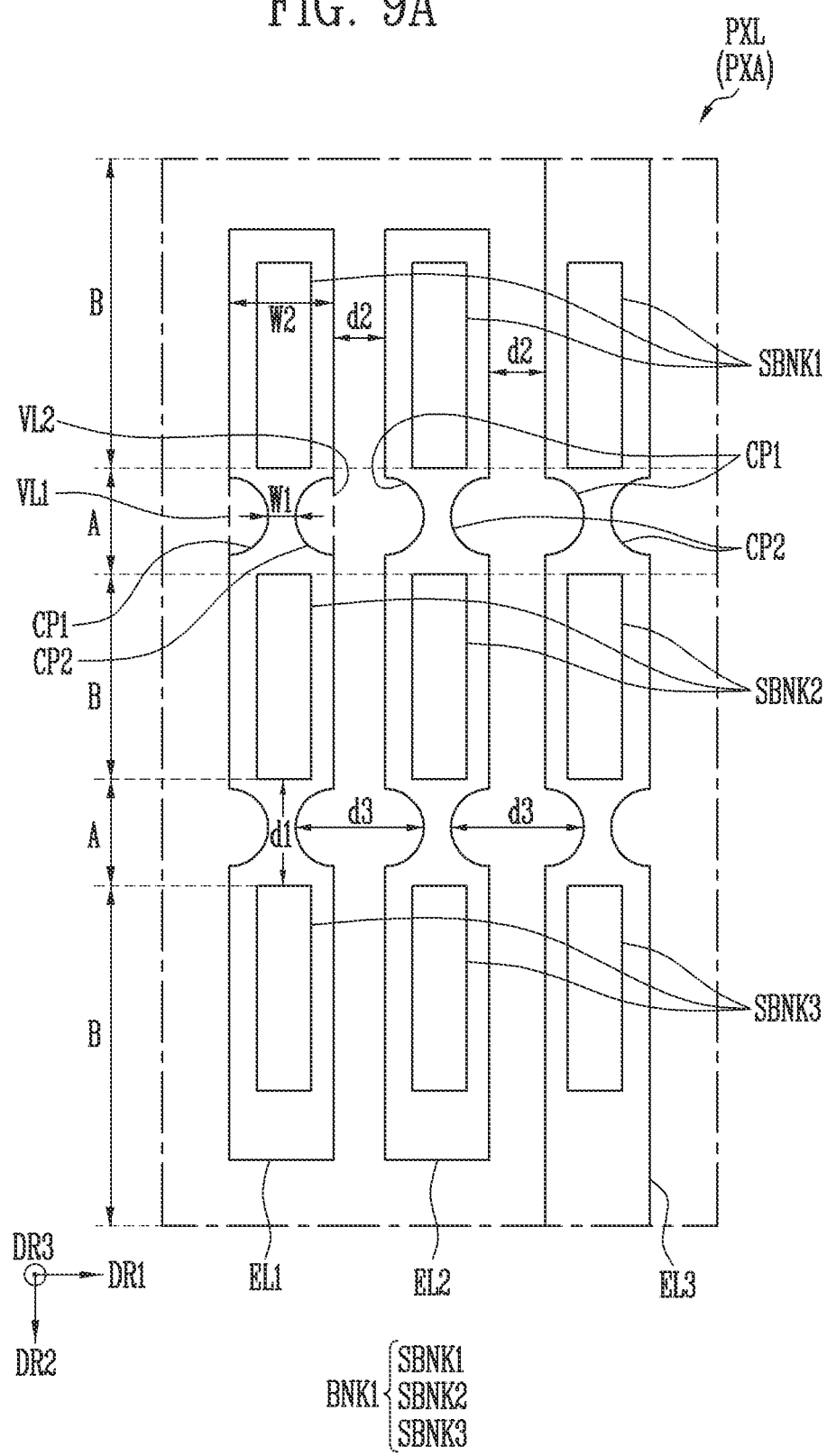
FIG. 9A is a plan view illustrating only a first bank pattern and first to third electrodes of FIG. 8.
Figure 9B:
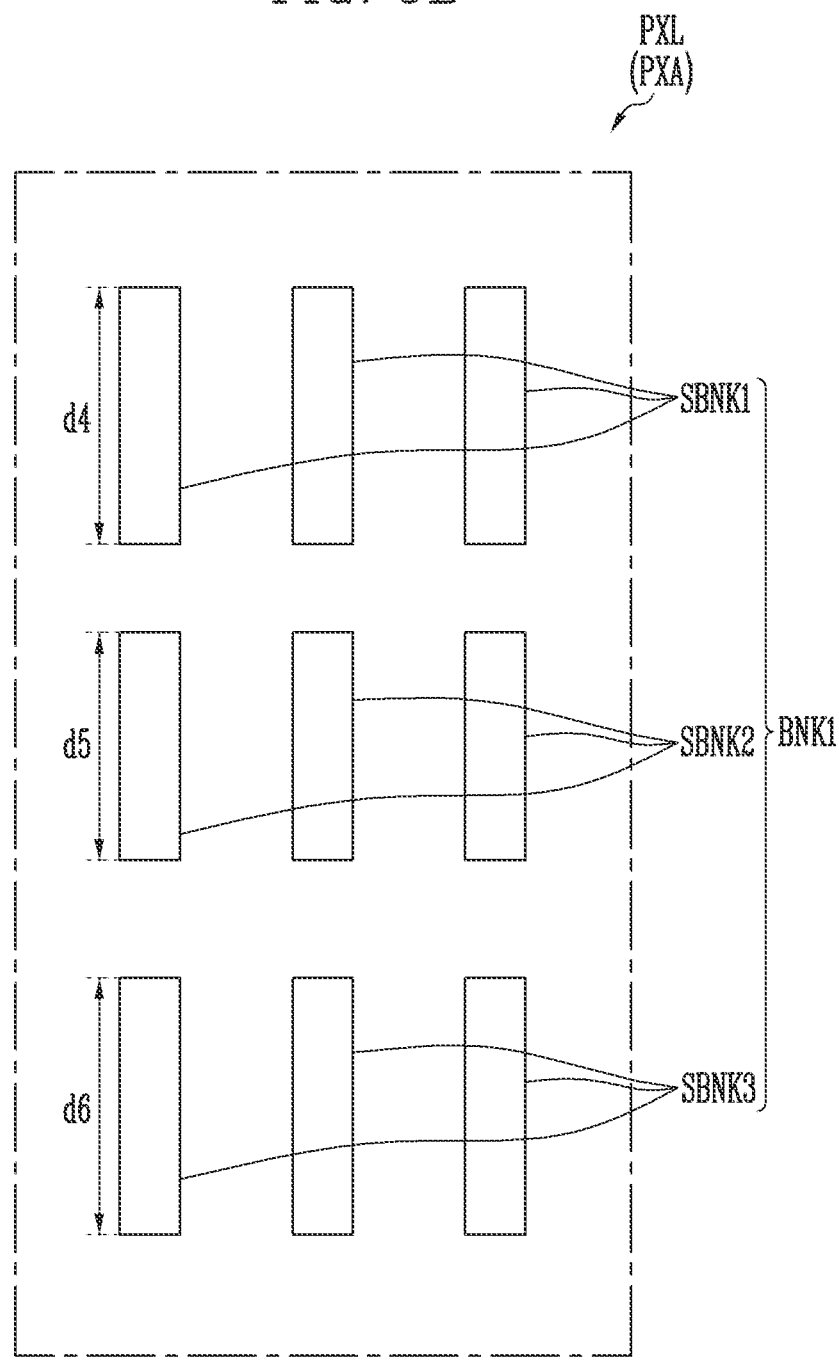
FIG. 9B is a plan view in which first to third sub-bank patterns of FIG. 8 are implemented according to another embodiment.
Figure 10:
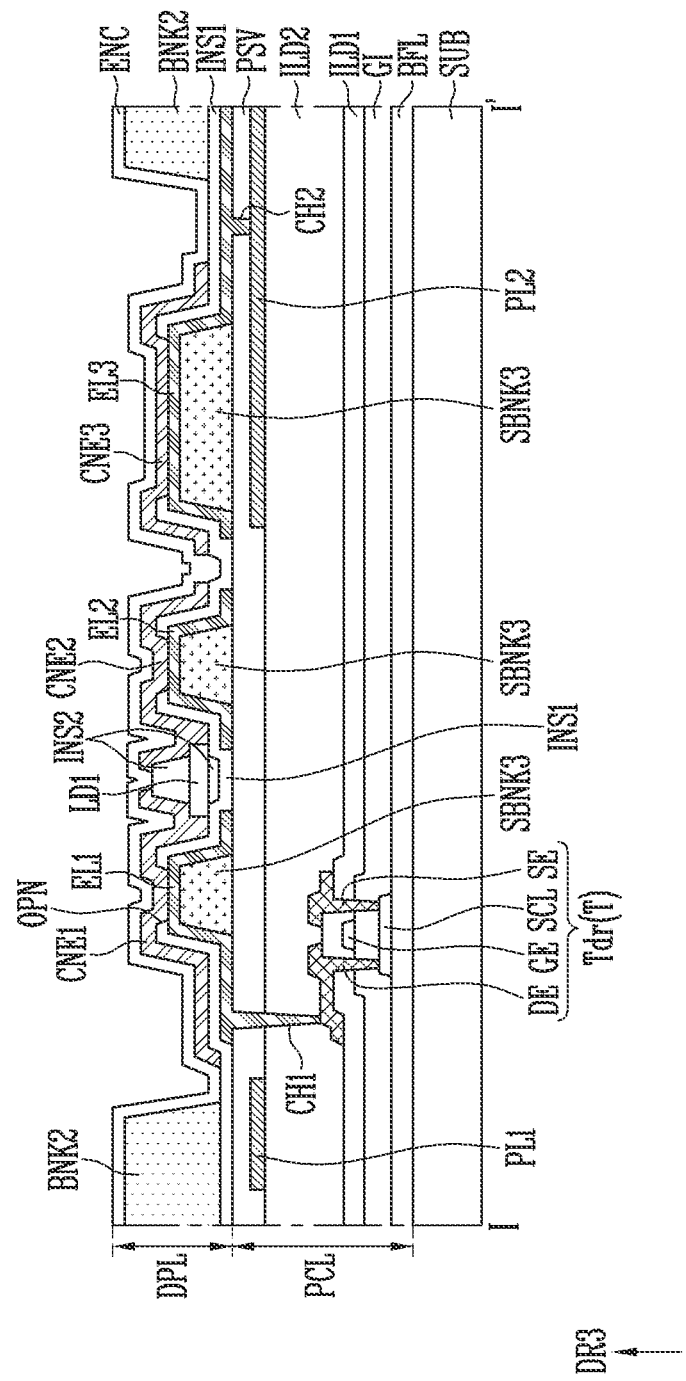
FIG. 10 is a cross-sectional view taken along the line I-I' of FIG. 8.
Figure 11:
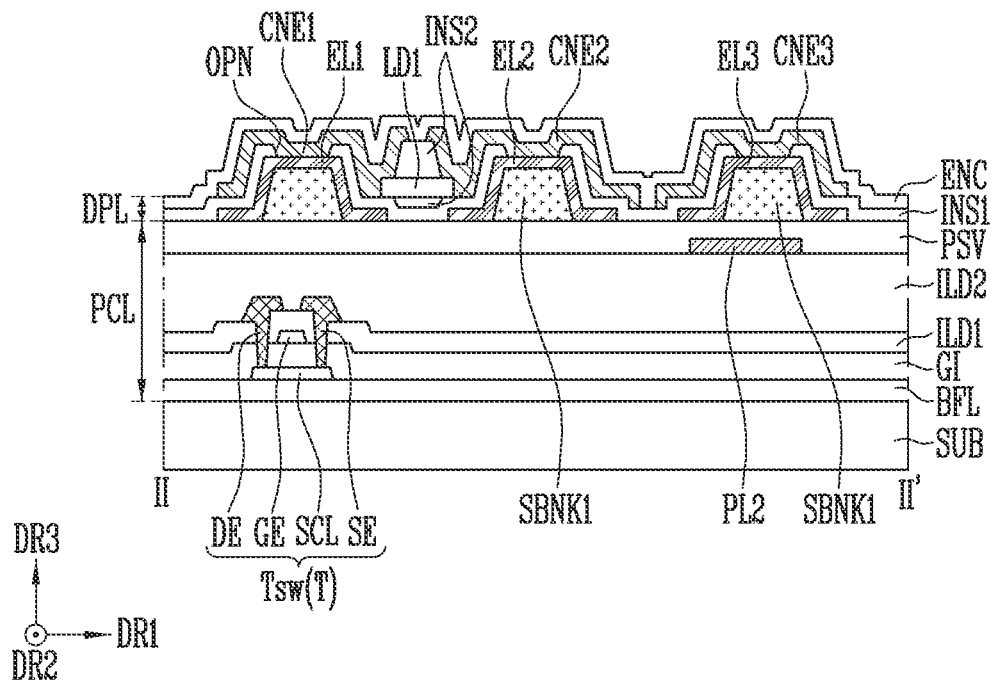
FIG. 11 is a cross-sectional view taken along the line II-II' of FIG. 8.
Figure 12:
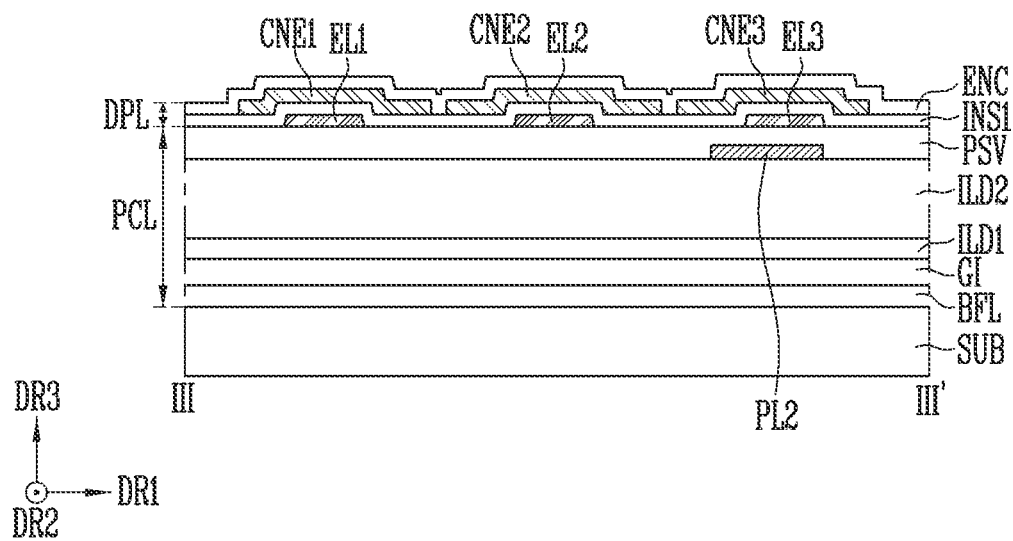
FIG. 12 is a cross-sectional view taken along the line III-III' of FIG. 8.
Figure 13:
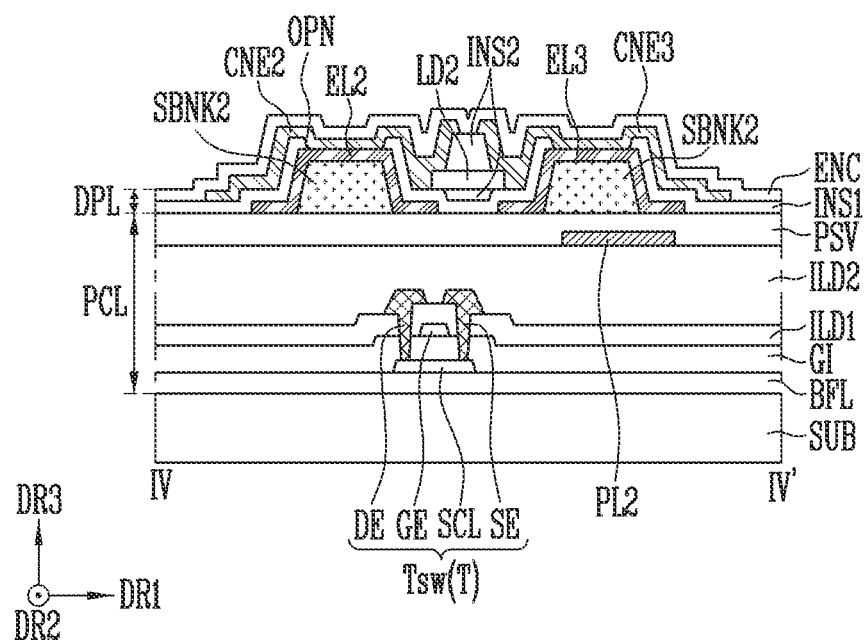
FIG. 13 is a cross-sectional view taken along the line IV-IV' of FIG. 8.
Figure 14:
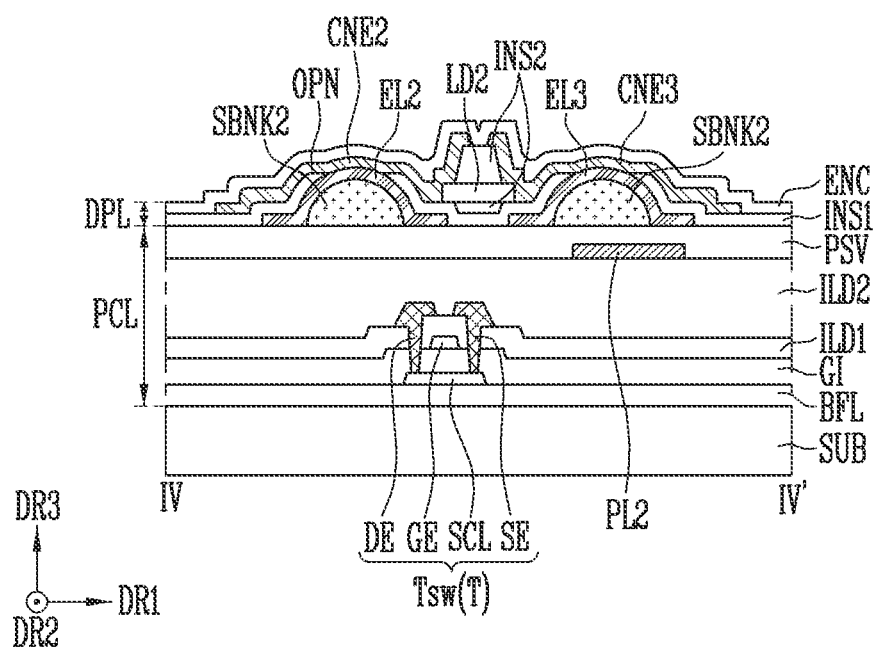
FIG. 14 is a cross-sectional view corresponding to the line IV-IV' of FIG. 8 as implementation of a first bank pattern shown in FIG. 13 according to one or more embodiments.
Figure 15B:
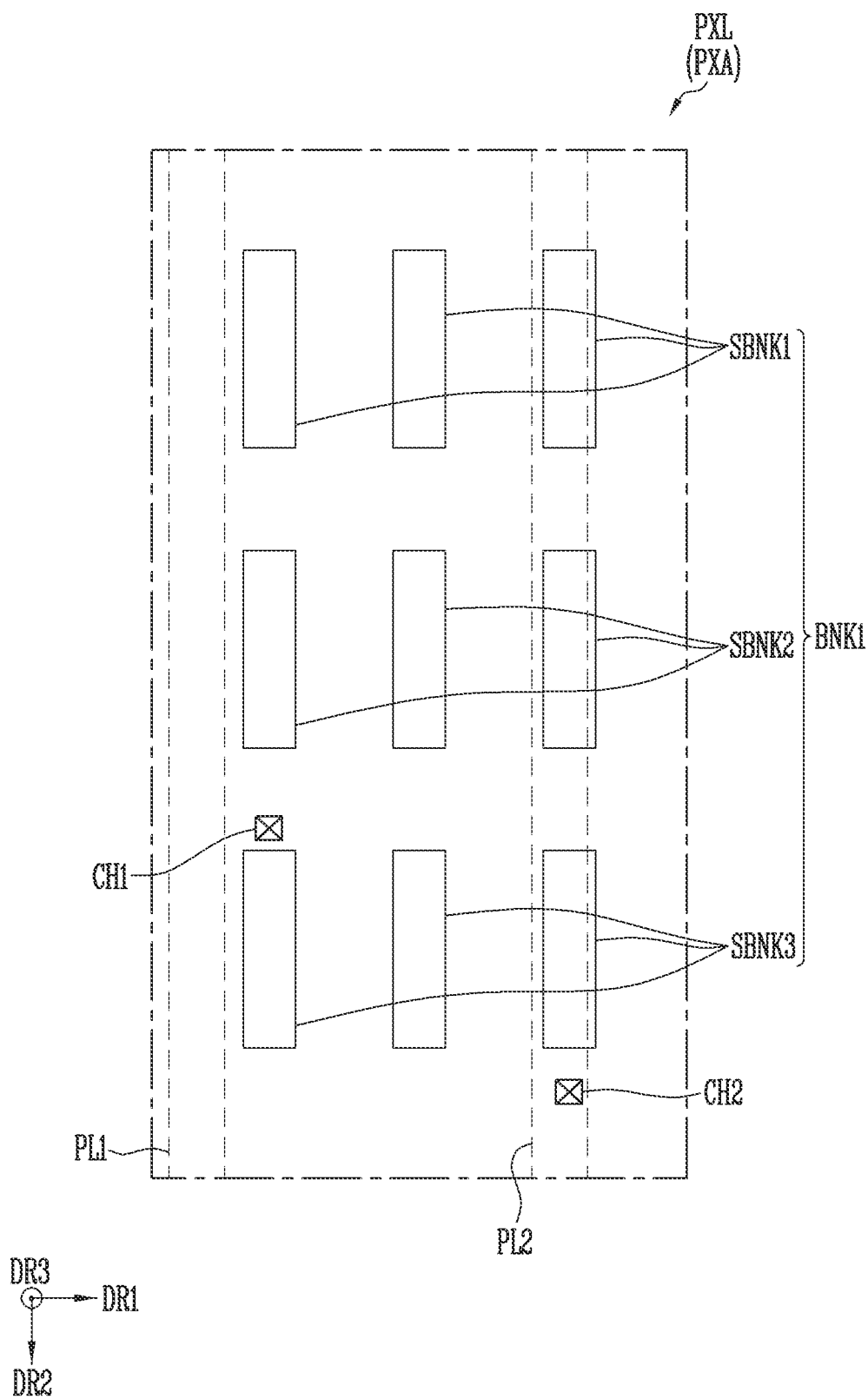
Figure 15C:
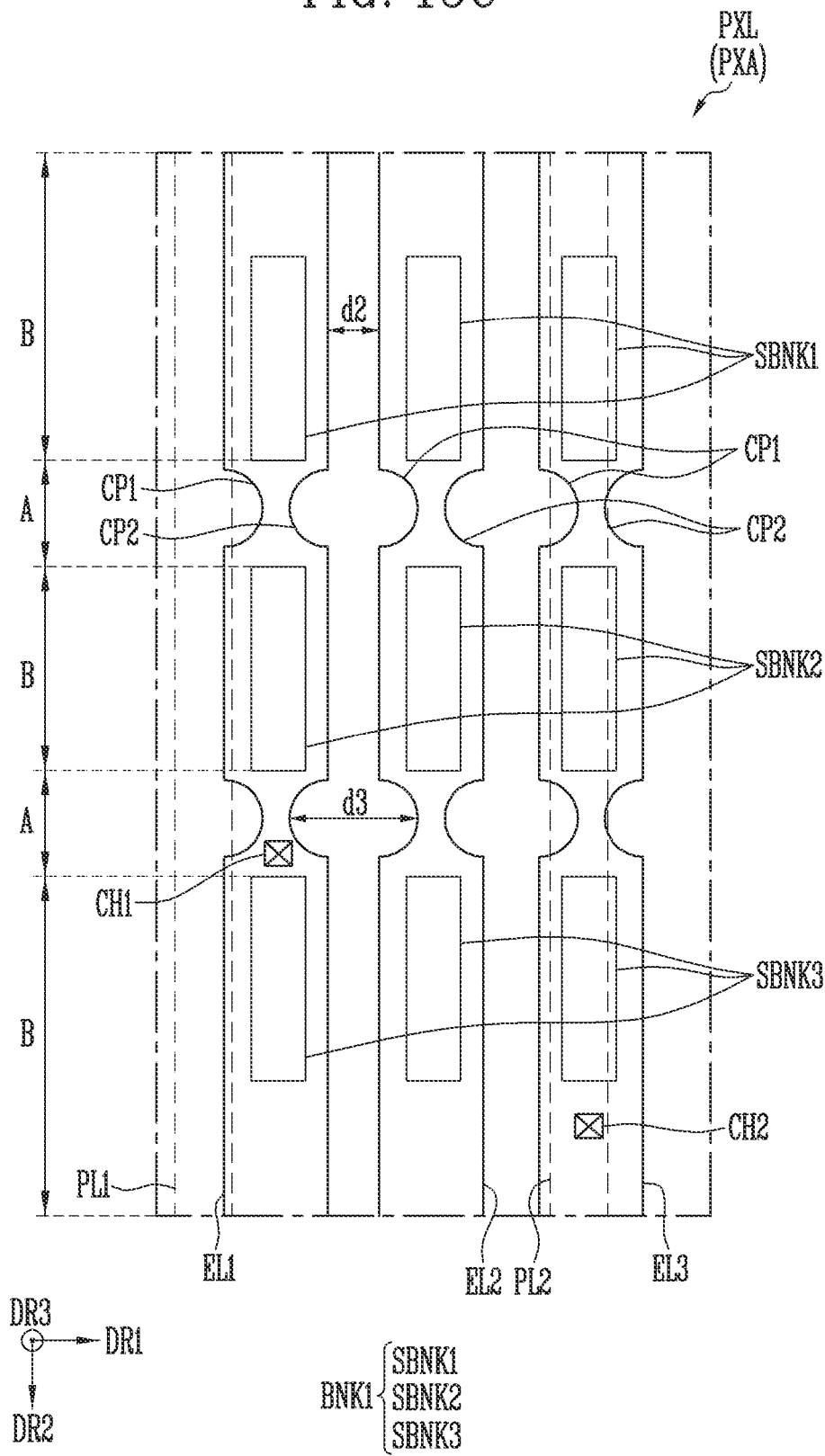
Figure 15D:
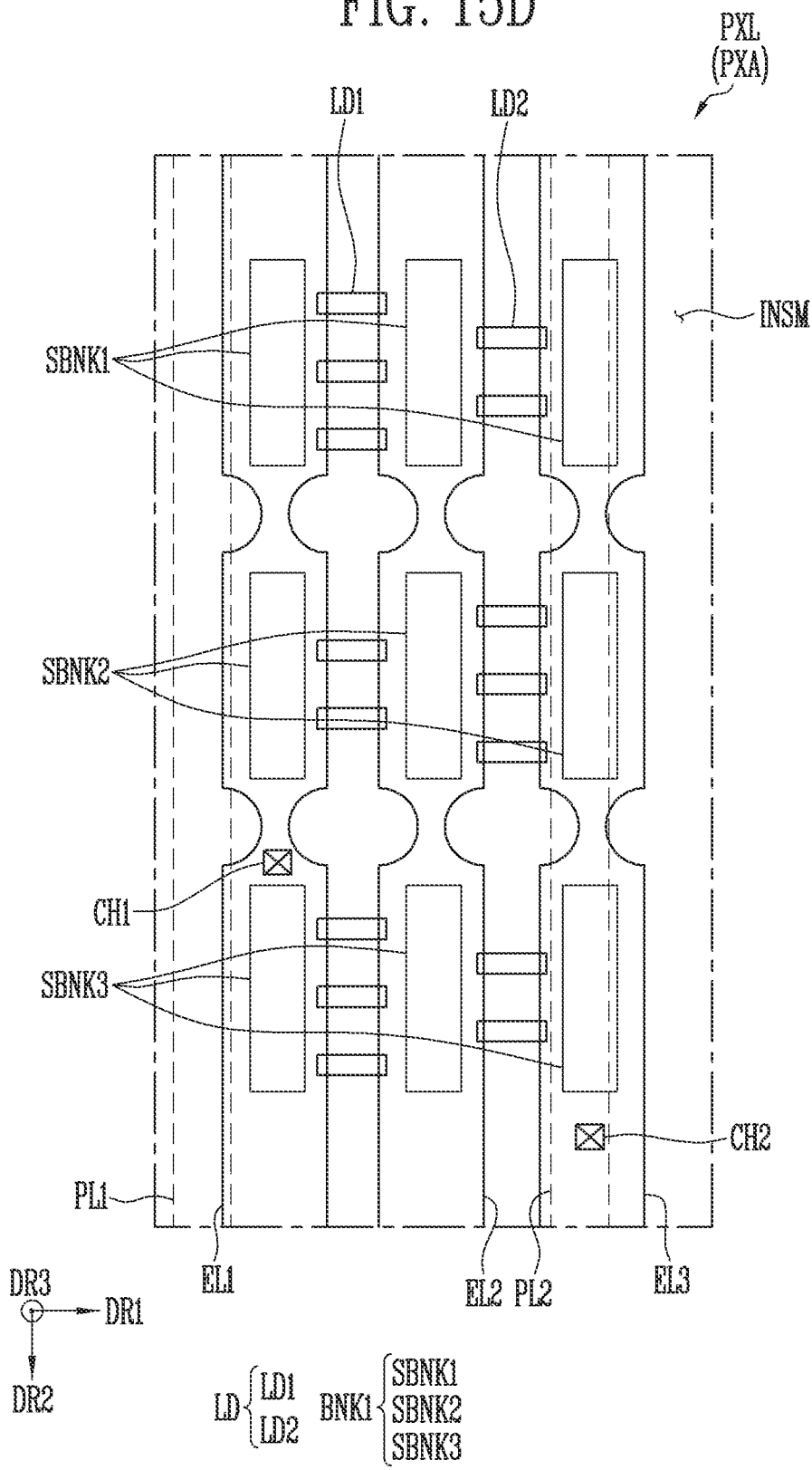
Figure 15E:
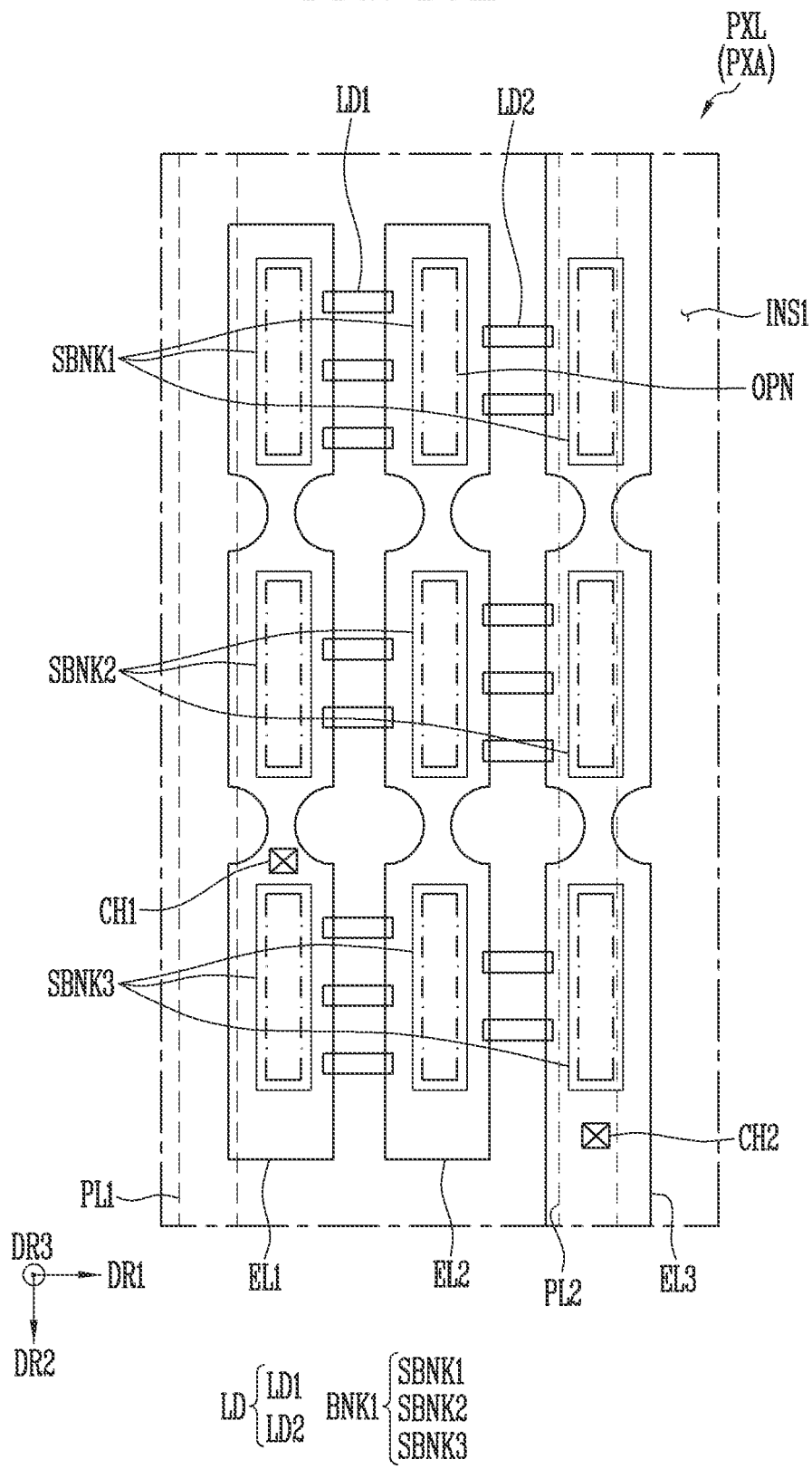
Figure 15F:
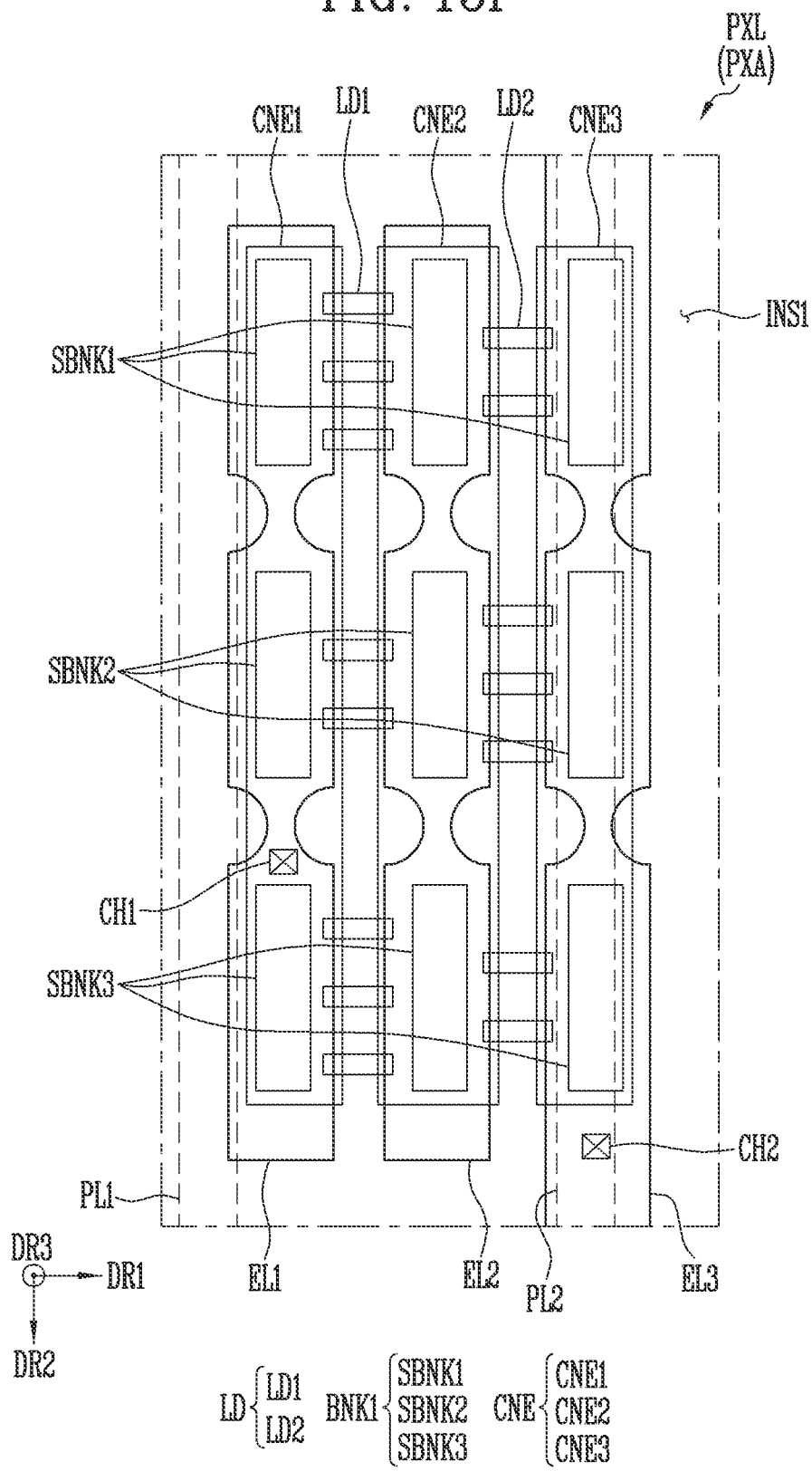
Figure 16A:
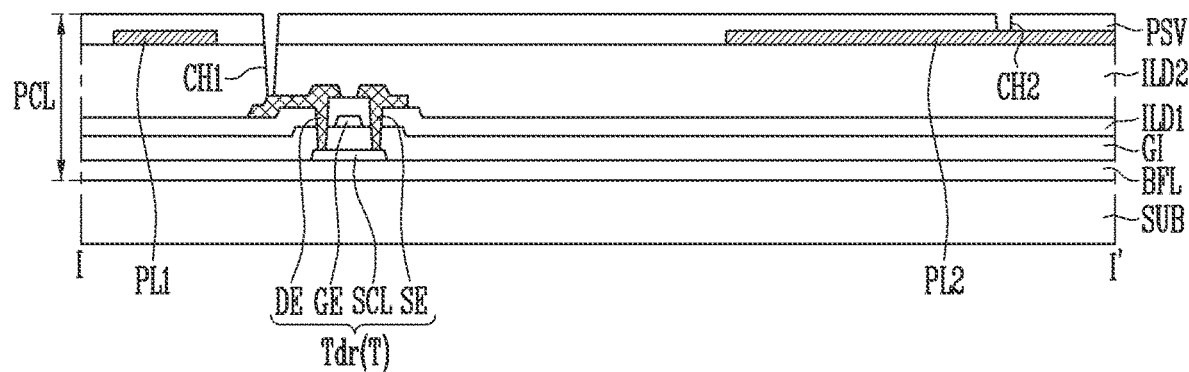
FIGS. 16A to 16H are schematic cross-sectional views sequentially illustrating a method of manufacturing the pixel shown in FIG. 10.
Figure 16B:
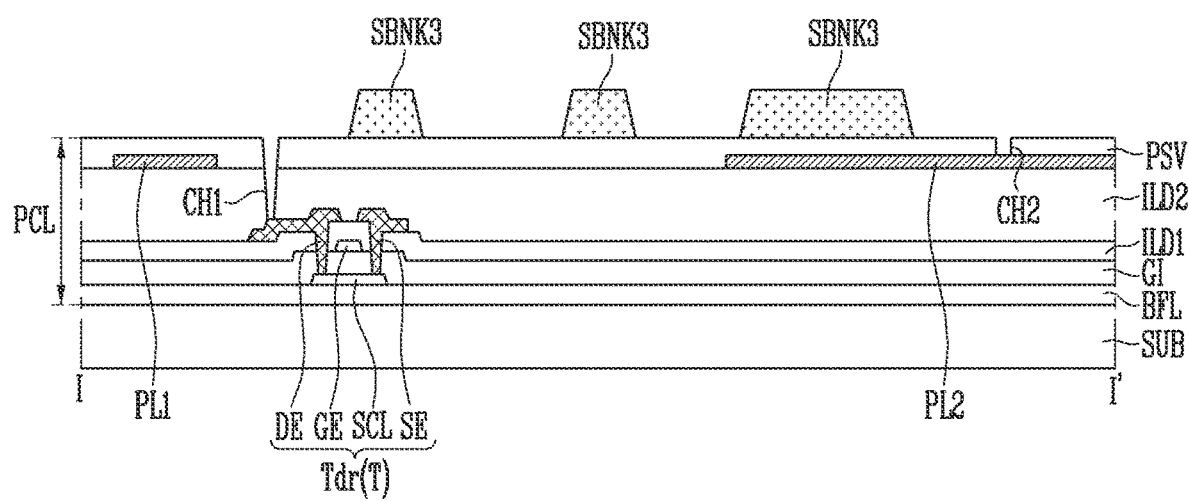
Figure 16C:
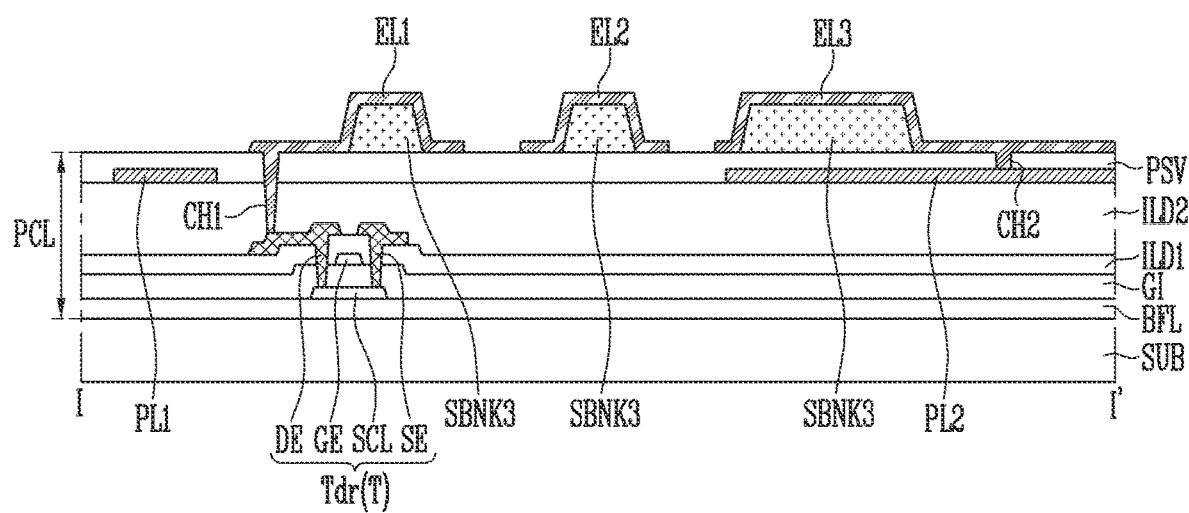
Figure 16D:
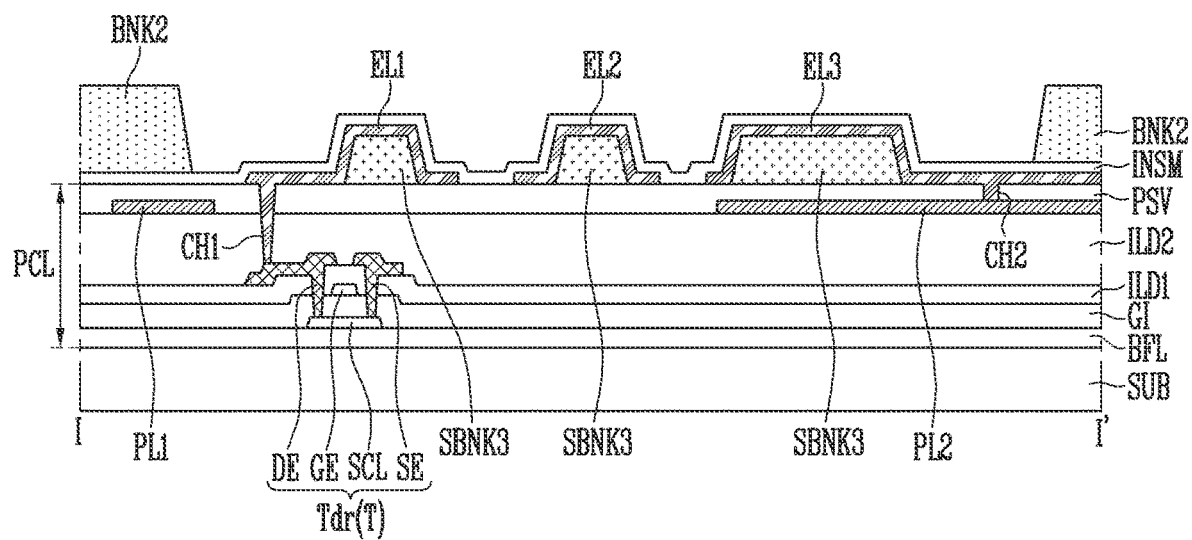
Figure 16E:
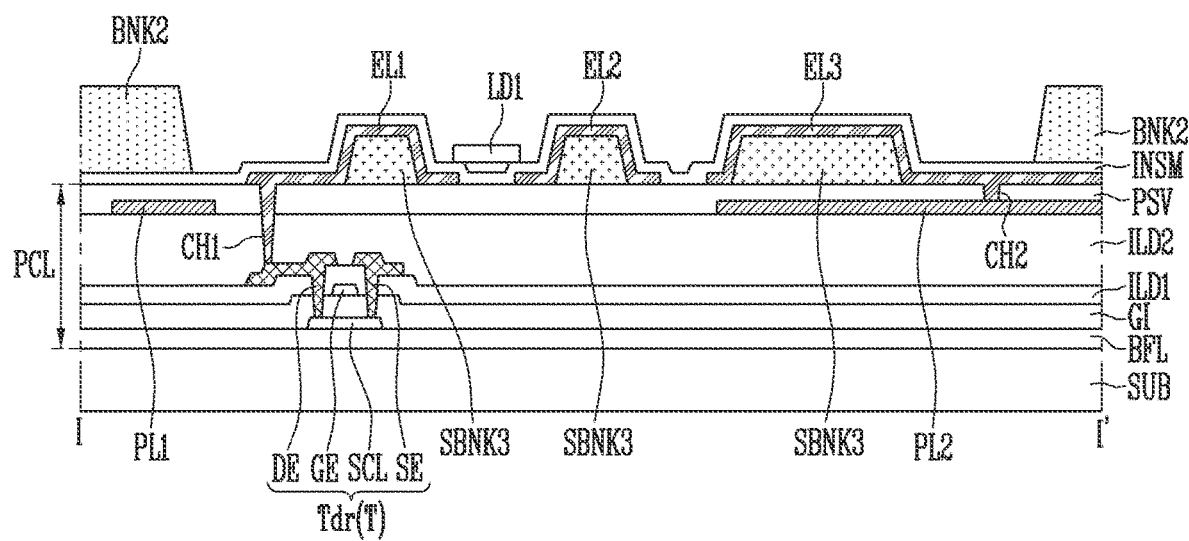
Figure 16F:
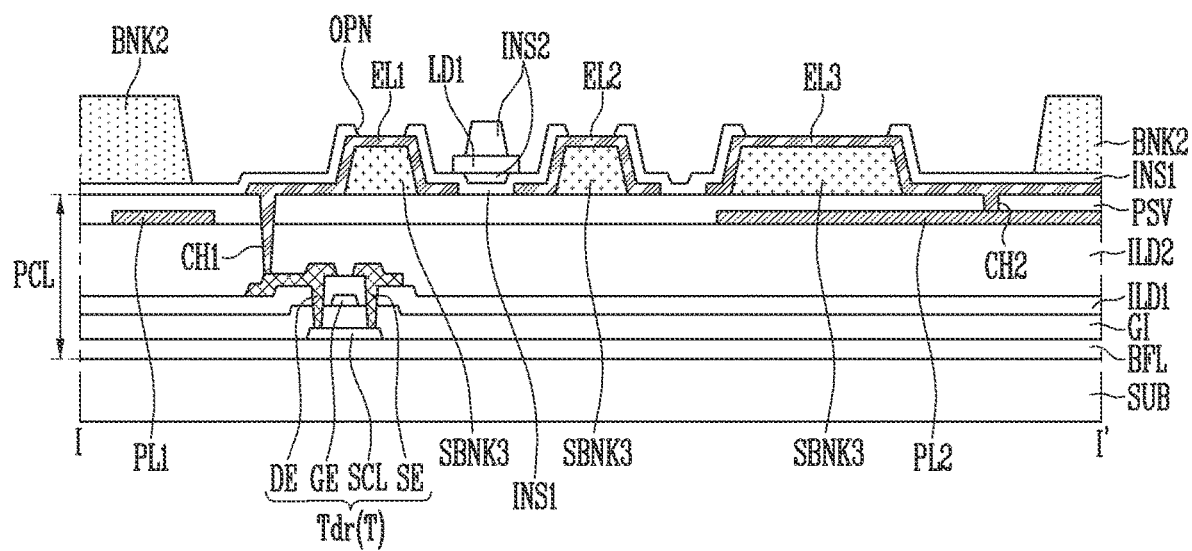
Figure 16G:
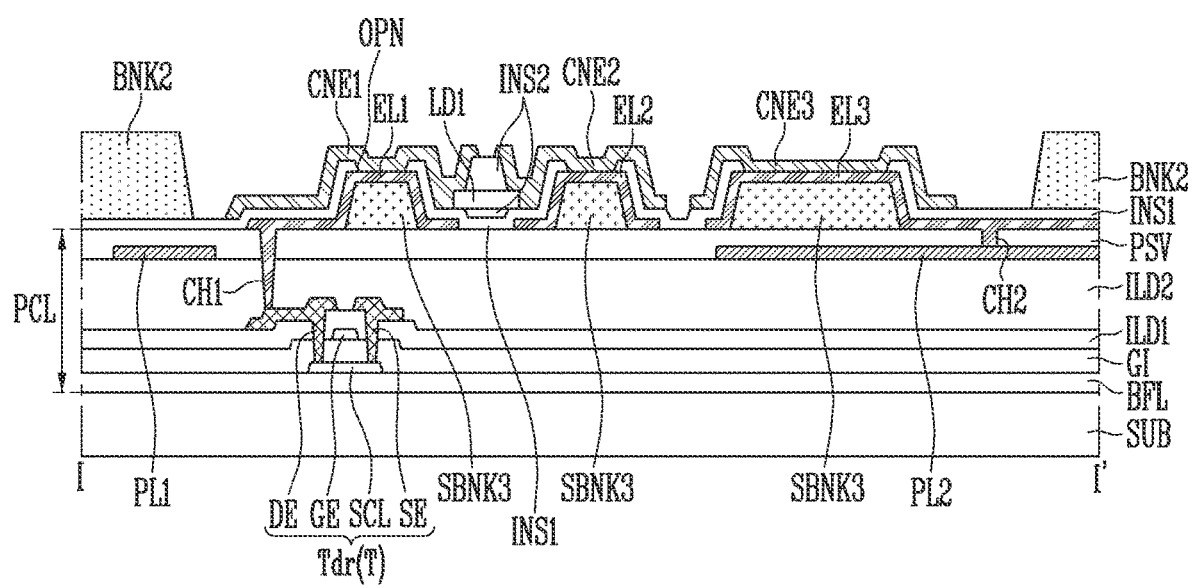
Figure 16H:
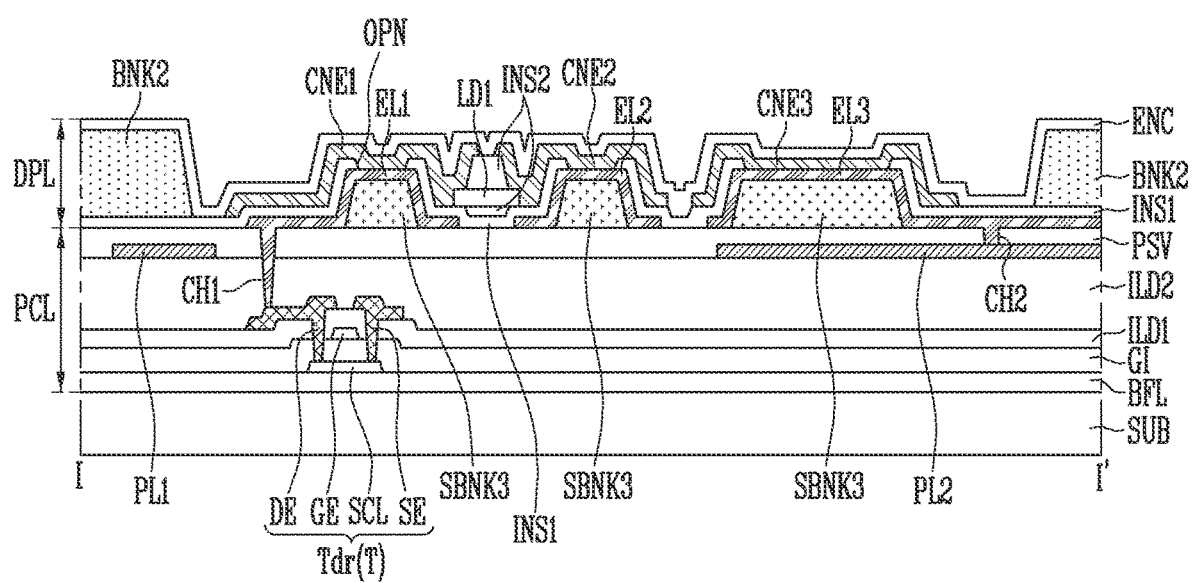

FIG. 8 is a plan view schematically illustrating one pixel from among the pixels shown in FIG. 5, FIG. 9A is a plan view illustrating only a first bank pattern and first to third electrodes of FIG. 8, FIG. 9B is a plan view in which first to third sub-bank patterns of FIG. 8 are implemented according to one or more embodiments, FIG. 10 is a cross-sectional view taken along the line I~I' of FIG. 8, FIG. 11 is a cross-sectional view taken along the line II~II' of FIG. 8. FIG. 12 is a cross-sectional view taken along the line III~III' of FIG. 8, FIG. 13 is a cross-sectional view taken along the line IV~IV' of FIG. 8, and FIG. 14 is a cross-sectional view corresponding to the line IV~IV' of FIG. 8 as implementation of a first bank pattern shown in FIG. 13 according to one or more embodiments.

The pixel shown in FIG. 8 may be any one of the pixels shown in FIGS. 6A to 6E, and 7A and 7B, respectively. For example, the pixel shown in FIG. 8 may be the pixel shown in FIG. 6A.

In FIG. 8, illustration of a transistor connected to the light emitting elements and some signal lines connected to the transistor is omitted for convenience.

FIGS. 8 to 14 simplify and show a structure of the one pixel PXL, such as showing each electrode as a single electrode and each insulating layer as a single insulating layer, but the present disclosure is not limited thereto.

Additionally, in one or more embodiments of the present disclosure, "formed and/or provided on the same layer" may refer to formed in the same process, and "formed and/or provided on different layers" may refer to formed in different processes.

In addition, in one or more embodiments of the present disclosure, "connection" between two configurations may mean that both an electrical connection and a physical connection are used inclusively.

In addition, in FIGS. 8 to 14, for convenience of description, a width direction (or a horizontal direction) is indicated as a first direction DR1, a height direction (or a vertical direction) is indicated as a second direction DR2, and a thickness direction of the substrate SUB is indicated as a third direction DR3. The first to third directions DR1, DR2, and DR3 may refer to directions indicated by the first to third directions DR1, DR2, and DR3, respectively.

Referring to FIGS. 1A to 5, 6A, and 8 to 14, the display device according to one or more embodiments of the present disclosure may include the substrate SUB, the line unit, and the plurality of pixels PXL.

The substrate SUB may include a transparent insulating material and may transmit light. The substrate SUB may be a rigid substrate or a flexible substrate.

For example, the rigid substrate may be one of a glass substrate, a quartz substrate, a glass ceramic substrate, and a crystalline glass substrate.

The flexible substrate may be one of a film substrate and a plastic substrate including a polymer organic material. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, a material configuring the substrate SUB may be variously changed, and may include fiber reinforced plastic (FRP) or the like. A material applied to the substrate SUB may have resistance (or heat resistance) to a high process temperature during a manufacturing process of the display device.

The substrate SUB may include the display area DA including at least one pixel area PXA in which the pixel PXL is disposed, and the non-display area NDA disposed around the display area DA.

The pixels PXL may be arranged, in the display area DA on the substrate SUB, in a matrix form and/or a stripe form according to a plurality of pixel rows extending in the first direction DR1, and a plurality of pixel columns extending in the second direction DR2 different from, for example, intersecting with the first direction DR1, but the present disclosure is not limited thereto. According to one or more embodiments, the pixels PXL may be provided in the display area DA on the substrate SUB in various arrangement forms.

The pixel area PXA in which each pixel PXL is disposed (or arranged) may include an emission area in which light is emitted and a peripheral area surrounding a periphery of the emission area. In one or more embodiments of the present disclosure, the peripheral area may include a non-emission area in which light is not emitted.

The line unit may include a plurality of signal lines that transmit a signal (or a voltage) to each pixel PXL. The signal lines may include, for example, the scan line Si that transmits the scan signal to each pixel PXL, the data line Dj that transmits the data signal to each pixel PXL, the emission control line Ei that transmits the emission control signal to each pixel PXL, and the power supply lines PL1 and PL2 that transmit voltages of the driving power supply to each pixel PXL.

Each pixel PXL may include a pixel circuit layer PCL provided on the substrate SUB and including the pixel circuit 144, and a display element layer DPL including the plurality of light emitting elements LD. The light emitting elements LD may be positioned in the emission area included in the pixel area PXA of each pixel PXL.

For convenience, the pixel circuit layer PCL is described first, and then the display element layer DPL is described.

The pixel circuit layer PCL may include a buffer layer BFL, the pixel circuit 144 provided on the buffer layer BFL, and a protective layer PSV provided on the pixel circuit 144.

The buffer layer BFL may prevent an impurity from diffusing into a transistor T included in the pixel circuit 144. The buffer layer BFL may include an inorganic insulating layer including an inorganic material. The buffer layer BFL may include at least one of inorganic materials such as silicon nitride (SiNx), silicon oxide (SiOx), silicon oxynitride (SiON), and aluminium oxide (AlOx). The buffer layer BFL may be provided as a single layer, but may be provided as multiple layers of at least double or more layers. When the buffer layer BFL is provided as the multiple layers, each layer may be formed of the same material or may be formed of different materials. The buffer layer BFL may be omitted according to a material, a process condition, and the like of the substrate SUB.

The pixel circuit 144 may include at least one transistor T and a storage capacitor Cst. The transistor T may include a driving transistor Tdr that controls a driving current of the light emitting elements LD and a switching transistor Tsw connected to the driving transistor Tdr. However, the present disclosure is not limited thereto, and the pixel circuit 144 may further include circuit elements performing another function in addition to the driving transistor Tdr and the switching transistor Tsw. In the following embodiment, the driving transistor Tdr and the switching transistor Tsw may collectively be referred to as a transistor T or transistors T. The driving transistor Tdr may have the same configuration as the first transistor T1 described with reference to FIGS. 6A to 7B, and the switching transistor Tsw may have the same configuration as the second transistor T2 described with reference to FIGS. 6A to 7B.

Each of the driving transistor Tdr and the switching transistor Tsw may include a transistor semiconductor pattern SCL, a gate electrode GE, a first terminal SE, and a second terminal DE. The first terminal SE may be any one of a source electrode and a drain electrode, and the second terminal DE may be the other of the source electrode and the drain electrode. For example, when the first terminal SE is the source electrode, the second terminal DE may be the drain electrode.

The transistor semiconductor pattern SCL may be provided and/or formed on the buffer layer BFL. The transistor semiconductor pattern SCL may include a first contact area contacting the first terminal SE and a second contact area contacting the second terminal DE. An area between the first contact area and the second contact area may be a channel area. The transistor semiconductor pattern SCL may be a semiconductor pattern formed of poly silicon, amorphous silicon, an oxide semiconductor, or the like. The channel area may be a semiconductor pattern that is not doped with an impurity, and may be an intrinsic semiconductor. The first contact area and the second contact area may be a semiconductor pattern doped with an impurity. A gate insulating layer GI may be disposed on the transistor semiconductor pattern SCL and the buffer layer BFL.

The gate electrode GE may be provided and/or formed on the transistor semiconductor pattern SCL with the gate insulating layer GI interposed therebetween. For example, the gate electrode GE may be provided on the gate insulating layer GI to overlap the channel area of the transistor semiconductor pattern SCL in the third direction DR3. The gate electrode GE may form a single layer with a material selected from a group consisting of copper (Cu), molybdenum (Mo), tungsten (W), aluminium neodymium (AlNd), titanium (Ti), aluminium (Al), silver (Ag), and an alloy thereof alone or in combination, or may be formed in a double layer or multiple layer structure of molybdenum (Mo), titanium (Ti), copper (Cu), aluminium (Al), or silver (Ag) which is a low-resistance material to reduce a line resistance.

The gate insulating layer GI may be an inorganic insulating layer including an inorganic material. For example, the gate insulating layer GI may include at least one of inorganic materials such as silicon nitride (SiNx), silicon oxide (SiOx), silicon oxynitride (SiON), and aluminium oxide (AlOx). However, a material of the gate insulating layer GI is not limited to the above-described embodiments. According to one or more embodiments, the gate insulating layer GI may be formed of an organic insulating layer including an organic material. The gate insulating layer GI may be provided as a single layer, but may also be provided as multiple layers of at least double or more layers.

A first interlayer insulating layer ILD1 may be disposed on the gate electrode GE and the gate insulating layer GI. The respective first terminal SE and the second terminal DE may contact the first contact area and the second contact area of the transistor semiconductor pattern SCL through a contact hole passing through the first interlayer insulating layer ILD1 and the gate insulating layer GI. For example, the first terminal SE may contact one of the first and second contact areas of the transistor semiconductor pattern SCL, and the second terminal DE may contact the other one of the first and second contact areas of the transistor semiconductor pattern SCL.

Each of the first and second terminals SE and DE may include the same material as the gate electrode GE, or may include one or more materials selected from a material exemplified as a configuration material of the gate electrode GE.

The first interlayer insulating layer ILD1 may be provided on the gate electrode GE, and may be an inorganic insulating layer including an inorganic material. For example, the first interlayer insulating layer ILD1 may include at least one of inorganic materials such as silicon oxide ($SiO_x$), silicon nitride ($SiN_x$), silicon oxynitride ($SiO_xN_y$), and aluminium oxide ($AlO_x$). The first interlayer insulating layer ILD1 may be formed of a single layer or multiple layers. According to one or more embodiments, the first interlayer insulating layer ILD1 may be an organic insulating layer including an organic material.

In the above-described embodiment, the first and second terminals SE and DE of each of the driving transistor Tdr and the switching transistor Tsw are described as separate electrodes electrically connected to the transistor semiconductor pattern SCL through the respective contact hole passing through the gate insulating layer GI and the first interlayer insulating layer ILD1, but the present disclosure is not limited thereto. According to one or more embodiments, the first terminal SE of each of the driving transistor Tdr and the switching transistor Tsw may be one of the first and second contact areas adjacent to the channel area of the corresponding transistor semiconductor pattern SCL, and the second terminal DE of each of the driving transistor Tdr and the switching transistor Tsw may be the other one of the first and second contact areas adjacent to the channel area of the corresponding transistor semiconductor pattern SCL. In this case, the second terminal DE of the driving transistor Tdr may be electrically connected to the light emitting elements LD of the corresponding pixel PXL through a separate connection means including a bridge electrode, a contact electrode, or the like.

In one or more embodiments, the first and second terminals SE and DE of each of the driving transistor Tdr and the switching transistor Tsw may be disposed on the first interlayer insulating layer ILD1. In one or more embodiments of the present disclosure, the transistors T included in the pixel circuit 144 may be configured of a low temperature poly silicon (LTPS) thin film transistor, but the present disclosure is not limited thereto, and may be configured of an oxide semiconductor thin film transistor according to one or more embodiments. In addition, a case where the transistors T are thin film transistors of a top gate structure is described as an example, but the present disclosure is not limited thereto. According to one or more embodiments, the transistors T may be thin film transistors of a bottom gate structure.

A second interlayer insulating layer ILD2 may be provided and/or formed on the transistors T (e.g., the first and second terminals SE and DE of the transistors T) and the first interlayer insulating layer ILD1. The second interlayer insulating layer ILD2 may cover the transistors T. The second interlayer insulating layer ILD2 may be an inorganic insulating layer including an inorganic material or an organic insulating layer including an organic material. According to one or more embodiments, the second interlayer insulating layer ILD2 may include the same material as the first interlayer insulating layer ILD1, but the present disclosure is not limited thereto. The second interlayer insulating layer ILD2 may be provided as a single layer, but may be provided as multiple layers of at least double or more layers. The second interlayer insulating layer ILD2 may include a first contact hole CH1 exposing a portion of the driving transistor Tdr.

The pixel circuit layer PCL may include the first and second power supply lines PL1 and PL2 provided and/or formed on the second interlayer insulating layer ILD2. The first and second power supply lines PL1 and PL2 may extend in the second direction DR2, and may be commonly provided to each pixel PXL and adjacent pixels PXL positioned in the same pixel column as the each pixel PXL. The first driving power supply VDD may be applied to the first power supply line PL1, and the second driving power supply VSS may be applied to the second power supply line PL2. In one or more embodiments of the present disclosure, the first power supply line PL1 may have the same configuration as the first power supply line PL1 described with reference to FIGS. 6A to 7B, and the second power supply line PL2 may have the same configuration as the second power supply line PL2 described with reference to FIGS. 6A to 7B.

The first power supply line PL1 may be electrically connected to a partial configuration of the display element layer DPL, for example, the first electrode EL1, and the second power supply line PL2 may be electrically connected to a partial configuration of the display element layer DPL, for example, the third electrode EL3. The first power supply line PL1 and the second power supply line PL2 may transmit an alignment signal (or an alignment voltage) to each of the first to third electrodes EL1 to EL3 to align the light emitting elements LD in the pixel area PXA of each pixel PXL. In addition, the first power supply line PL1 and the second power supply line PL2 may transmit a voltage of corresponding driving power supply to each pixel PXL to drive the light emitting elements LD after an alignment of the light emitting elements LD.

Each of the first and second power supply lines PL1 and PL2 may include a conductive material. For example, each of the first and second power supply lines PL1 and PL2 may form a single layer with a material selected from a group consisting of copper (Cu), molybdenum (Mo), tungsten (W), aluminium neodymium (AlNd), titanium (Ti), aluminium (Al), silver (Ag), and an alloy thereof alone or in combination, or may be formed in a double layer or multiple layer structure of molybdenum (Mo), copper (Cu), titanium (Ti), aluminium (Al), or silver (Ag) which is a low-resistance material to reduce a line resistance. For example, each of the first and second power supply lines PL1 and PL2 may be configured of double layers sequentially stacked in an order of titanium (Ti)/copper (Cu).

In the above-described embodiment, it has been described that the first and second power supply lines PL1 and PL2 are provided on the second interlayer insulating layer ILD2, but the present disclosure is not limited thereto. According to one or more embodiments, the first and second power supply lines PL1 and PL2 may be provided and/or formed on any one of insulating layers provided on the substrate SUB, for example, the first interlayer insulating layer ILD1. In addition, in the above-described embodiment, it has been described that the first and second power supply lines PL1 and PL2 are provided on the same layer, but the present disclosure is not limited thereto. According to one or more embodiments, the first and second power supply lines PL1 and PL2 may be provided on different layers.

The protective layer PSV may be provided and/or formed on the first and second power supply lines PL1 and PL2 and the second interlayer insulating layer ILD2.

The protective layer PSV may be provided in a form including an organic insulating layer, an inorganic insulating layer, or an organic insulating layer disposed on the inorganic insulating layer. For example, the inorganic insulating layer may include at least one of inorganic materials such as silicon oxide ($SiO_x$), silicon nitride ($SiN_x$), silicon oxynitride ($SiO_xN_y$), and aluminium oxide ($AlO_x$). The organic insulating layer may include at least one of an acrylic resin (polyacrylates resin), an epoxy resin, a phenolic resin, a polyamide resin, a polyimides resin, an unsaturated polyesters resin, a poly-phenylene ethers resin, a poly-phenylene sulfides resin, and a benzocyclobutene resin.

The protective layer PSV may include a first contact hole CH1 corresponding to the first contact hole CH1 of the second interlayer insulating layer ILD2 and a second contact hole CH2 exposing an area of the second power supply line PL2.

The display element layer DPL may be provided on the protective layer PSV.

The display element layer DPL may include the first and second bank patterns BNK1 and BNK2, the first to third electrodes EL1 to EL3, the light emitting elements LD, and the contact electrode CNE.

The first bank pattern BNK1 may be positioned in the emission area in which light is emitted from the pixel area PXA of each of the pixels PXL. The first bank pattern BNK1 may be a support member supporting each of the first to third electrodes EL1 to EL3 in order to change a surface profile (or shape) of each of the first to third electrodes EL1 to EL3, in the third direction DR3, to guide the light emitted from the light emitting elements LD in an image display direction (e.g., the third direction DR3) of the display device. That is, the first bank pattern BNK1 may change the surface profile (or shape) of each of the first to third electrodes EL1 to EL3 in the third direction DR3.

The first bank pattern BNK1 may be provided and/or formed between the protective layer PSV and a corresponding electrode in the emission area of the corresponding pixel PXL. For example, the first bank pattern BNK1 may be provided and/or formed between the protective layer PSV and the first electrode EL1, between the protective layer PSV and the second electrode EL2, and between the protective layer PSV and the third electrode EL3, respectively.

The first bank pattern BNK1 may be an inorganic insulating layer including an inorganic material or an organic insulating layer including an organic material. According to one or more embodiments, the first bank pattern BNK1 may include a single layer of organic insulating layer and/or a single layer of inorganic insulating layer, but the present disclosure is not limited thereto. According to one or more embodiments, the first bank pattern BNK1 may be provided in a form of multiple layers in which at least one organic insulating layer and at least one inorganic insulating layer are stacked. However, a material of the first bank pattern BNK1 is not limited to the above-described embodiments, and according to one or more embodiments, the first bank pattern BNK1 may include a conductive material.

In one or more embodiments of the present disclosure, the first bank pattern BNK1 may include at least two or more sub-bank patterns arranged along the second direction DR2. For example, the first bank pattern BNK1 may include first to third sub-bank patterns SBNK1 to SBNK3 arranged along the second direction DR2. The first to third sub-bank patterns SBNK1 to SBNK3 may be positioned in the same column. The first to third sub-bank patterns SBNK1 to SBNK3 may have a bar shape extending along the second direction DR2, but the present disclosure is not limited thereto, and a shape of the first to third sub-bank patterns SBNK1 to SBNK3 may be variously changed.

When viewed in a plan view, the first sub-bank pattern SBNK1, the second sub-bank pattern SBNK2, and the third sub-bank pattern SBNK3 may be sequentially arranged along the second direction DR2. The first sub-bank pattern SBNK1 and the second sub-bank pattern SBNK2 may be spaced from each other with a constant distance d1 therebetween, and the second sub-bank pattern SBNK2 and the third sub-bank pattern SBNK3 may be spaced from each other with a constant distance d1 therebetween. In one or more embodiments of the present disclosure, the second sub-bank pattern SBNK2 and the third sub-bank pattern SBNK3 adjacent in the second direction DR2 may be spaced from each other with a distance d1 equal to or greater than the length L of each light emitting element LD. For example, the second sub-bank pattern SBNK2 and the third sub-bank pattern SBNK3 may be spaced from each other with a distance d1 of about 5.5 μm to 9 μm, but the present disclosure is not limited thereto. The first sub-bank pattern SBNK1 and the second sub-bank pattern SBNK2 may also be spaced from each other with the distance d1 therebetween.

The distance d1 between the first sub-bank pattern SBNK1 and the second sub-bank pattern SBNK2 and between the distance between the second sub-bank pattern SBNK2 and the third sub-bank pattern SBNK3 may be the same along the second direction DR2. However, the present disclosure is not limited thereto, and according to one or more embodiments, the distance d1 between the first sub-bank pattern SBNK1 and the second sub-bank pattern SBNK2 and the distance d1 between the second sub-bank pattern SBNK2 and the third sub-bank patterns SBNK3 may be different from each other.

The first to third sub-bank patterns SBNK1 to SBNK3 may be designed to have the same size (or area) as each other in order to have a uniform light output distribution for each area within the pixel area PXA of each pixel PXL. For example, the first to third sub-bank patterns SBNK1 to SBNK3 positioned in the same column in the second direction DR2 may have the same length when viewed in a plan view. However, the present disclosure is not limited thereto, and according to one or more embodiments, the first to third sub-bank patterns SBNK1 to SBNK3 may be designed to have sizes (or areas) different from each other. For example, when a solution (or a fluid solvent) in which the light emitting elements LD are mixed is input to the pixel area PXA of each pixel PXL by an inkjet printing method, when a relatively large amount of solution is dripped onto a specific area, the size (or area) of a sub-bank pattern positioned in the specific area may be designed to be less than that of a sub-bank pattern positioned in another area. For example, the second sub-bank pattern SBNK2 positioned at a center in the same column may have a size (or area) less than that of each of the first and third sub-bank patterns SBNK1 and SBNK3 positioned above and below in the same column. Specifically, a length d5 of the second sub-bank pattern SBNK2 in the second direction DR2 may be designed to be shorter than a length d4 of the first sub-bank pattern SBNK1 in the second direction DR2 as shown in FIG. 9B. In addition, the length d5 of the second sub-bank pattern SBNK2 in the second direction DR2 may be designed to be shorter than a length d6 of the third sub-bank pattern SBNK3 in the second direction DR2. At this time, the length d4 of the first sub-bank pattern SBNK1 in the second direction DR2 and the length d6 of the third sub-bank pattern SBNK3 in the second direction DR2 may be equal to each other or may be different from each other. However, the present disclosure is not limited to the above-described embodiments, and according to one or more embodiments, the length d5 of the second sub-bank pattern SBNK2 in the second direction DR2 may be greater than the length d4 of the first sub-bank pattern SBNK1 in the second direction DR2 and greater than the length d5 of the third sub-bank pattern SBNK3 in the second direction DR2.

Each of the first to third sub-bank patterns SBNK1 to SBNK3 may have a cross-section of a trapezoidal shape that becomes narrower from one surface (or an upper surface) of the protective layer PSV toward an upper portion along the third direction DR3, but the present disclosure is not limited thereto. According to one or more embodiments, as shown in FIG. 14, the first to third sub-bank patterns SBNK1 to SBNK3 may include a curved surface having a cross-section of a semi-ellipse shape, a semi-circle shape (or a hemisphere shape), or the like in which a width becomes narrower from one surface (or the upper surface) of the protective layer PSV toward the upper portion along the third direction DR3. When viewed in a cross-section, a shape of each of the first to third sub-bank patterns SBNK1 to SBNK3 is not limited to the above-described embodiments and may be variously changed within a range capable of improving efficiency of the light emitted from each of the light emitting elements LD. The first to third sub-bank patterns SBNK1 to SBNK3 may be disposed on the same plane on the protective layer PSV, and may have the same height (or thickness).

The second bank pattern BNK2 may surround at least one side of a peripheral area of the pixel area PXA of each pixel PXL. The peripheral area may include the non-emission area from which light is not emitted.

The second bank pattern BNK2 may be a structure defining (or partitioning) the pixel area (or the emission area) of each pixel PXL and each pixel PXL adjacent thereto, and may be, for example, a pixel defining layer. The second bank pattern BNK2 may be configured to include at least one light blocking material and/or reflective material to prevent a light leakage defect in which light (or rays) leaks between each pixel PXL and the pixels PXL adjacent thereto. According to one or more embodiments, the second bank pattern BNK2 may include a transparent material (or substance). The transparent material may include, for example, polyamides resin, polyimides rein, and the like, but the present disclosure is not limited thereto. According to one or more embodiments, a reflective material layer may be formed on the second bank pattern BNK2 to further improve efficiency of the light emitted from each pixel PXL.

The second bank pattern BNK2 may be formed and/or provided on a layer different from that of the first to third sub-bank patterns SBNK1 to SBNK3, but the present disclosure is not limited thereto, and according to one or more embodiments, the second bank pattern BNK2 may be formed and/or provided on the same layer as the first to third sub-bank patterns SBNK1 to SBNK3. In one or more embodiments of the present disclosure, the second bank pattern BNK2 may be formed on a layer different from that of the first to third sub-bank patterns SBNK1 to SBNK3, and may be positioned on the first insulating layer INS1.

Each of the first to third electrodes EL1 to EL3 may be provided in the pixel area PXA of each pixel PXL, and may extend in one direction, for example, the second direction DR2. The first to third electrodes EL1 to EL3 may be provided on the same surface and may be disposed to be spaced from each other.

The first electrode EL1, the second electrode EL2, and the third electrode EL3 may be sequentially arranged along the first direction DR1. The first electrode EL1 and the second electrode EL2 may be spaced from each other with a constant distance therebetween along the first direction DR1, and the second electrode EL2 and the third electrode EL3 may be spaced from each other with a constant distance therebetween along the first direction DR1. In the pixel area PXA of each pixel PXL, the same distance may be between the first electrode EL1 and the second electrode EL2 and between the second electrode EL2 and the third electrode EL3. However, the present disclosure is not limited thereto, and according to one or more embodiments, different distances may be between the first electrode EL1 and the second electrode EL2 and between the second electrode EL2 and the third electrode EL3.

Each of the first to third electrodes EL1 to EL3 may be formed of a material having a constant reflectance. The conductive material may include an opaque metal suitable for reflecting the light emitted from the light emitting elements LD in the image display direction of the display device. The opaque metal may include, for example, silver (Ag), magnesium (Mg), aluminium (Al), platinum (Pt), palladium (Pd), gold (Au), nickel (Ni), neodymium (Nd), iridium (Ir), chromium (Cr), titanium (Ti), and a metal such as an alloy thereof. According to one or more embodiments, each of the first to third electrodes EL1 to EL3 may include a transparent conductive material (or substance). The transparent conductive material may include a conductive oxide such as indium tin oxide (ITO), indium zinc oxide (IZO), zinc oxide (ZnO), and indium tin zinc oxide (ITZO), a conductive polymer such as PEDOT, and the like. When each of the first to third electrodes EL1 to EL3 includes a transparent conductive material, a separate conductive layer formed of an opaque metal for reflecting the light emitted from the light emitting elements LD in the image display direction of the display device may be additionally included. However, a material of each of the first to third electrodes EL1 to EL3 is not limited to the above-described materials.

In addition, each of the first to third electrodes EL1 to EL3 may be provided and/or formed as a single layer, but the present disclosure is not limited thereto. According to one or more embodiments, each of the first to third electrodes EL1 to EL3 may be provided and/or formed as multiple layers in which at least two or more material among metals, alloys, conductive oxides, and conductive polymers are stacked. Each of the first to third electrodes EL1 to EL3 may be formed of multiple layers of at least double or more layers in order to reduce or minimize distortion due to a signal delay when transmitting a signal (or a voltage) to the both ends of each of the light emitting elements LD. For example, each of the first to third electrodes EL1 to EL3 may be formed of multiple layers sequentially stacked in an order of indium tin oxide (ITO)/silver (Ag)/indium tin oxide (ITO).

In one or more embodiments of the present disclosure, each of the first to third electrodes EL1 to EL3 may be divided into a first area A and a second area B except for the first area A corresponding to between the first sub-bank pattern SBNK1 and the second sub-bank pattern SBNK2 and between the second sub-bank pattern SBNK2 and the third sub-bank pattern SBNK3, respectively. The first area A of each of the first to third electrodes EL1 to EL3 may be an area that does not overlap the first to third sub-bank patterns SBNK1 to SBNK3, and the second area B of each of the first to third electrodes EL1 to EL3 may include an area overlapping the first to third sub-bank patterns SBNK1 to SBNK3.

The first area A of each of the first to third electrodes EL1 to EL3 may be positioned on one surface (or an upper surface) of the protective layer PSV positioned in an area between the first to third sub-bank patterns SBNK1 to SBNK3 and may not overlap the first to third sub-bank patterns SBNK1 to SBNK3. The first area A of each of the first to third electrodes EL1 to EL3 may have a flat surface profile (or shape) corresponding to the one surface (or the upper surface) of the protective layer PSV in the third direction DR3 as shown in FIG. 12.

The first area A of each of the first to third electrodes EL1 to EL3 may have at least two or more widths W1 in the first direction DR1 along an extension direction of a corresponding electrode. For example, the first area A of the first electrode EL1 may have at least two or more widths W1 in the first direction DR1 along an extension direction of the first electrode EL1, for example, the second direction DR2. The first area A of the second electrode EL2 may have at least two or more widths W1 in the first direction DR1 along an extension direction of the second electrode EL2. The first area A of the third electrode EL3 may have at least two or more widths W1 in the first direction DR1 along an extension direction of the third electrode EL3.

The first area A of the first electrode EL1, the first area A of the second electrode EL2, and the first area A of the third electrode EL3 may have the same size and shape, but, the present disclosure is not limited thereto. According to one or more embodiments, the first area A of the first electrode EL1, the first area A of the second electrode EL2, and the first area A of the third electrode EL3 may have different sizes and shapes.

The width of the first area A of each of the first to third electrodes EL1 to EL3 may be narrower in the first direction DR1 than a second area B of a corresponding electrode when viewed in a plan view. For example, the first area A of each of the first to third electrodes EL1 to EL3 may have different widths in the first direction DR1 along an extension direction of a corresponding electrode or may include concave portions CP1 and CP2 concave (or recessed) so that the width is narrowed.

When viewed in a plan view, the concave portions CP1 and CP2 may include a first concave portion CP1 concave to be adjacent to a second virtual line VL2 along the first direction DR1 from a first virtual line VL1 and a second concave portion CP2 concave to be adjacent to the first virtual line VL1 along the first direction DR1 from the second virtual line VL2. Here, the first virtual line VL1 may be a line positioned on the same line as one long side of the second area B of each of the first to third electrodes EL1 to EL3 when viewed in a plan view, and the second virtual line VL2 may be a line positioned on the same line as another long side of the second area B of each of the first to third electrodes EL1 to EL3. When viewed in a plan view, the first concave portion CP1 may be concave from one long side of a corresponding electrode inward along the first direction DR1 (or toward another long side of the corresponding electrode), and the second concave portion CP2 may be concave from the other long side of the corresponding electrode inward along the first direction DR1 (or toward one long side of the corresponding electrode).

The concave portions CP1 and CP2 of each of the first to third electrodes EL1 to EL3 may face the concave portions CP1 and CP2 of an electrode adjacent in the first direction DR1 when viewed in a plan view. For example, the second concave portion CP2 of the first electrode EL1 may face the first concave portion CP1 of the second electrode EL2, and the second concave portion CP2 of the second electrode EL2 may face the first concave portion CP1 of the third electrode EL3. In one or more embodiments, the first concave portion CP1 of the first electrode EL1 may face the second concave portion CP2 of the third electrode EL3 provided in the pixel PXL adjacent to the corresponding pixel PXL in the first direction DR1.

The concave portions CP1 and CP2 may be provided in a standard shape or may be provided in a shape including a non-square (or irregular) boundary. For example, when viewed in a plan view, the first concave portion CP1 may have a semi-ellipse shape in which a width in the second direction DR2 is narrowed from the first virtual line VL1 toward the other long side of the corresponding electrode along the first direction DR1 (or toward in an inside direction). In a plan view, the second concave portion CP2 may have a semi-ellipse shape in which a width in the second direction DR2 is narrowed from the second virtual line VL2 toward one long side of the corresponding electrode along the first direction DR1 (or toward in an inside direction).

The first area A of each of the first to third electrodes EL1 to EL3 including the concave portions CP1 and CP2 may have a non-uniform width W1 along the second direction DR2. Specifically, the first area A of each of the first to third electrodes EL1 to EL3 including the concave portions CP1 and CP2 may have at least two or more widths W1 in the first direction DR1.

The second area B of each of the first to third electrodes EL1 to EL3 may be provided and/or formed on the first to third sub-bank patterns SBNK1 to SBNK3 and may have a surface profile corresponding to a shape of the first to third sub-bank patterns SBNK1 to SBNK3 in the third direction DR3. For example, the second area B of each of the first to third electrodes EL1 to EL3 may include a protrusion portion corresponding to the first to third sub-bank patterns SBNK1 to SBNK3 in the third direction DR3, and a flat portion corresponding to the protective layer PSV.

The second area B of each of the first to third electrodes EL1 to EL3 may have a constant width W2 in the first direction DR1 along an extension direction of a corresponding electrode. For example, the second area B of the first electrode EL1 may have a constant width W2 in the first direction DR1 along the extension direction (or the second direction DR2) of the first electrode EL1. The second area B of the second electrode EL2 may have a constant width W2 in the first direction DR1 along the extension direction (or the second direction DR2) of the second electrode EL2. The second area B of the third electrode EL3 may have a constant width W2 in the first direction DR1 along the extension direction (or the second direction DR2) of the third electrode EL3. The width W1 of the first area A of each of the first to third electrodes EL1 to EL3 in the first direction DR1 may be less than the width W2 in the first direction DR1 of the second area B of the corresponding electrode. In addition, the first area A of each of the first to third electrodes EL1 to EL3 may have a width W1 equal to the width W2 of the second area B of the corresponding electrode in the first direction DR1.

When viewed in a plan view, each of the first to third electrodes EL1 to EL3 including the first area A and the second area B may have a non-uniform width in the first direction DR1 along the extension direction. For example, each of the first to third electrodes EL1 to EL3 may have at least two or more widths in the first direction DR1 along the extension direction. In this case, an area between two adjacent electrodes from among the first to third electrodes EL1 to EL3 (for example, an area in which the light emitting elements LD are aligned) may have at least two or more widths in the first direction DR1 along the extension direction of each of the first to third electrodes EL1 to EL3.

A distance d3 in the first direction DR1 between the first area A of the first electrode EL1 and the first area A of the second electrode EL2 may be greater than a distance d2 in the first direction DR1 between the second area B of the first electrode EL1 and the second area B of the second electrode EL2. In addition, a distance d3 in the first direction DR1 between the first area A of the second electrode EL2 and the first area A of the third electrode EL3 may be greater than a distance d2 in the first direction DR1 between the second area B of the second electrode EL2 and the second area B of the third electrode EL3.

The first to third sub-bank patterns SBNK1 to SBNK3 and the first to third electrodes EL1 to EL3 may function as a reflective member that causes the light emitted from the light emitting elements LD to proceed in the image display direction of the display device to improve light output efficiency of the light emitting elements LD.

Before aligning the light emitting elements LD in the pixel area PXA of each pixel PXL, the first electrode EL1 may receive an alignment signal (e.g., a predetermined alignment signal or alignment voltage) from the first power supply line PL1 to function as a first alignment electrode (or a first alignment line). After aligning the light emitting elements LD in the pixel area PXA, the first electrode EL1 may be electrically connected to the driving transistor Tdr through the first contact hole CH1 (penetrating the protective layer PSV, the second interlayer insulating layer ILD2, the first interlayer insulating layer ILD1, and the gate insulating layer GI) and may receive a suitable signal (e.g., a predetermined signal or a predetermined voltage) from the driving transistor Tdr to function as a driving electrode driving the light emitting elements LD.

Before aligning the light emitting elements LD in the pixel area PXA of each pixel PXL, the second electrode EL2 may receive an alignment signal (e.g., a predetermined alignment signal or alignment voltage) from the first power supply line PL1 or receive an alignment signal (e.g., a predetermined alignment signal or alignment voltage) from a power supply line different from the first and second power supply lines PL1 and PL2 to function as a second alignment electrode (or a second alignment line). After aligning the light emitting elements LD in the pixel area PXA, the second electrode EL2 may function as a reflective member that reflects the light emitted from each of the light emitting elements LD in the image display direction of the display device and may be a path of a driving current input from the light emitting elements LD disposed between the first electrode EL1 and the second electrode EL2.

Before aligning the light emitting elements LD in the pixel area PXA of each pixel PXL, the third electrode EL3 may be electrically connected to the second power supply line PL2 through the second contact hole CH2 (penetrating the protective layer PSV) and receive an alignment signal (e.g., a predetermined alignment signal or alignment voltage) from the second power supply line PL2 to function as a third alignment electrode (or a third alignment line). After aligning the light emitting elements LD in the pixel area PXA, the third electrode EL3 may be connected to the second driving power supply VSS through the second power supply line PL2 to function as a driving electrode driving the light emitting elements LD.

The alignment signals (or alignment voltages) transmitted to each of the above-described first to third electrodes EL1 to EL3 may be an AC signal having a voltage difference and/or a phase difference of a degree at which the light emitting elements LD may be aligned between the first to third electrodes EL1 to EL3, but the present disclosure is not limited thereto.

When a corresponding alignment signal (or alignment voltage) is applied to each of the first to third electrodes EL1 to EL3, an electric field may be formed between the first electrode EL1 and the second electrode EL2 and between the second electrode EL2 and the third electrode EL3, respectively. The light emitting elements LD may be aligned and/or provided in the pixel area PXA of each pixel PXL by the electric field formed between two adjacent electrodes.

In one or more embodiments of the present disclosure, in a step of aligning the light emitting elements LD in the pixel area PXA of each pixel PXL, the light emitting elements LD supplied to the pixel area PXA may be controlled to be aligned to be relatively biased by controlling the alignment signal (or the alignment voltage) applied to each of the first to third electrodes EL1 to EL3 or forming a magnetic field.

In one or more embodiments of the present disclosure, one of the first electrode EL1 and the third electrode EL3 may be an anode electrode, and the other one may be a cathode electrode. For example, the first electrode EL1 may be an anode electrode, and the third electrode EL3 may be a cathode electrode.

After the light emitting elements LD are aligned in the pixel area PXA of each pixel PXL, a portion of the first electrode EL1 and a portion of the second electrode EL2 positioned between the adjacent pixels PXL may be removed to drive each pixel PXL individually (or independently).

Each of the light emitting elements LD may be an ultra-small light emitting element, for example, having a size as small as a nano scale to a micro scale, using an inorganic crystal structure material. For example, each of the light emitting elements LD may be an ultra-small light emitting element manufactured by an etching method or an ultra-small light emitting element manufactured by a growth method.

At least two to tens of light emitting elements LD may be aligned and/or provided in the pixel area PXA of each pixel PXL, but the number of light emitting elements LD is not limited thereto. According to one or more embodiments, the number of light emitting elements LD aligned and/or provided in the pixel area PXA may be variously changed.

Each of the light emitting elements LD may be disposed between two electrodes adjacent to each other in the first direction DR1. The light emitting elements LD may include first light emitting elements LD1 disposed between the first electrode EL1 and the second electrode EL2 and second light emitting elements LD2 disposed between the second electrode EL2 and the third electrode EL3. In the following embodiment, when one of the first and second light emitting elements LD1 and LD2 is arbitrarily named or when the first and second light emitting elements LD1 and LD2 are collectively named, the one of the first and second light emitting elements LD1 and LD2 or the first and second light emitting elements LD1 and LD2 is referred to as the light emitting elements LD.

In one or more embodiments of the present disclosure, each of the light emitting elements LD may emit any one of color light and/or white light. Each of the light emitting elements LD may be aligned between two adjacent electrodes so that the extension direction (or the length L direction of each light emitting element LD) is parallel to the first direction DR1. The light emitting elements LD may be provided in a form in which the light emitting elements LD are dispersed in a solution and may be input to the pixel area PXA of each pixel PXL.

In one or more embodiments of the present disclosure, the light emitting elements LD may be input to the pixel area PXA of each pixel PXL through an inkjet printing method, a slit coating method, or other various methods. For example, the light emitting elements LD may be mixed with a volatile solvent and may be supplied to the pixel area PXA through an inkjet printing method or a slit coating method. At this time, when the alignment signal corresponding to each of the first to third electrodes EL1, EL2, and EL3 provided to the pixel area PXA is applied, an electric field may be formed between two adjacent electrodes from among the first to third electrodes EL1, EL2, and EL3. Accordingly, the light emitting elements LD may be aligned between the first electrode EL1 and the second electrode EL2 and between the second electrode EL2 and the third electrode EL3, respectively.

After the light emitting elements LD are aligned, the solvent may be evaporated or removed in another method, and thus the light emitting elements LD may be finally aligned and/or provided in the pixel area PXA of each pixel PXL.

The above-described light emitting elements LD may be provided and/or formed on the first insulating layer INS1.

The first insulating layer INS1 may be formed and/or provided under each of the light emitting elements LD aligned between two electrodes in the pixel area PXA of each pixel PXL. The first insulating layer INS1 may fill a space between each of the light emitting elements LD and the protective layer PSV to stably support the light emitting elements LD, and prevent the light emitting elements LD from being separated from the protective layer PSV.

The first insulating layer INS1 may include an inorganic insulating layer formed of an inorganic material or an organic insulating layer formed of an organic material. In one or more embodiments of the present disclosure, the first insulating layer INS1 may be formed of an inorganic insulating layer suitable for protecting the light emitting elements LD from the pixel circuit layer PCL of each pixel PXL, but the present disclosure is not limited thereto. According to one or more embodiments, the first insulating layer INS1 may be formed of an organic insulating layer suitable for planarizing a support surface of the light emitting elements LD.

In one or more embodiments, the first insulating layer INS1 may cover the first to third electrodes EL1 to EL3. In addition, the first insulating layer INS1 may include an opening OPN exposing one area of each of the first to third electrodes EL1 to EL3 and cover a remaining area except for the one area. Here, the contact electrode CNE may be provided and/or formed on one area of each of the first to third electrodes EL1 to EL3 exposed by the opening OPN of the first insulating layer INS1.

The second insulating layer INS2 may be provided and/or formed on each of the light emitting elements LD. The second insulating layer INS2 may be provided and/or formed on each of the light emitting elements LD to cover a portion of an upper surface of each of the light emitting elements LD and expose the both ends of each of the light emitting elements LD to the outside. The second insulating layer INS2 may be formed as an independent insulating pattern in the pixel area PXA of each pixel PXL, but the present disclosure is not limited thereto.

The second insulating layer INS2 may be configured as a single layer or multiple layers, and may include an inorganic insulating layer including at least one inorganic material or an organic insulating layer including at least one organic material. The second insulating layer INS2 may further fix each of the light emitting elements LD aligned in the pixel area PXA. The second insulating layer INS2 may include an inorganic insulating layer suitable for protecting the active layer 12 of each of the light emitting elements LD from external oxygen, moisture, and the like. However, the present disclosure is not limited thereto. The second insulating layer INS2 may be formed of an organic insulating layer including an organic material according to a design condition or the like of a display device to which the light emitting elements LD are applied.

In one or more embodiments of the present disclosure, the light emitting elements LD may be prevented from being deviated from an aligned position, by forming the second insulating layer INS2 on the light emitting elements LD after the alignment of the light emitting elements LD in the pixel area PXA is completed. When a gap (or a space) exists between the first insulating layer INS1 and the light emitting elements LD before formation of the second insulating layer INS2, the gap may be filled with the second insulating layer INS2 during a process of forming the second insulating layer INS2. Accordingly, the second insulating layer INS2 may be formed of an organic insulating layer suitable for filling the gap between the first insulating layer INS1 and the light emitting elements LD.

In one or more embodiments of the present disclosure, the second insulating layer INS2 may be formed on each of the light emitting elements LD, and thus the active layer 12 of each of the light emitting elements LD may not come into contact with an external conductive material. The second insulating layer INS2 may cover only a portion of a surface of each of the light emitting elements LD and may expose the both ends of each of the light emitting elements LD to the outside.

The contact electrode CNE may be disposed on each of the first to third electrodes EL1 to EL3. The contact electrode CNE may be a configuration for further electrically stably connecting the respective first to third electrodes EL1 to EL3 and the light emitting elements LD corresponding thereto.

The contact electrode CNE may include a first contact electrode CNE1 disposed on the first electrode EL1, a second contact electrode CNE2 disposed on the second electrode EL2, and a third contact electrode CNE3 disposed on the third electrode EL3. The first to third contact electrodes CNE1 to CNE3 may be formed of various transparent conductive materials. For example, the first to third contact electrodes CNE1 to CNE3 may include at least one of various transparent conductive materials including indium tin oxide (ITO), indium zinc oxide (IZO), zinc oxide (ZnO), and indium tin zinc oxide (ITZO), and may be configured to be substantially transparent or translucent to satisfy a desired transmittance (e.g., a predetermined transmittance). However, a material of the first to third contact electrodes CNE1 to CNE3 is not limited to the above-described embodiments, and according to one or more embodiments, the first to third contact electrodes CNE1 to CNE3 may be formed of various opaque conductive materials.

The first contact electrode CNE1, the second contact electrode CNE2, and the third contact electrode CNE3 may be disposed to be spaced from each other on the same plane. The first contact electrode CNE1, the second contact electrode CNE2, and the third contact electrode CNE3 may be provided on (or at) the same layer and may include the same material. However, the present disclosure is not limited thereto, and according to one or more embodiments, the first contact electrode CNE1, the second contact electrode CNE2, and the third contact electrode CNE3 may be provided on different layers and may include different materials.

In one or more embodiments of the present disclosure, the first contact electrode CNE1 may be provided on the first insulating layer INS1 and the first electrode EL1 to overlap the first electrode EL1. The first contact electrode CNE1 may be directly disposed on one area of the first electrode EL1 exposed by an opening OPN of the first insulating layer INS1 to be connected to the first electrode EL1. According to one or more embodiments, when a capping layer is disposed on the first electrode EL1 exposed by the opening OPN of the first insulating layer INS1, the first contact electrode CNE1 may be disposed on the capping layer and may be electrically connected to the first electrode EL1 through the capping layer. Here, the capping layer may protect the first electrode EL1 from a defect of the like occurring during a manufacturing process of the display device, and may further strengthen adhesive force between the first electrode EL1 and the pixel circuit layer PCL disposed thereunder. The capping layer may be formed of a transparent conductive material such as indium zinc oxide (IZO) to reduce or minimize loss of the light emitted from each of the light emitting elements LD and reflected by the first electrode EL1 in the image display direction of the display device.

The first contact electrode CNE1 may be provided directly on one end of both ends of each of the first light emitting elements LD1 to overlap the one end of each of the first light emitting elements LD1. The first contact electrode CNE1 may electrically stably connect the first electrode EL1 and the one end of the both ends of each of the first light emitting elements LD1.

The second contact electrode CNE2 may be provided on the second electrode EL2 to overlap the second electrode EL2. The second contact electrode CNE2 may be directly disposed on one area of the second electrode EL2 exposed by the opening OPN of the first insulating layer INS1 to be electrically and/or physically connected to the second electrode EL2. In addition, the second contact electrode CNE2 may be directly provided on the other end of the both ends of each of the first light emitting elements LD1 to overlap the other end of each of the first light emitting elements LD1. In addition, the second contact electrode CNE2 may be provided directly on one end of both ends of each of the second light emitting elements LD2 to overlap the one end of each of the second light emitting elements LD2. The second contact electrode CNE2 may electrically stably connect the second electrode EL2, the other end of the both ends of each of the first light emitting elements LD1, the one end of the both ends of each of the second light emitting elements LD2.

The first contact electrode CNE1 and the second contact electrode CNE2 may be disposed to be spaced from each other. For example, the first contact electrode CNE1 and the second contact electrode CNE2 may be disposed to be spaced from each other with a suitable distance (e.g., a predetermined distance) therebetween on the second insulating layer INS2 of each of the first light emitting elements LD1. The first contact electrode CNE1 and the second contact electrode CNE2 may be provided on (or at) the same layer and may be formed through the same process. However, the present disclosure is not limited thereto, and the first and second contact electrodes CNE1 and CNE2 may be provided on different layers and may be formed through different processes according to one or more embodiments. When the first contact electrode CNE1 and the second contact electrode CNE2 are provided on different layers and formed through different processes, a separate insulating layer may be provided between the first contact electrode CNE1 and the second contact electrode CNE2.

The third contact electrode CNE3 may be provided on the third electrode EL3 to overlap the third electrode EL3. The third contact electrode CNE3 may be directly disposed on one area of the third electrode EL3 exposed by the opening OPN of the first insulating layer INS1 to be connected to the third electrode EL3. In addition, the third contact electrode CNE3 may overlap the other end of the both ends of each of the second light emitting elements LD2. The third contact electrode CNE3 may electrically stably connect the third electrode EL3 and the other ends of each of the second light emitting elements LD2.

The second contact electrode CNE2 and the third contact electrode CNE3 may be disposed to be spaced from each other. For example, the second contact electrode CNE2 and the third contact electrode CNE3 may be disposed to be spaced from each other with a suitable distance (e.g., a predetermined distance) therebetween on the second insulating layer INS2 of each of the second light emitting elements LD2. The second contact electrode CNE2 and the third contact electrode CNE3 may be provided on (or at) the same layer and may be formed through the same process. However, the present disclosure is not limited thereto, and the second and third contact electrodes CNE2 and CNE3 may be provided on different layers and may be formed through different processes according to one or more embodiments. When the second contact electrode CNE2 and the third contact electrode CNE3 are provided on different layers and formed through different processes, a separate insulating layer may be provided between the second contact electrode CNE2 and the third contact electrode CNE3.

An encapsulation layer ENC may be provided and/or formed on the first to third contact electrodes CNE1 to CNE3. The encapsulation layer ENC may be an inorganic insulating layer including an inorganic material or an organic insulating layer including an organic material. For example, the encapsulation layer ENC may have a structure in which at least one inorganic insulating layer or at least one organic insulating layer is alternately stacked. The encapsulation layer ENC may entirely cover the display element layer DPL to prevent water, moisture, or the like from being permeated to the display element layer DPL including the light emitting elements LD from the outside.

When it is assumed that the driving current flows from the first power supply line PL1 to the second power supply line PL2 by the driving transistor Tdr of the pixel circuit layer PCL of each pixel PXL, the driving current may flow into the emission unit EMU of each pixel PXL through the first contact hole CH1. For example, the driving current is supplied to the first electrode EL1 through the first contact hole CH1, and the driving current flows to the second electrode EL2 via the first light emitting elements LD1. Accordingly, each of the first light emitting elements LD1 may emit light with a luminance corresponding to a current distributed to each of the first light emitting elements LD1. The driving current flowing through the second electrode EL2 flows to the third electrode EL3 via the second light emitting elements LD2. Accordingly, the second light emitting elements LD2 may emit light with a luminance corresponding to a current distributed to each of the second light emitting elements LD2. In the above-described method, the driving current of each pixel PXL may flow while sequentially passing through the first light emitting elements LD1 and the second light emitting elements LD2. Accordingly, each pixel PXL may emit light with a luminance corresponding to the data signal supplied during each frame period.

According to the above-described embodiment, each of the first to third electrodes EL1 to EL3 may be designed to include the first area A which is positioned in an area between the first to third sub-bank patterns SBNK1 to SBNK3 and does not overlap the first to third sub-bank patterns SBNK1 to SBNK3 and the second area B except for the first area A, and have at least two or more widths in the first direction DR1 along the extension direction due to the concave portions CP1 and CP2 provided in the first area A.

In this case, the distance d2 in the first direction DR1 between the second areas B of each of the two adjacent electrodes may be narrower than the distance d3 in the first direction DR1 between the first areas A of each of the two adjacent electrodes. For example, the distance d2 in the first direction DR1 between the second area B of the first electrode EL1 and the second area B of the second electrode EL2 may be narrower than the distance d3 in the first direction DR1 between the first area A of the first electrode EL1 and the first area A of the second electrode EL2. In addition, the distance d2 in the first direction DR1 between the second area B of the second electrode EL2 and the second area B of the third electrode EL3 may be narrower than the distance d3 in the first direction DR1 between the first area A of the second electrode EL2 and the first area A of the third electrode EL3.

In addition, because the second area B of each of the first to third electrodes EL1 to EL3 has the protrusion portion corresponding to the first to third sub-bank patterns SBNK1 to SBNK3 along the third direction DR3, a height of a surface in the third direction DR3 may be higher than that of the first area A of each of the first to third electrodes EL1 to EL3. Accordingly, the second area B of each of the first to third electrodes EL1 to EL3 may have a surface profile different from that of the first area A of each of the first to third electrodes EL1 to EL3 in the third direction DR3. That is, a surface profile change in the third direction DR3 of the second area B of each of the first to third electrodes EL1 to EL3 may be greater than that of the first area A of the corresponding electrode.

At this time, when the alignment signal (or alignment voltage) corresponding to each of the first to third electrodes EL1 to EL3 is applied, an electric field may be concentrated between the second areas B of each of the two adjacent electrodes. As the distance between the two adjacent electrodes becomes narrower, strength of the electric field formed therebetween may become stronger. In addition, as the surface profile change of each of the two adjacent electrodes in the third direction DR3 increases (or a surface height of each of the two adjacent electrodes increases), the strength of the electric field formed therebetween may be stronger.

As the strength of the electric field increases, a size of dielectrophoresis (DEP) force may increase. DEP may mean a phenomenon in which a particle is attracted toward a portion in which an electric field has a dense (or strong) gradient or a portion in which an electric field has a slight (or weak) gradient when a particle is placed in a non-uniform electric field. At this time, a phenomenon of attracting the particle to the portion in which the electric field is dense (or strong) is referred to as positive DEP, and a phenomenon of attracting the particle to the portion in which the electric field is slight (or weak) is referred to as negative DEP. Strength of the DEP force may vary according to the particle, for example, a volume of the light emitting element LD, a dielectric constant of the light emitting element LD, a dielectric constant of the solvent, the strength of the electric field, and the like. In particular, the strength of the DEP force may be proportional to the strength of the electric field.

As described above, when a relatively strong electric field is formed between the second areas B of each of the two adjacent electrodes, the strength of the DEP force increases, and thus the light emitting elements LD may move intensively between the second areas B of each of the two adjacent electrodes. That is, the light emitting elements LD may be intensively aligned between the second areas B of each of the two adjacent electrodes. As a result, the light emitting elements LD may be intensively aligned only in a desired area in the pixel area PXA of each of the pixels PXL, for example, between the second areas B of each of the two adjacent electrodes, and thus the number of light emitting elements LD which are not aligned may be reduced. Accordingly, loss of the light emitting elements LD may be reduced or minimized and the number of effective light emitting elements LD provided per unit area of each pixel PXL may be increased. In addition, because the light emitting elements LD are intensively aligned only in a desired area in the pixel area PXA of each of the pixels PXL, an abnormal alignment defect in which the light emitting elements LD are aligned in an undesired area may be prevented.

Therefore, an alignment distribution of the light emitting elements LD becomes uniform for each pixel PXL, and thus an intensity (or an amount) of the light emitted from each pixel PXL may be substantially identical or similar to an intensity (or an amount) of light emitted from the adjacent pixel PXL. Accordingly, the display device according to one or more embodiments of the present disclosure may have a uniform light output distribution over the entire area.

In addition, by intensively aligning the light emitting elements LD only in a desired area in the pixel area PXA of each pixel PXL, a contact defect between each of the light emitting elements LD and electrodes electrically and/or physically connected to the light emitting elements LD may be reduced or minimized.

FIGS. 15A to 15F are schematic plan views sequentially illustrating a method of manufacturing the pixel shown in FIG. 8, and FIGS. 16A to 16H are schematic cross-sectional views sequentially illustrating a method of manufacturing the pixel shown in FIG. 10.

Hereinafter, the pixel according to one or more embodiments of the present disclosure shown in FIGS. 8 and 10 is sequentially described according to a manufacturing method in conjunction with FIGS. 15A to 15F and 16A to 16H. In FIGS. 15A to 15F and FIGS. 16A to 16H, a point different from the above-described embodiment is mainly described in order to avoid an overlapping description.

Referring to FIGS. 1A to 5, 8 to 15A, and 16A, the pixel circuit layer PCL is formed on the substrate SUB.

The pixel circuit layer PCL may include the buffer layer BFL, the transistors T, the first and second power supply lines PL1 and PL2, and the protective layer PSV.

Referring to FIGS. 1A to 5, 8 to 14, 15B, 16A, and 16B, the first bank pattern BNK1 is formed on the protective layer PSV. The first bank pattern BNK1 may include the first to third sub-bank patterns SBNK1 to SBNK3 arranged along the second direction DR2.

The first to third sub-bank patterns SBNK1 to SBNK3 may be positioned in the same column. The first to third sub-bank patterns SBNK1 to SBNK3 may be disposed to be spaced from each other in the second direction DR2. The distance d1 between each of the first to third sub-bank patterns SBNK1 to SBNK3 and a sub-bank pattern adjacent in the second direction DR2 may be determined within a range that reduces or minimizes a defect in which the light emitting elements LD are aligned in an unwanted area, for example, an abnormal alignment defect. For example, each of the first to third sub-bank patterns SBNK1 to SBNK3 and the sub-bank pattern adjacent in the second direction DR2 may be spaced from each other with the distance d1 equal to or greater than the length L of each of the light emitting elements LD.

Referring to FIGS. 1A to 5, 8 to 14, 15C, and 16A to 16C, the first to third electrodes EL1 to EL3 including a conductive material (or substance) having a high reflectance are formed on the protective layer PSV including the first bank pattern BNK1.

The first electrode EL1 may be electrically and/or physically connected to the first power supply line PL1 and the driving transistor Tdr through the first contact hole CH1. The second electrode EL2 may be electrically and/or physically connected to a third power supply line. The third electrode EL3 may be electrically and/or physically connected to the second power supply line PL2 through the second contact hole CH2.

Each of the first to third electrodes EL1 to EL3 may include the first area A respectively positioned between the first sub-bank pattern SBNK1 and the second sub-bank pattern SBNK2 and between the second sub-bank pattern SBNK2 and the third sub-bank pattern SBNK3 so as not to overlap the first to third sub-bank patterns SBNK1 to SBNK3, and the second area B except for the first area A.

The first area A of each of the first to third electrodes EL1 to EL3 may include the concave portions CP1 and CP2, and may have at least two or more widths W1 in the first direction DR1 along the extension direction of the corresponding electrode. The second area B of each of the first to third electrodes EL1 to EL3 may have the constant width W2 in the first direction DR1. The first area A of each of the first to third electrodes EL1 to EL3 may be provided on one surface (or upper surface) of the protective layer PSV and may include the flat portion. The second area B of each of the first to third electrodes EL1 to EL3 may include the flat portion provided on one surface (or upper surface) of the protective layer PSV and the portion protruding from the flat portion along the third direction DR3 in accordance with the first to third sub-bank patterns SBNK1 to SBNK3. Accordingly, the surface profile change in the third direction DR3 of the second area B of each of the first to third electrodes EL1 to EL3 may be greater than that of the first area A of the corresponding electrode.

When viewed in a plan view, each of the first to third electrodes EL1 to EL3 may have a non-uniform width in the first direction DR1 along the extension direction. Accordingly, an area (or a gap) between two adjacent electrodes may have a non-uniform width in the first direction DR1 along the extension direction of the first to third electrodes EL1 to EL3. For example, the area between the two adjacent electrodes may have at least two or more widths in the first direction DR1. The distance d2 in the first direction DR1 between the second areas B of each of the two adjacent electrodes may be narrower than the distance d3 in the first direction DR1 between the first areas A of each of the two adjacent electrodes.

Each of the first to third electrodes EL1 to EL3 may be commonly provided to the pixels PXL positioned in the same pixel column. For example, the first to third electrodes EL1 to EL3 provided to each pixel PXL may be commonly provided to adjacent pixels PXL disposed in the same pixel column as each pixel PXL.

Referring to FIGS. 1A to 5, 8 to 14, and 16A to 16D, an insulating material layer INSM is formed on the protective layer PSV including the first to third electrodes EL1 to EL3. The insulating material layer INSM may be an inorganic insulating layer including an inorganic material or an organic insulating layer including an organic material.

Subsequently, the second bank pattern BNK2 is formed in the pixel area PXA of each pixel PXL. The second bank pattern BNK2 may be formed on the insulating material layer INSM. The second bank pattern BNK2 may be a pixel defining layer defining (or partitioning) the pixel area (or the emission area) between each pixel PXL and pixels PXL adjacent thereto.

Referring to FIGS. 1A to 5, 8 to 14, 15D, and 16A to 16E, an electric field is formed between two adjacent electrodes by applying the alignment signal (or the alignment voltage) corresponding to each of the first to third electrodes EL1 to EL3.

Subsequently, in a state in which the electric field is formed between the two adjacent electrodes, a mixed solution including the light emitting elements LD is input to the pixel area PXA of each of the pixels PXL using an inkjet printing method or the like. For example, an inkjet nozzle may be disposed on the protective layer PSV, and a solvent mixed with the plurality of light emitting elements LD may be input to the pixel area PXA of each of the pixels PXL through the inkjet nozzle. A method of inputting the light emitting elements LD to the pixel area PXA of each of the pixels PXL is not limited to the above-described embodiment, and the method of inputting the light emitting elements LD may be variously changed.

After inputting the light emitting elements LD to the pixel area PXA of each of the pixels PXL, the solvent may be removed.

When the light emitting elements LD are input to the pixel area PXA of each of the pixels PXL, a self-alignment of the light emitting elements LD may be induced by the electric field respectively formed between the first electrode EL1 and the second electrode EL2 and between the second electrode EL2 and the third electrode EL3. Accordingly, the first light emitting elements LD1 may be aligned between the first electrode EL1 and the second electrode EL2, and the second light emitting elements LD2 may be aligned between the second electrode EL2 and the third electrode EL3. In one or more embodiments of the present disclosure, the first light emitting elements LD1 may be intensively aligned between the second area B of the first electrode EL1 and the second area B of the second electrode EL2, and the second light emitting elements LD2 may be intensively aligned between the second area B of the second electrode EL2 and the second area B of the third electrode EL3.

The first and second light emitting elements LD1 and LD2 may be aligned on the insulating material layer INSM between two adjacent electrodes in the pixel area PXA of each of the pixels PXL. For example, the first light emitting elements LD1 may be aligned on the insulating material layer INSM between the second area B of the first electrode EL1 and the second area B of the second electrode EL2, and the second light emitting elements LD2 may be aligned on the insulating material layer INSM between the second area B of the second electrode EL2 and the second area B of the third electrode EL3.

Referring to FIGS. 1A to 5, 8 to 14, 15E, and 16A to 16F, after aligning the light emitting elements LD in the pixel area PXA of each pixel PXL, the second insulating layer INS2 is formed on each of the light emitting element LD. The second insulating layer INS2 may cover at least a portion of an upper surface of each of the light emitting elements LD to expose the both ends of each of the light emitting elements LD except for the active layer 12 to the outside.

The first insulating layer INS1 including at least one opening OPN exposing one area of each of the first to third electrodes EL1 to EL3 by etching the insulating material layer INSM through a process of forming the second insulating layer INS2 or an etching process performed before and after the process of forming the second insulating layer INS2 is formed.

A portion of each of the first and second electrodes EL1 and EL2 may be removed when a process of forming the first and second insulating layers INS1 and INS2 is performed so that each pixel PXL may be driven independently (or separately) from the pixels PXL adjacent thereto. Accordingly, each of the first and second electrodes EL1 and EL2 provided to each pixel PXL may be electrically and/or physically separated from the first and second electrodes EL1 and EL2 provided to the adjacent pixel PXL positioned in the same pixel column.

Referring to FIGS. 1A to 5, 8 to 14, 15F, and 16A to 16G, the first to third contact electrodes CNE1 to CNE3 are formed on the second insulating layer INS2.

The first contact electrode CNE1 may be formed on the first electrode EL1 and may overlap the first electrode EL1 and the one end of the both ends of each of the first light emitting elements LD1. The second contact electrode CNE2 may be formed on the second electrode EL2, and may overlap the second electrode EL2, the other end of the both ends of each of the first light emitting elements LD1, and the one end of the both ends of the second light emitting elements LD2. The third contact electrode CNE3 may be formed on the third electrode EL3 and may overlap the third electrode EL3 and the other end of the both ends of each of the second light emitting elements LD2.

Referring to FIGS. 1A to 5, 8 to 14, and 16A to 16H, the encapsulation layer ENC covering the first to third contact electrodes CNE1 to CNE3 is formed. The encapsulation layer ENC may have a structure in which at least one inorganic layer and at least one organic layer are alternately stacked, but the present disclosure is not limited thereto.

Figure 17A:
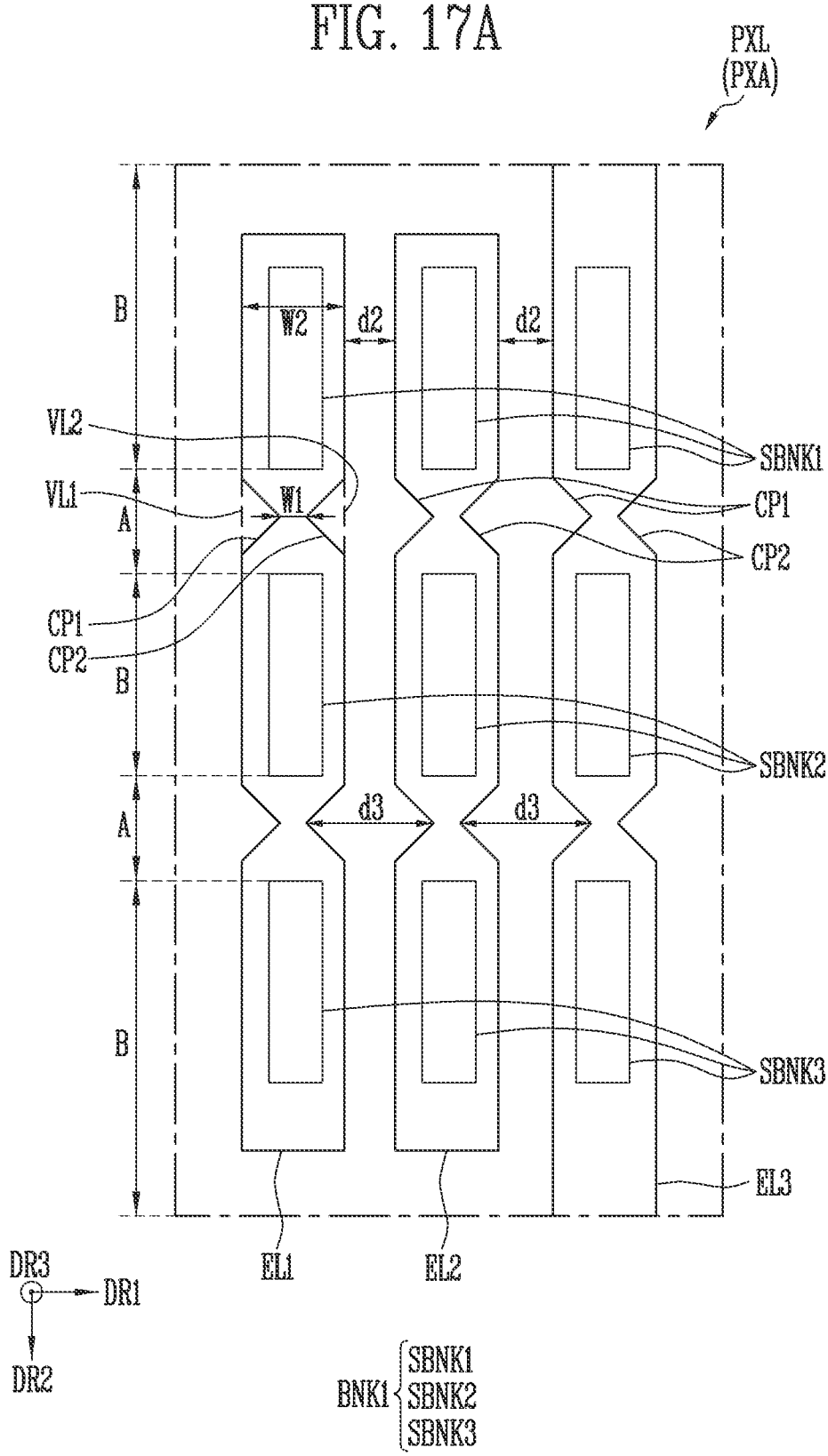
Figure 17B:
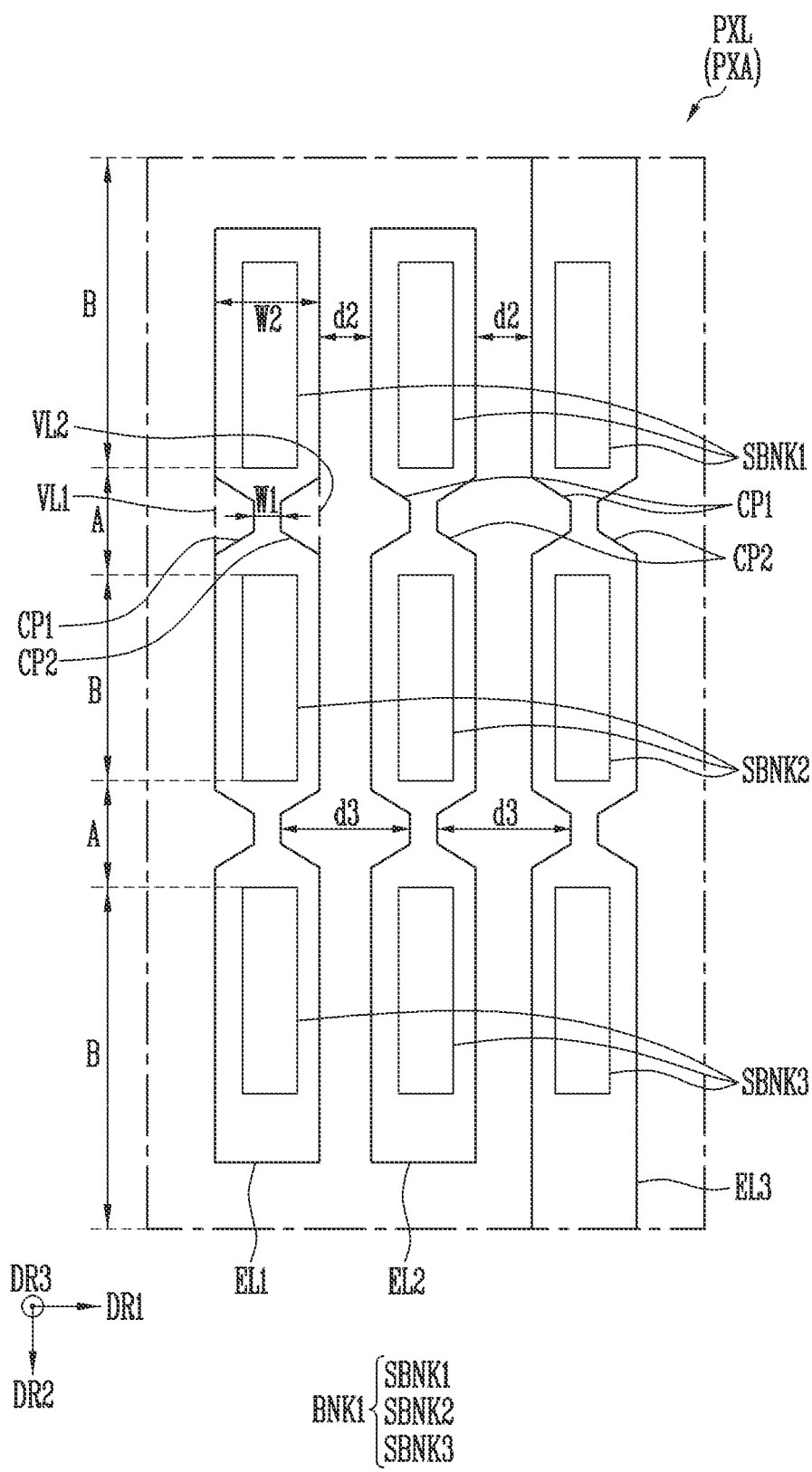

FIGS. 17A to 17C illustrate the pixel of FIG. 8 according to one or more embodiments and are schematic plan views including only a partial configuration of the display element layer.

Regarding the pixels of FIGS. 17A to 17C, a point different from the above-described embodiment is mainly described in order to avoid an overlapping description. Parts which are not specifically described in the present disclosure are in accordance with the above-described embodiment, and the same reference numerals indicate the same components and similar reference numerals indicate similar components.

Referring to FIGS. 1A to 5, 8, and 17A to 17C, the first bank pattern BNK1 and the first to third electrodes EL1 to EL3 may be provided in the pixel area PXA of each pixel PXL. In one or more embodiments of the present disclosure, the first bank pattern BNK1 may include the first to third sub-bank patterns SBNK1 to SBNK3.

Each of the first to third electrodes EL1 to EL3 may include the first area A1 which is positioned in the area between the sub-bank patterns so as not to overlap the sub-bank patterns, and the second area B except for the first area A.

The first area A of each of the first to third electrodes EL1 to EL3 may be respectively positioned between the first sub-bank pattern SBNK1 and the second sub-bank pattern SBNK2 and between the second sub-bank pattern SBNK2 and the third sub-bank pattern SBNK3 and may not overlap the first to third sub-bank patterns SBNK1 to SBNK3. The second area B of each of the first to third electrodes EL1 to EL3 may be an area except for the first area A and may include an area overlapping the first to third sub-bank patterns SBNK1 to SBNK3.

The first area A of each of the first to third electrodes EL1 to EL3 may have at least two or more widths W1 in the first direction DR1 along the extension direction of the corresponding electrode. The second area B of each of the first to third electrodes EL1 to EL3 may have the constant width W2 in the first direction DR1 along the extension direction of the corresponding electrode.

The first area A of each of the first to third electrodes EL1 to EL3 may include the first concave portion CP1 and the second concave portion CP2 that are concave toward an inside direction of the corresponding electrode. The first and second concave portions CP1 to CP2 may be provided in a standardized shape, for example, a polygonal shape. The first and second concave portions CP1 and CP2 may have, for example, a triangular shape as shown in FIG. 17A, may have a trapezoidal shape as shown in FIG. 17B, and may have a rectangular shape as shown in FIG. 17C. However, the shape of the first and second concave portions CP1 and CP2 is not limited to the above-described shape and may be variously modified according to a design condition or the like of the display device.

The distance between the first area A of the first electrode EL1 including the first and second concave portions CP1 and CP2 and the first area A of the second electrode EL2 adjacent in the first direction DR1 may be wider than the distance d2 between the second area B of the first electrode EL1 and the second area B of the second electrode EL2. In addition, the distance d3 between the first area A of the second electrode EL2 and the first area A of the third electrode EL3 adjacent in the first direction DR1 may be wider than the distance d2 between the second area B of the second electrode EL2 and the second area B of the third electrode EL3. That is, the distance d2 in the first direction DR1 between the second areas B of each of the two adjacent electrodes may be narrower than the distance d3 in the first direction DR1 between the first areas A of each of the two adjacent electrodes.

When the corresponding alignment signal (or alignment voltage) is applied to each of the first to third electrodes EL1 to EL3, an electric field of strong strength may be formed between the second areas B of each of the two adjacent electrodes from among the first to third electrodes EL1 to EL3, and thus the light emitting elements LD may be intensively aligned between the second areas B of each of the two adjacent electrodes. Finally, the light emitting elements LD may be selectively aligned only in a desired area in the pixel area PXA of each of the pixels PXL.

Although the above has been described with reference to the embodiments of the present disclosure, those skilled in the art or those having ordinary knowledge of the corresponding technical field will understand that the present disclosure may be variously changed and modified without departing from the spirit and technical scope of the present disclosure described in the claims to be described.

Therefore, the technical scope of the present disclosure should not be limited to the contents described in the detailed description of the specification, but should be defined by the claims and equivalents thereof.

The invention claimed is:

1. A display device comprising:
a substrate including a plurality of pixel areas; and
a pixel in each of the pixel areas,
wherein the pixel comprises:
a first electrode and a second electrode extending in a first direction on the substrate and spaced from each other in a second direction different from the first direction;
a bank pattern between the substrate and the first electrode and between the substrate and the second electrode, and comprising at least two sub-bank patterns in a same column and spaced from each other; and
a plurality of light emitting elements provided between the first and second electrodes,
wherein each of the first and second electrodes has at least two or more widths in the second direction along the first direction.

2. The display device according to claim 1, wherein each of the first and second electrodes includes a first area corresponding to an area between the sub-bank patterns and a second area except for the first area.

3. The display device according to claim 2, wherein the first area of each of the first and second electrodes has at least two or more widths in the second direction along the first direction, and the second area of each of the first and second electrodes has a constant width in the second direction along the first direction.

4. The display device according to claim 3, wherein the first area of each of the first and second electrodes has a width less than or equal to that of the second area of a corresponding electrode in the second direction.

5. The display device according to claim 4, wherein a width of the first area of the first electrode in the second direction and a width of the first area of the second electrode in the second direction are equal to each other, and
a width of the second area of the first electrode in the second direction and a width of the second area of the second electrode in the second direction are equal to each other.

6. The display device according to claim 3, wherein the first area of each of the first and second electrodes includes a concave portion concave in a direction in which a width in the second direction decreases along the first direction.

7. The display device according to claim 6, wherein the concave portion includes a non-square boundary.

8. The display device according to claim 6, wherein the concave portion has a polygonal shape or a rounded curved surface shape.

9. The display device according to claim 8, wherein when viewed in a plan view, a distance between the first electrode and the second electrode in the second direction has at least two or more widths along the first direction.

10. The display device according to claim 9, wherein the concave portion of the first electrode and the concave portion of the second electrode face each other.

11. The display device according to claim 10, wherein a distance in the second direction between the first area of the first electrode and the first area of the second electrode is greater than a distance in the second direction between the second area of the first electrode and the second area of the second electrode.

12. The display device according to claim 2, wherein two sub-bank patterns adjacent in the first direction are spaced from each other by a distance equal to or greater than a length of each light emitting element between the first and second electrodes in the second direction.

13. The display device according to claim 12, wherein the sub-bank patterns are equal to each other.

14. The display device according to claim 2, wherein the first area and the second area of each of the first and second electrodes have different surface profiles when viewed in a cross-section.

15. The display device according to claim 2, wherein the pixel further comprises:
a first contact electrode electrically connecting the first electrode and one end of both ends of each of the light emitting elements; and
a second contact electrode electrically connecting the second electrode and the other end of the both ends of each of the light emitting elements.

16. A display device comprising:
a substrate including a display area including a plurality of pixel areas and a non-display area surrounding at least one side of the display area; and
a pixel in each of the pixel areas,
wherein the pixel comprises a pixel circuit layer on the substrate and a display element layer on the pixel circuit layer,
wherein the pixel circuit layer comprises at least one transistor on the substrate, a power supply line electrically connected to the transistor, and a protective layer on the power supply line,
the display element layer comprises:
first and second electrodes extending in a first direction on the protective layer and spaced from each other in a second direction different from the first direction;
a bank between the protective layer and the first electrode and between the protective layer and the second electrode, and comprising first to third sub-bank patterns arranged along the first direction and located in the same column;
a plurality of light emitting elements between the first and second electrodes;
a first contact electrode electrically connecting the first electrode and one end of both ends of each of the plurality of light emitting elements; and a second contact electrode electrically connecting the second electrode and the other end of the both ends of each of the plurality of light emitting elements, wherein the first to third sub-bank patterns are spaced from each other, and wherein each of the first and second electrodes has at least two or more widths in the second direction along the first direction.

17. The display device according to claim 16, wherein each of the first and second electrodes includes a first area corresponding to an area between the first to third sub-bank patterns and a second area except for the first area, and the first area of each of the first and second electrodes has at least two or more widths along the first direction, and the second area of each of the first and second electrodes has a constant width along the first direction.

18. The display device according to claim 17, wherein the first area of each of the first and second electrodes includes a concave portion concave in a direction in which a width in the second direction decreases along the first direction.

19. The display device according to claim 18, wherein the concave portion has a polygonal shape or a rounded curved surface shape.

20. The display device according to claim 16, wherein a distance between the first electrode and the second electrode in the second direction has at least two or more widths along the first direction.

* * * * *